United States Patent
Yokoyama et al.

(10) Patent No.: US 11,944,004 B2
(45) Date of Patent: *Mar. 26, 2024

(54) ORGANIC ELECTROLUMINESCENCE ELEMENT

(71) Applicant: HODOGAYA CHEMICAL CO., LTD., Tokyo (JP)

(72) Inventors: Norimasa Yokoyama, Tokyo (JP); Shuichi Hayashi, Tokyo (JP); Naoaki Kabasawa, Tokyo (JP); Takeshi Yamamoto, Tokyo (JP)

(73) Assignee: HODOGAYA CHEMICAL CO., LTD., Tokyo (JP)

( * ) Notice: Subject to any disclaimer, the term of this patent is extended or adjusted under 35 U.S.C. 154(b) by 254 days.

This patent is subject to a terminal disclaimer.

(21) Appl. No.: 16/076,586

(22) PCT Filed: Feb. 8, 2017

(86) PCT No.: PCT/JP2017/004600
§ 371 (c)(1),
(2) Date: Aug. 8, 2018

(87) PCT Pub. No.: WO2017/138569
PCT Pub. Date: Aug. 17, 2017

(65) Prior Publication Data
US 2019/0051838 A1    Feb. 14, 2019

(30) Foreign Application Priority Data
Feb. 12, 2016    (JP) .................. 2016-024371

(51) Int. Cl.
*H01L 51/00*    (2006.01)
*H01L 51/50*    (2006.01)
(Continued)

(52) U.S. Cl.
CPC ........... *H10K 85/654* (2023.02); *H10K 50/11* (2023.02); *H10K 50/15* (2023.02); *H10K 50/16* (2023.02);
(Continued)

(58) Field of Classification Search
CPC ............... H01L 51/0059; H01L 51/006; H01L 51/0061
See application file for complete search history.

(56) References Cited

U.S. PATENT DOCUMENTS

2005/0106419 A1    5/2005 Endoh et al.
2005/0236976 A1*  10/2005 Leung ................. H01L 51/0059
                                                    313/504
(Continued)

FOREIGN PATENT DOCUMENTS

EP          2 684 932 A1    1/2014
JP      1996(H08)-048656 A  2/1996
(Continued)

OTHER PUBLICATIONS

KR-20080064114-A—translated (Year: 2008).*
(Continued)

*Primary Examiner* — Jay Yang
*Assistant Examiner* — J. L. Yang
(74) *Attorney, Agent, or Firm* — Saliwanchik, Lloyd & Eisenschenk

(57) ABSTRACT

According to the present invention, there is provided an organic electroluminescence element including at least an anode, a hole injection layer, a hole transport layer, a light-emitting layer, an electron transport layer, and a cathode in the stated order, the organic electroluminescence element being characterized in that: the hole injection layer contains an arylamine compound represented by the following general formula (1) and an electron acceptor. The (Continued)

organic EL element of the present invention has a high light emission efficiency and an excellent durability, as compared with the related art, while maintaining the existing low drive voltage.

(1)

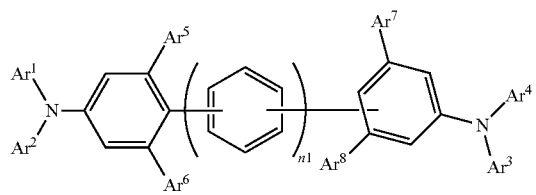

1 Claim, 28 Drawing Sheets

(51) Int. Cl.
*H10K 50/11* (2023.01)
*H10K 50/15* (2023.01)
*H10K 50/16* (2023.01)
*H10K 50/17* (2023.01)
*H10K 50/18* (2023.01)
*H10K 85/60* (2023.01)
H10K 50/125 (2023.01)
H10K 50/81 (2023.01)
H10K 50/82 (2023.01)
H10K 101/10 (2023.01)

(52) U.S. Cl.
CPC ........... *H10K 50/171* (2023.02); *H10K 50/18* (2023.02); *H10K 85/615* (2023.02); *H10K 85/631* (2023.02); *H10K 85/633* (2023.02); *H10K 85/636* (2023.02); *H10K 85/6572* (2023.02); *H10K 50/125* (2023.02); *H10K 50/17* (2023.02); *H10K 50/81* (2023.02); *H10K 50/82* (2023.02); *H10K 85/626* (2023.02); *H10K 2101/10* (2023.02)

(56) References Cited

U.S. PATENT DOCUMENTS

| 2006/0115680 | A1 | 6/2006 | Hwang et al. |
| 2008/0076050 | A1 | 3/2008 | Abe et al. |
| 2008/0124572 | A1 | 5/2008 | Mizuki et al. |
| 2010/0015542 | A1 | 1/2010 | Abe et al. |
| 2010/0026176 | A1* | 2/2010 | Blochwitz-Nomith ..................... B32B 27/18 313/504 |
| 2013/0187137 | A1 | 7/2013 | Mizuki et al. |
| 2015/0031900 | A1* | 1/2015 | Kawakami ........... C07D 307/77 549/457 |
| 2015/0380657 | A1* | 12/2015 | Yokoyama .......... H01L 51/0061 257/40 |
| 2017/0117481 | A1 | 4/2017 | Kabasawa et al. |
| 2017/0346015 | A1* | 11/2017 | Hayashi ................ H01L 51/006 |

FOREIGN PATENT DOCUMENTS

| JP | 3194657 B2 | 7/2001 | |
| JP | 2002-356462 A | 12/2002 | |
| JP | 2002356462 A | * 12/2002 | |
| JP | 2005-166641 A | 6/2005 | |
| JP | 2006-151979 A | 6/2006 | |
| JP | 2007-126439 A | 5/2007 | |
| JP | 4943840 B2 | 5/2012 | |
| JP | 2013-531360 A | 8/2013 | |
| JP | 2014-167946 A | 9/2014 | |
| KR | 10-2008-0064114 | * 7/2008 | |
| KR | 20080064114 A | * 7/2008 | ........... C07D 401/14 |
| KR | 10-2010-0123172 A | 11/2010 | |
| KR | 10-2011-0084797 A | 7/2011 | |
| KR | 10-2013-0060157 A | 6/2013 | |
| KR | 10-2015-0130206 A | 11/2015 | |
| KR | 20150130206 A | * 11/2015 | ........... C07D 495/10 |
| WO | WO-2007/043484 A1 | * 4/2007 | |
| WO | WO-2008/62636 A1 | 5/2008 | |
| WO | WO-2012/176674 A1 | 12/2012 | |
| WO | WO-2014/009310 A1 | 1/2014 | |
| WO | WO-2015/198563 A1 | 12/2015 | |

OTHER PUBLICATIONS

KR-20150130206-A—translated (Year: 2015).*
JP-2002356462-A—translated (Year: 2002).*
Machine English translation of Yagi et al. (KR-10-2008-0064114). Sep. 15, 2021.*
Machine English translation of JP-2002356462-A. Jul. 5, 2022.*
Machine English translation of Choi et al. (KR 10-2011-0084797). Dec. 28, 2022.*
European Search Report dated Sep. 13, 2919 in European Application No. 17759290.3.
International Search Report in International Application No. PCT/JP2017/004600, filed Feb. 8, 2017.
Office Action dated Nov. 26, 2020 in Japanese Application No. 2017-566980, along with its English translation.
Office Action dated Jan. 20, 2021 in Chinese Application No. 201780010558.X, along with its English translation.
Office Action dated Sep. 3, 2021 in Chinese Application No. 201780010558.X.
Office Action dated Apr. 14, 2022 in European Application No. 17 750 290.3.
Office Action dated Sep. 1, 2020 in Japanese Application No. 2017-566980, along with its English translation.
Office Action dated Apr. 28, 2020 in Chinese Application No. 201780010558.X, along with its English translation.

* cited by examiner

US 11,944,004 B2

ORGANIC ELECTROLUMINESCENCE ELEMENT

CROSS-REFERENCE TO RELATED APPLICATIONS

This application is the U.S. national stage application of International Patent Application No. PCT/JP2017/004600, filed Feb. 8, 2017, which claims the benefit under 35 U.S.C. § 119 of Japanese Application No. 2016-024371, filed Feb. 12, 2016, the disclosures of each of which are incorporated herein by reference in their entirety.

JOINT RESEARCH AGREEMENT

This disclosure was made by or on behalf of parties to a joint research agreement, the parties of the joint research agreement being Hodogaya Chemical Co., Ltd. and SFC Co. Ltd.

TECHNICAL FIELD

The present invention relates to an organic electroluminescence element that is a self-light emitting element suitable for various display apparatuses. Specifically, the present invention relates to an organic electroluminescence element (hereinafter, referred to as "organic EL element") using a specific arylamine compound doped with an electron acceptor.

BACKGROUND ART

Since the organic EL element is a self-light emitting element, it is brighter than the liquid crystal element and excellent in visibility, and capable of performing clear display. For that reason, active research has been done.

In 1987, C. W. Tang et al. (Eastman Kodak Company) have developed a stacked structural element in which various roles are assigned to the materials, and put an organic EL element using an organic material to practical use. The organic EL element is formed by stacking a phosphor capable of transporting electrons and an organic material capable of transporting holes. With this structure, by injecting both charges into a phosphor layer to emit light, high luminance of not less than 1000 cd/m$^2$ has been achieved with voltage of not more than 10 V (see Patent Document 1 and Patent Document 2).

Many improvements have been made for practical use of the organic EL element until now. For example, in an electroluminescence element that subdivides roles of layers and includes an anode, a hole injection layer, a hole transport layer, a light-emitting layer, an electron transport layer, an electron injection layer, and a cathode in the stated order on a substrate, a high efficiency and durability have been achieved.

Further, for the purpose of further improving the light emission efficiency, attempts have been made to use a triplet exciton and utilization of a phosphorescent compound is being considered. An element using light emission by thermally activated delayed fluorescence (TADF) has also been developed. In 2011, Adachi et al. (Kyushu University) have realized the external quantum efficiency of 5.3% by an element using a thermally activated delayed fluorescence material.

The light-emitting layer can also be prepared by doping a charge transport compound generally called a host material with a fluorescent compound, a phosphorescent compound, or a material emitting delayed fluorescence. Selection of an organic material in the organic EL element significantly affects various properties such as efficiency and durability of the element.

In the organic EL element, charges injected from both electrodes are recombined in the light-emitting layer to obtain light emission. For that reason, in the organic EL element, it is important how to efficiently transfer both charges of holes and electrons to the light-emitting layer. Also, the organic EL element needs to be excellent in carrier balance. Further, by improving the hole injection property, and the electron blocking property for blocking the electrons injected from the cathode to increase the possibility of recombination of holes and electrons, and further confining the excitons generated in the light-emitting layer, it is possible to achieve a high light emission efficiency. Therefore, the role played by the hole transport material is important, and a hole transport material having a high hole injection property, a high mobility of holes, a high electron blocking property, and a high durability to electrons is desired.

Further, from the viewpoint of element lifetime, the heat resistance and amorphous property of the material are also important. In the case of a material having a low heat resistance, thermal decomposition occurs even at a low temperature due to heat generated at the time of driving the element, and the material is degraded. In the case of a material having a low amorphous property, crystallization of the thin film occurs even in a short time, and the element is degraded. Therefore, the material is desired to have a high heat resistance and an excellent amorphous property.

In the past, as the hole transport material for the organic EL element, N,N'-diphenyl-N,N'-di(α-naphthyl) benzidine (NPD) and various aromatic amine derivatives (see Patent Document 1 and Patent Document 2) have been used. Although NPD has a favorable hole transport ability, since it has a low glass transition point (Tg), which is an index of heat resistance, i.e., 96° C., the element properties are degraded due to crystallization under high temperature conditions. Further, among the aromatic amine derivatives described in the above-mentioned Patent Documents, there is a compound having an excellent mobility of holes, i.e., a mobility of not less than 10$^{-3}$ cm$^2$/Vs. However, such an aromatic amine derivative has an insufficient electron blocking property. For that reason, in the organic EL element using such an aromatic amine derivative, since a part of electrons passes through the light-emitting layer, the light emission efficiency is not expected to improve. In this regard, in order to further improve the efficiency, a material having a higher electron blocking property, a more stable thin film, and a higher heat resistance has been desired. Further, in Patent Document 3, an aromatic amine derivative having a high durability has been reported. However, such an aromatic amine derivative has been used as a charge transport material of an electrophotographic photoreceptor, and there has been no example using the aromatic amine derivative as an organic EL element.

As a compound having improved properties such as heat resistance and hole injection property, an arylamine compound having a substituted carbazole structure has been proposed in Patent Document 4 and Patent Document 5. Further, in Patent Document 6, improving the hole injection property by further P-doping, in a hole injection layer or a hole transport layer, the material normally used in the layer with tris(bromophenylamine) hexachloroantimony, a Radialene derivative, F4-TCNQ, or the like has been proposed. However, the element using these compounds for the hole injection layer or the hole transport layer, although the drive voltage has been reduced and the heat resistance, the light emission efficiency, and the like have been improved, which are still not sufficient, further reduction in the drive voltage and further improvement of the light emission efficiency are desired.

As described above, in order to improve the element properties of the organic EL element and the yield of element preparation, an element in which holes and electrons can be recombined with a high efficiency, which has a high light emission efficiency, a low drive voltage, and a long lifetime, is desired.

Further, in order to improve the element properties of the organic EL element, an element having an excellent carrier balance, a high efficiency, a low drive voltage, and a long lifetime is desired.

CITATION LIST

Patent Literature

Patent Literature 1: Japanese Patent Application Laid-open No. 1996-048656
Patent Literature 2: Japanese Patent No 3194657
Patent Literature 3: Japanese Patent No. 4943840
Patent Literature 4: Japanese Patent Application Laid-open. No 2006-151979
Patent Literature 5: WO 2008/62636
Patent Literature 6: WO 2014/009310
Patent Literature 7: Korean Patent Application Publication No. 10-2015-0130206
Patent Literature 8: Korean Patent Application Publication No. 10-2013-0060157

SUMMARY OF INVENTION

Problem to be Solved by the Invention

It is an object of the present invention to provide an organic EL element having (1) a low practical drive voltage, (2) a high light emission efficiency and a high power efficiency, and (3) a high durability and a long lifetime by combining various materials for an organic EL element having an excellent hole injection/transport performance, an excellent electron injection/transport performance, an excellent electron blocking property, an excellent stability in the thin film state, an excellent durability, and the like so that the properties of the respective materials can be effective expressed.

Means for Solving the Problem

The present inventors have focused on the fact that an aryl amine-based material doped with an electron acceptor is excellent in hole injection/transport performance, stability of the thin film, and durability. In this regard, such a material was used for a hole injection layer to make it possible to efficiently inject/transport holes from an anode. Then, various types of such an organic EL element have been prepared, and the properties of the elements have been intensively evaluated. As a result, the present invention has been completed.

Further, they have focused on the fact that a compound having a pyrimidine ring structure is excellent in electron injection/transport performance, stability of the thin film, and durability. In this regard, by combining the hole injection layer with an electron transport layer containing such a compound and a light-emitting layer containing a specific light-emitting material (dopant), i.e., improving the injection/transport capability of holes and electrons, combinations of materials having refined carrier balance have been selected. Then, various organic EL elements have been prepared, and the properties of the elements have been intensively evaluated.

Specifically, according to the present disclosure, there is provided 1) an organic electroluminescence element including at least an anode, a hole injection layer, a hole transport layer, a light-emitting layer, an electron transport layer, and a cathode in the stated order, the organic electroluminescence element being characterized in that.

the hole injection layer contains an arylamine compound represented by the following general formula (1) and an electron acceptor.

[Chem. 1]

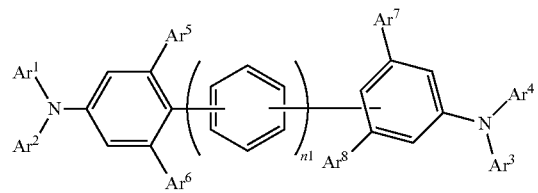

(1)

(in the formula,
Ar$^1$ to Ar$^5$ may be the same or differ, and each represent an aromatic hydrocarbon group, an aromatic heterocyclic group, or a fused polycyclic aromatic group,
Ar$^6$ to Ar$^8$ may be the same or differ, and each represent a hydrogen atom, an aromatic hydrocarbon group, an aromatic heterocyclic group, or a fused polycyclic aromatic group,
n1 represents 0, 1, or 2,
Ar$^3$ and Ar$^4$ may be bonded to each other via a single bond, a substituted or unsubstituted methylene group, an oxygen atom, or a sulfur atom to form a ring, and
Ar$^3$ or Ar$^4$ may be bonded, via a single bond, a substituted or unsubstituted methylene group, an oxygen atom, or a sulfur atom, to a benzene ring to which a —NAr$_3$Ar$^4$ group is bonded, thereby forming a ring)

A favorable embodiment of the organic EL element of the present invention is as follows.

2) The arylamine compound is represented by the following general formula (1a).

[Chem. 2]

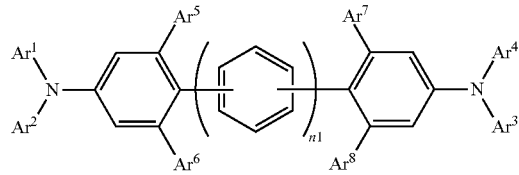

(1a)

(in the formula,
Ar$^1$ to Ar$^8$ and n1 each have the meaning as described in the general formula (1))

3) The hole injection layer contains at least one electron acceptor selected from the group consisting of tris(bromophenylamine) hexachloroantimony, tetracyanoquinone dimethane (TCNQ), 2,3,5,6-tetrafluoro-tetracyano-1,4-benzoquinone dimethane (F4TCNQ), and radialene derivatives.

4) The electron acceptor is a radialene derivative represented by the following general formula (2)

[Chem. 3]

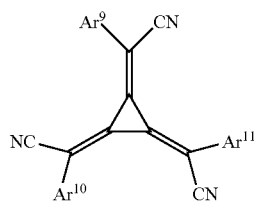

(2)

(in the formula, $Ar^9$ to $Ar^{11}$ may be the same or differ, and each represent a group having an electron receptor group as a substitution group, the group being an aromatic hydrocarbon group, an aromatic heterocyclic group, or a fused polycyclic aromatic group).

5) The hole injection layer selectively contains the electron acceptor.

6) The hole transport layer contains the arylamine compound.

7) The light-emitting layer contains a blue light-emitting dopant.

8) The blue light-emitting dopant is a pyrene derivative.

9) The blue light-emitting dopant is an amine derivative represented by the following general formula (3)

[Chem. 4]

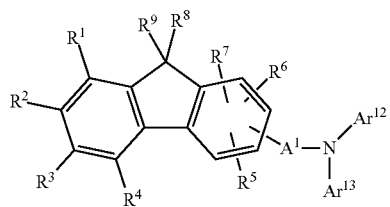

(3)

(in the formula, $A^1$ represents a divalent aromatic hydrocarbon group, a divalent aromatic heterocyclic ring group, a divalent fused polycyclic aromatic group, or a single bond, $Ar^{12}$ and $Ar^{13}$ may be the same or differ, each represent an aromatic hydrocarbon group, an aromatic heterocyclic group, or a fused polycyclic aromatic group, and may be bonded to each other via a single bond, a substituted or unsubstituted methylene group, an oxygen atom, or a sulfur atom to form a ring, $R^1$ to $R^4$ may be the same or differ, and each represent a hydrogen atom; a deuterium atom; a fluorine atom; a chlorine atom; a cyano group; a nitro group; an alkyl group having 1 to 6 carbon atoms; a cycloalkyl group having 5 to 10 carbon atoms, an alkenyl group having 2 to 6 carbon atoms; an alkyloxy group having 1 to 6 carbon atoms; a cycloalkyloxy group having 5 to 10 carbon atoms; an aromatic hydrocarbon group; an aromatic heterocyclic group; a fused polycyclic aromatic group; an aryloxy group; or a di-substituted amino group substituted by a group selected from an aromatic hydrocarbon group, an aromatic heterocyclic group, or a fused polycyclic aromatic group, $R^1$ to $R^4$ may be bonded to each other via a single bond, a substituted or unsubstituted methylene group, an oxygen atom, or a sulfur atom to form a ring, in a benzene ring to which $R^1$ to $R^4$ are bonded, to a vacancy caused by elimination of any one of $R^1$ to $R^4$, another group of $R^1$ to $R^4$ may be bonded via a substituted or unsubstituted methylene group, an oxygen atom, a sulfur atom, or a monosubstituted amino group, thereby forming a ring, $R^5$ to $R^7$ may be the same or differ, and each represent a hydrogen atom, a deuterium atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a fused polycyclic aromatic group, or an aryloxy group, $R^5$ to $R^7$ may be bonded to each other via a single bond, a substituted or unsubstituted methylene group, an oxygen atom, or a sulfur atom to form a ring in a benzene ring to which $R^5$ to $R^7$ are bonded, to a vacancy caused by elimination of any one group of $R^5$ to $R^7$, another group of $R^5$ to $R^7$ may be bonded via a substituted or unsubstituted methylene group, an oxygen atom, a sulfur atom, or a monosubstituted amino group, thereby forming a ring, and $R^8$ and $R^9$ may be the same or differ, each represent an alkyl group having 1 to 6 carbon atoms, a cycloalkyl group having 5 to 10 carbon atoms, an alkenyl group having 2 to 6 carbon atoms, an aromatic hydrocarbon group, an aromatic heterocyclic group, a fused polycyclic aromatic group, or an aryloxy group, and may be bonded to each other via a single bond, a substituted or unsubstituted methylene group, an oxygen atom, a sulfur atom, or a monosubstituted amino group)

10) The electron transport layer contains a pyrimidine derivative represented by the following general formula (4).

[Chem. 5]

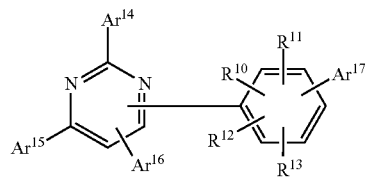

(4)

(in the formula,
$Ar^{14}$ represents an aromatic hydrocarbon group or a fused polycyclic aromatic group,
$Ar^{15}$ and $Ar^{16}$ may be the same or differ, and each represent a hydrogen atom, an aromatic hydrocarbon group, or a fused polycyclic aromatic group,
$Ar^{15}$ and $Ar^{16}$ are not simultaneously hydrogen atoms,
$Ar^{17}$ represents an aromatic heterocyclic group, $R^{10}$ to $R^{13}$ may be the same or differ, and each represent a hydrogen atom, a deuterium atom, a fluorine atom, a chlorine atom, a cyano group, a trifluoromethyl group, an alkyl group having 1 to 6 carbon atoms, an aromatic hydrocarbon group, an aromatic heterocyclic group, or a fused polycyclic aromatic group)

11) The light-emitting layer contains an anthracene derivative.

12) The light-emitting layer contains an anthracene derivative as a host material.

Advantageous Effects of Invention

The arylamine compound represented by the general formula (1) (hereinafter, referred to as arylamine compound I in some cases) has a specific position substituted with an aryl group. Such an arylamine compound I has a high hole mobility and stability in the thin film state, and is excellent in the electron blocking property as compared with the existing hole injection material. Therefore, it is suitable as a constituent material of the hole injection layer. Further, it can be used also as a constituent material of the electron blocking layer or the hole transport layer.

In the hole injection layer, the arylamine compound I is P-doped with an electron acceptor typified by the radialene derivative represented by the general formula (2) (hereinafter, referred to as radialene derivative II in some cases). This facilitates the injection of holes from the anode.

As described above, in the present invention, since an arylamine compound having a specific structure and an electron acceptor are selected among materials that is excellent in the hole injection/transport performance, stability of the thin film, and durability, considering the carrier balance, and a hole injection layer is formed by using them, the hole transport efficiency from the anode to the hole transport layer is improved as compared with the related art. As a result, the hole injection/transport efficiency to the light-emitting layer is improved Therefore, the organic EL element of the present invention has a high light emission efficiency and an excellent durability, as compared with the related art, while maintaining the existing low drive voltage.

In the present invention, the amine derivative having a fused ring structure represented by the general formula (3) (hereinafter, referred to as amine derivative III in some cases) is suitably used as a constituent material of the light-emitting layer, particularly, a blue light-emitting dopant. This is because the amine derivative III is excellent in the light emission efficiency as compared with the existing light-emitting material.

In the present invention, a compound having the pyrimidine ring structure represented by the general formula (4) (hereinafter, referred to as pyrimidine derivative IV in some cases) is suitably used as a constituent material of the electron transport layer. The pyrimidine derivative IV is excellent in the electron injection/transport performance, and improves the electron transport efficiency from the electron injection layer to the light-emitting layer. In addition, the pyrimidine derivative IV is also excellent in the stability of the thin film and durability.

In the present invention, in the hole transport layer, the arylamine compound I is suitably used. However, at this time, from the viewpoint of refining the carrier balance, it is favorable that the arylamine compound I is not doped with an electron acceptor.

As described above, in the favorable embodiment of the present invention, since materials of the layers are selected considering the carrier balance, a more excellent high light emission efficiency and durability are achieved while maintaining the low drive voltage similar to that in the related art.

MODES FOR CARRYING OUT THE INVENTION

The organic EL element of the present invention has a basic structure in which at least an anode, a hole injection layer, a hole transport layer, a light-emitting layer, an electron transport layer, and a cathode are provided in the stated order on a substrate.

The layer structure of the organic EL element of the present invention can adopt various embodiments as long as the organic EL element has such a basic structure. For example, it is possible to provide an electron blocking layer between the hole transport layer and the light-emitting layer, provide a hole blocking layer between the light-emitting layer and the electron transport layer, and provide an electron injection layer between the electron transport layer and the cathode. In addition, it is possible to omit or double as some of the organic layers. For example, it is possible to adopt a configuration that doubles as the hole injection layer and the hole transport layer, and a configuration that doubles as the electron injection layer and the electron transport layer. Further, it is possible to adopt a configuration in which two or more organic layers having the same function are stacked, a configuration in which two hole transport layers are stacked, a configuration in which two light-emitting layers are stacked, and a configuration in which two electron transport layers are stacked. It is favorable that the hole transport layer has a two-layer configuration of a first hole transport layer and a second hole transport layer.

Figure 1:
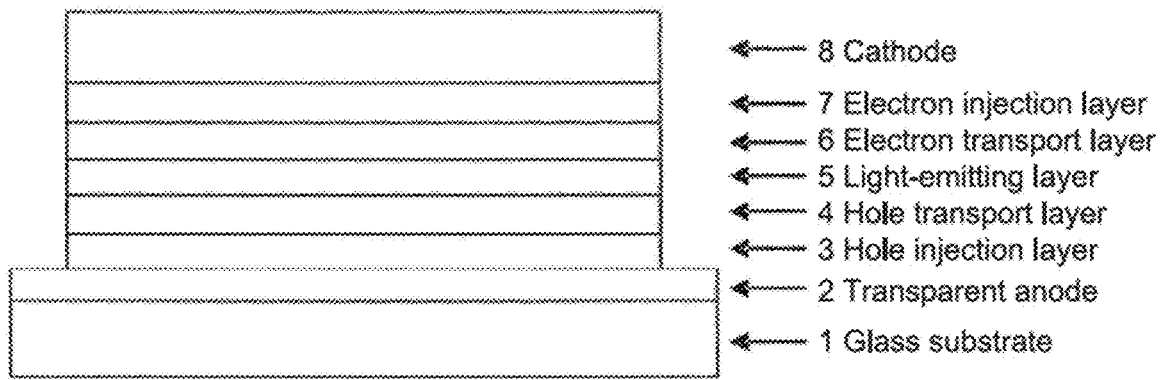
FIG. 1 is a diagram showing a configuration of an organic EL element in an element example and element comparative example.

In FIG. 1, the layer configuration adopted in the example to be described later is shown. Specifically, the layer configuration in which a transparent anode 2, a hole injection layer 3, a hole transport layer 4, a light-emitting layer 5, an electron transport layer 6, an electron injection layer 7, and a cathode 8 are formed in the stated order on a glass substrate 1 is shown.

Although detailed description of the layers will be described later, the present invention has important features in that the hole injection layer contains the arylamine compound I represented by the following general formula (1) and the electron acceptor. Hereinafter, the arylamine compound I and the electron acceptor will be described.

Note that the arylamine compound I and the electron acceptor are used for a layer other than the hole injection layer in some cases. In this case, however, the composition of such a layer has a composition different from the hole injection layer.

<Arylamine Compound I>

The arylamine compound I contained in the hole injection layer has a structure represented by the following formula (1). The arylamine compound I has structural features in that it has two diarylamine benzene rings, and at least one aryl group ($Ar^5$) is bonded to these benzene rings

[Chem. 6]

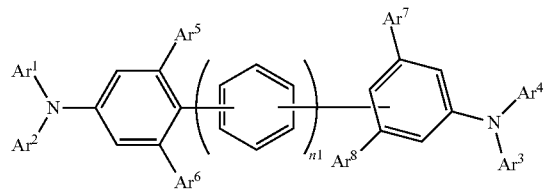

(1)

($Ar^1$ to $Ar^5$)

$Ar^1$ to $Ar^5$ may be the same or differ, and each represent an aromatic hydrocarbon group, an aromatic heterocyclic group, or a fused polycyclic aromatic group.

In the present specification, the fused polycyclic aromatic group contains no hetero atom (e.g., nitrogen atom, oxygen atom, or sulfur atom) in its skeleton.

Figure 3:
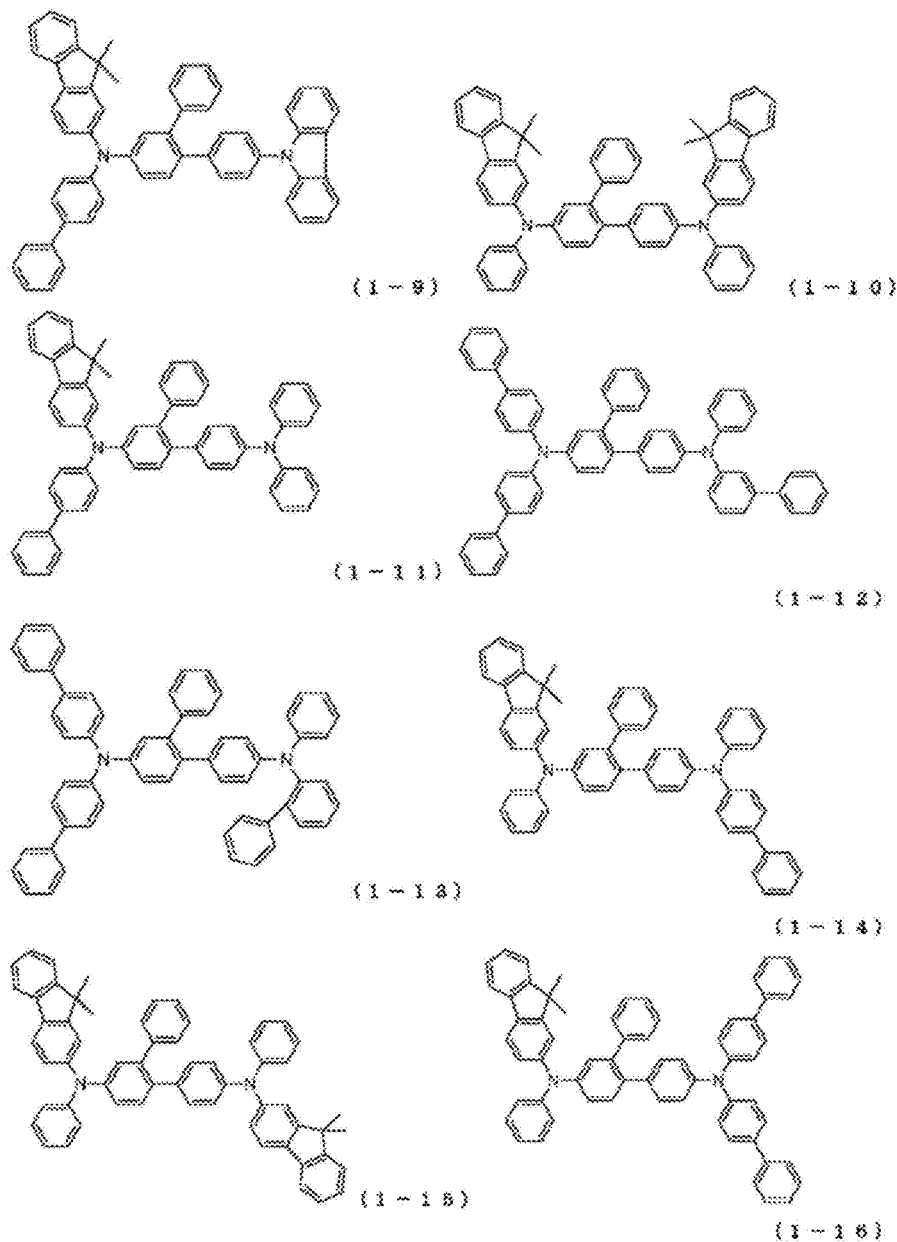
FIG. 3 is a diagram showing structural formulae of compounds 1-9 to 1-16 each corresponding to the arylamine compound I.
Figure 4:
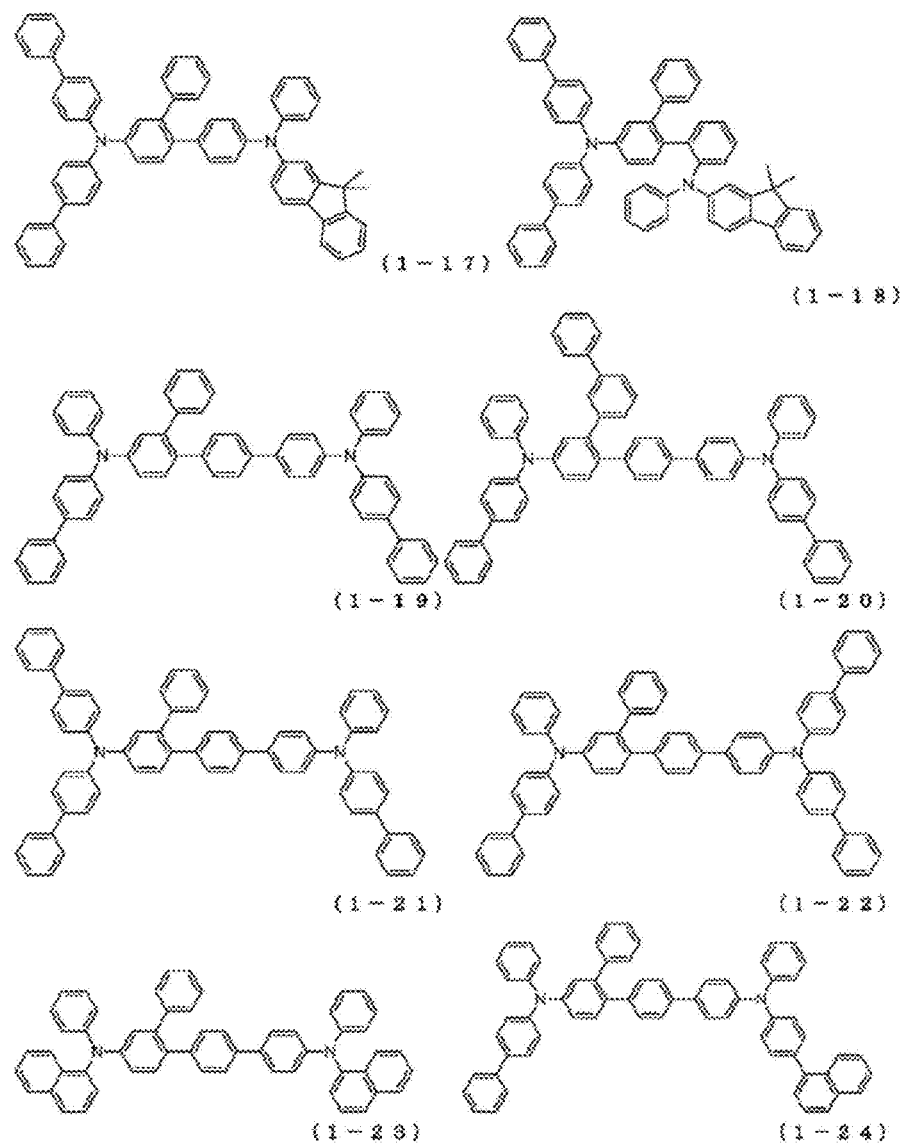
FIG. 4 is a diagram showing structural formulae of compounds 1-17 to 1-24 each corresponding to the arylamine compound I.
Figure 5:
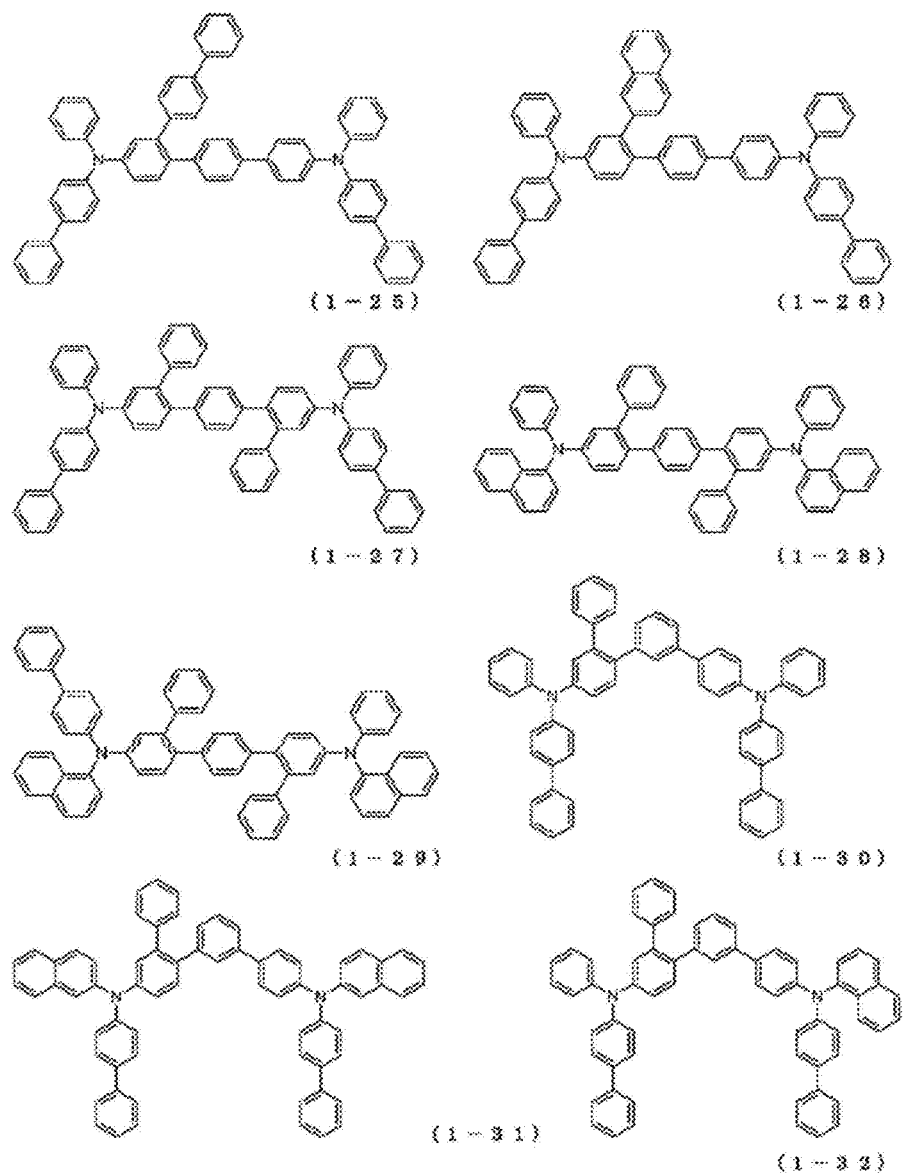
FIG. 5 is a diagram showing structural formulae of compounds 1-25 to 1-32 each corresponding to the arylamine compound I.
Figure 6:
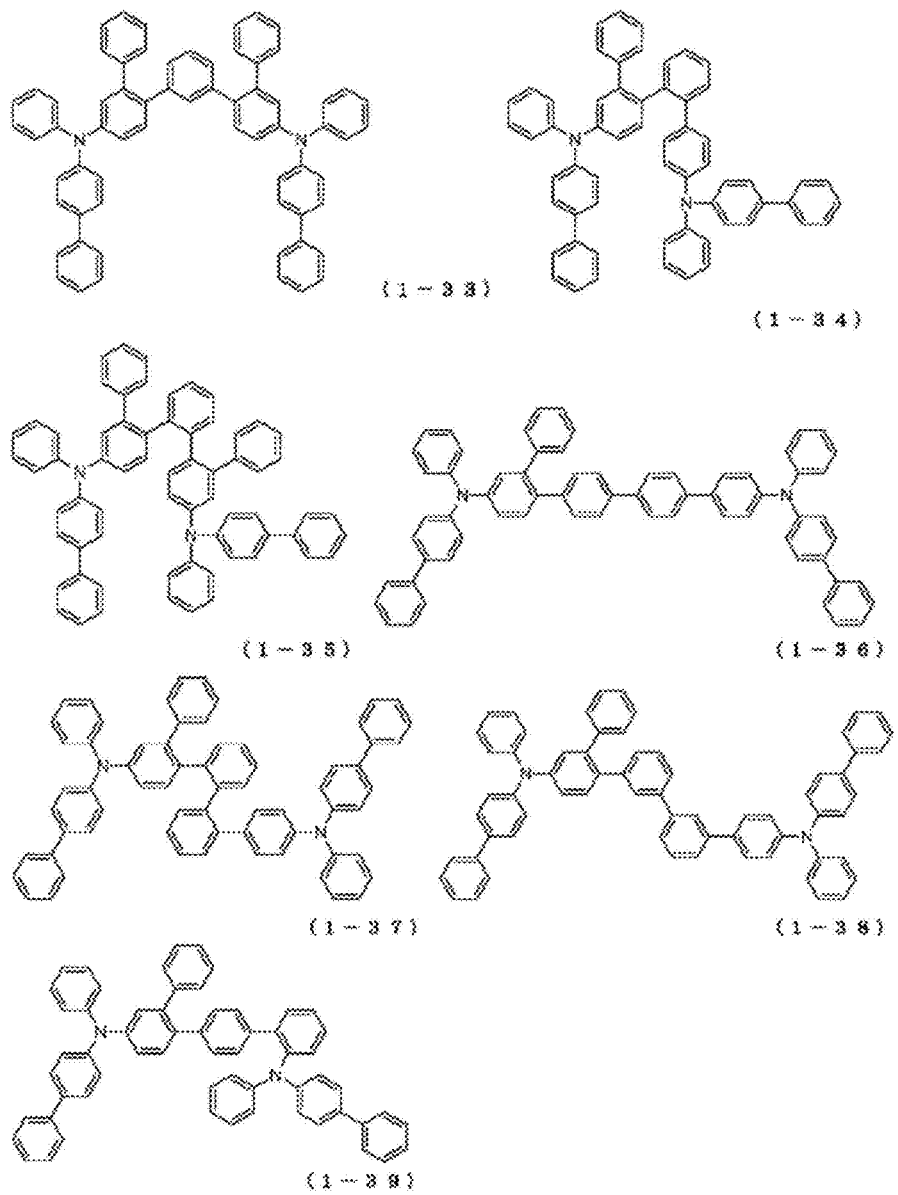
FIG. 6 is a diagram showing structural formulae of compounds 1-33 to 1-39 each corresponding to the arylamine compound I.
Figure 7:
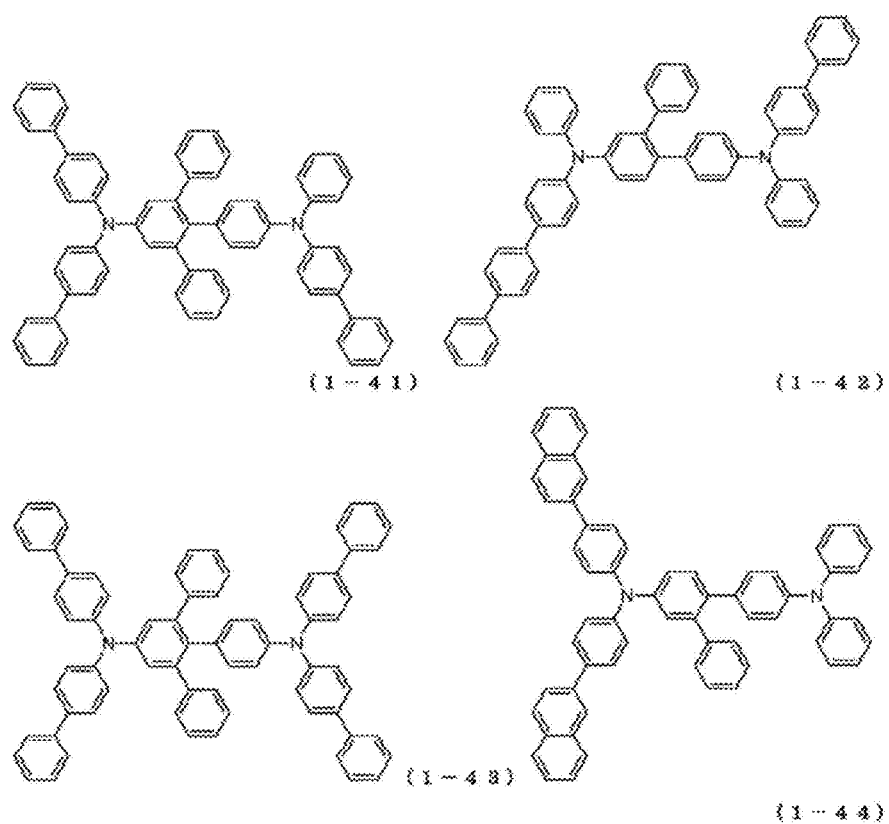
FIG. 7 is a diagram showing structural formulae of compounds 1-41 to 1-44 each corresponding to the arylamine compound I.

$Ar^3$ and $Ar^4$ do not necessarily need to be independently present and form a ring, but may be bonded to each other via a single bond, a substituted or unsubstituted methylene group, an oxygen atom, or a sulfur atom to form a ring. For example, in the compound 1-9 in FIG. 3, $Ar^3$ and $Ar^4$ (any of which is a phenyl group) are bonded to each other via a single bond to form a ring.

Figure 2:
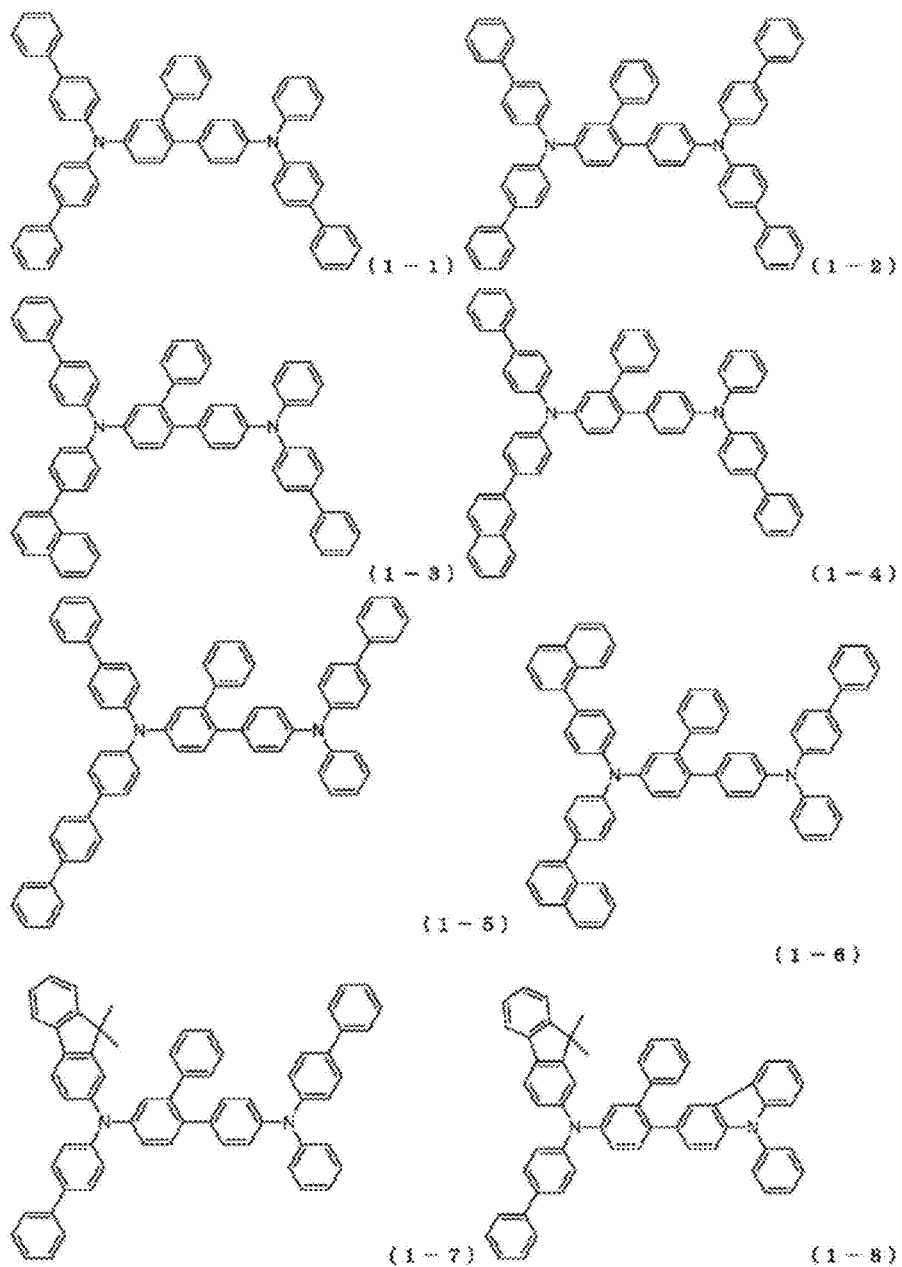
FIG. 2 is a diagram showing structural formulae of compounds 1-1 to 1-8 each corresponding to the arylamine compound I.

$Ar^3$ or $Ar^4$ may be bonded to a benzene ring to which an $Ar^3Ar^4$N-group is bonded, via a single bond, substituted or unsubstituted methylene group, an oxygen atom, or a sulfur atom to form a ring. For example, in the compound 1-8 in FIG. 2, $Ar^3$ or $Ar^4$ (any of which is a phenyl group) is bonded to a benzene ring to which an $Ar^3Ar^4$N-group is bonded, via a single bond to form a ring.

Specific examples of the aromatic hydrocarbon group, the aromatic heterocyclic group, or the fused polycyclic aromatic group represented by $Ar^1$ to $Ar^5$ include a phenyl group, biphenylyl group, a terphenylyl group, a naphthyl group, an anthracenyl group, a phenanthrenyl group, a fluorenyl group, an indenyl group, a pyrenyl group, a perylenyl group, a fluoranthenyl group, a triphenylenyl group, a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, and a pyridobenzofuranyl group.

The aromatic hydrocarbon group, the aromatic heterocyclic group, or the fused polycyclic aromatic group represented by $Ar^1$ to $Ar^5$ may be unsubstituted, but may have a substitution group. Examples of the substitution group include, in addition to a deuterium atom, a cyano group, a nitro group, and a trimethylsilyl group, the following groups:

halogen atoms such as a fluorine atom, a chlorine atom, a bromine atom, and an iodine atom;

alkyl groups having 1 to 6 carbon atoms, such as a methyl group, an ethyl group, an n-propyl group, an isopropyl group, an n-butyl group, an isobutyl group, a tert-butyl group, an n-pentyl group, an isopentyl group, a neopentyl group, and an n-hexyl group;

alkyloxy groups having 1 to 6 carbon atoms, such as a methyloxy group, an ethyloxy group, and a propyloxy group;

alkenyl groups such as a vinyl group and an allyl group;

aryloxy groups such as a phenyloxy group and a tolyloxy group;

arylalkyloxys group such as a benzyloxy group and a phenethyloxy group;

aromatic hydrocarbon groups or fused polycyclic aromatic group such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, a triphenylenyl group, and an acenaphthenyl group, aromatic heterocyclic groups such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, and carbolinyl group, aryl vinyl groups such as a styryl group and naphthyl vinyl group; and acyl groups such as an acetyl group and a benzoyl group.

These substitution groups may be further substituted with the exemplified substitution groups. Further, these substitution groups do not necessarily need to be independently present and form a ring, but may be bonded to each other via a single bond, a substituted or unsubstituted methylene group, an oxygen atom, or a sulfur atom to form a ring. The alkyl groups having 1 to 6 carbon atoms, alkyloxy groups having 1 to 6 carbon atoms, and alkenyl groups may be linear or branched.

($Ar^6$ to $Ar^8$)

$Ar^6$ to $Ar^8$ may be the same or differ, and each represent a hydrogen atom, an aromatic hydrocarbon group, an aromatic heterocyclic group, or a fused polycyclic aromatic group.

Examples of the aromatic hydrocarbon group, the aromatic heterocyclic group, or the fused polycyclic aromatic group represented by $Ar^6$ to $Ar^8$ include groups exemplified as the aromatic hydrocarbon group, the aromatic heterocyclic group, or the fused polycyclic aromatic group represented by $Ar^1$ to $Ar^5$.

These groups represented by $Ar^6$ to $Ar^8$ may be unsubstituted, but may have a substitution group. Examples of the substitution group include substitution groups exemplified in the description of the aromatic hydrocarbon group, the aromatic heterocyclic group, or the fused polycyclic aromatic group represented by $Ar^1$ to $Ar^5$. Embodiments that can be adopted by the substitution group are also the same.

(n1)

n1 represents an integer or 0, 1, or 2. In the case where n1 is 0, the two diarylaminobenzene rings are directly (via a single bond) connected to each other. In the case where n1 is 1, the two diarylaminobenzene rings are connected to each other via one phenylene group. In the case where n1 is 2, the two diaryl aminobenzene rings are connected to each other via two phenylene groups (biphenylene group).

Favorable Embodiment

Hereinafter, a favorable embodiment of the arylamine compound I will be described. However, in the description, the groups to which substituted/unsubstituted are not designated may have a substitution group or may be unsubstituted.

In the arylamine compound I, as shown in the following general formula (1a), it is favorable that a phenylene group is bonded, between $Ar^7$ and $Ar^8$, to a benzene ring to which an $Ar^3Ar^4$N-group is bonded.

[Chem. 7]

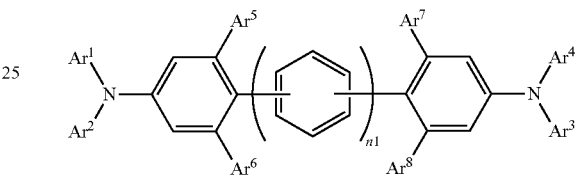

(1a)

$Ar^1$ to $Ar^4$ may be the same or differ, and is favorably an aromatic hydrocarbon group, more favorably a phenyl group, a biphenyl group, a terphenylyl group, a naphthyl group, a fluoranthenyl group, or a fluorenyl group.

$Ar^5$ is favorably an aromatic hydrocarbon group, more favorably a phenyl group, a biphenylyl group, or a naphthyl group.

$Ar^6$ to $Ar^8$ may be the same or differ, is favorably a hydrogen atom or an aromatic hydrocarbon group, more favorably a hydrogen atom or a phenyl group.

The substitution group that may be contained in the aromatic hydrocarbon group, the aromatic heterocyclic group, or the fused polycyclic aromatic group represented by $Ar^1$ to $Ar^8$ is favorably a deuterium atom, an alkyl group having 1 to 6 carbon atoms, an alkenyl group having 2 to 6 carbon atoms, an aromatic hydrocarbon group, or a fused polycyclic aromatic group, more favorably a deuterium atom, a methyl group, a phenyl group, a biphenylyl group, a naphthyl group, or a vinyl group. Further, an embodiment in which these substitution groups are bonded to each other via a single bond to form a fused aromatic ring is also favorable.

n1 is favorably 0 from the viewpoint of the work function.

An embodiment in which $Ar^3$ or $Ar^4$ is bonded to a benzene ring to which an $Ar^3Ar^4$N-group (diarylamino group containing $Ar^3$, $Ar^4$, and an nitrogen atom to which they are bonded) is bonded, via a single bond, a substituted or unsubstituted methylene group, an oxygen atom, or a sulfur atom to form a ring is also favorable. The bonding position in the benzene ring of this case is favorably adjacent to $Ar^3Ar^4$N-group.

Although favorable specific example of the arylamine compound I are shown in FIGS. 1 to 7, the arylamine compound I is not limited to these specific examples. Among the specific examples, 1-1 to 1-17, 1-19 to 1-38, and 1-41 to 1-44 correspond to the general formula (1a). Note that, 1-40 is a missing number.

The arylamine compound I can be synthesized by a well-known method, e.g., cross-coupling such as Suzuki coupling, Buchwald-Hartwig reaction, and Goldberg amination reaction.

Purification of the arylamine compound I can be performed by purification by column chromatography, adsorption purification by silica gel, activated carbon, activated clay and the like, recrystallization by solvent, a crystallization method, a sublimation purification method, or the like. Finally, purification by a sublimation purification method may be performed Identification of the compound can be performed by NMR analysis. As physical property-values, a melting point, a glass transition point (Tg), and a work function can be measured.

The melting point is an index of a vapor deposition property. The melting point can be measured using a powder sample and a high sensitivity scanning calorimeter (DSC3100SA manufactured by Bruker AXS K.K.) The glass transition point (Tg) is an index of the stability of the thin-film state. The glass transition point (Tg) can be measured using a powder sample and a high sensitivity scanning calorimeter (DSC3100SA manufactured by Bruker AXS K.K.).

The work function is an index of the hole transport property and the hole blocking property. The work function can be obtained by preparing a thin film of 100 nm on an ITO substrate and using an ionization potential measuring apparatus (PYS-202 manufactured by Sumitomo Heavy Industries, Ltd.)

Also for the compounds (e.g., the radialene derivative n, the amine derivative III, the pyrimidine derivative IV, and the like to be described later) used for the organic EL element of the present invention other than the arylamine compound I, purification and various types of measurement can be performed by the same methods after synthesis.

<Electron Acceptor>

Examples of the electron acceptor to be doped into the arylamine compound I in the hole injection layer 3 include tris(bromophenyl amine) hexachloroantimony, tetracyanoquinone dimethane (TCNQ), 2,3,5,6-tetrafluoro-tetracyano-1,4-benzoquinone dimethane (F4TCNQ), and radialene derivatives (e.g., see Japanese Patent Application Laid-open No. 2011-100621), and the radialene derivative II represented by the following general formula (2) is favorably used.

[Chem. 8]

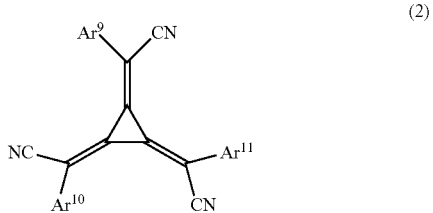

(2)

$(Ar^9$ to $Ar^{11})$ $Ar^9$ to $Ar^{11}$ may be the same or differ, and each represent a group having an electron receptor group as a substitution group, which is an aromatic hydrocarbon group, an aromatic heterocyclic group, or a fused polycyclic aromatic group.

Regarding $Ar^9$ to $Ar^{11}$, examples of the electron receptor group include a fluorine atom, a chlorine atom, a bromine atom, a cyano group, a trifluoromethyl group, and a nitro group.

Regarding $Ar^9$ to $Ar^{11}$, examples of the aromatic hydrocarbon group, the aromatic heterocyclic group, or the fused polycyclic aromatic group include groups exemplified as the aromatic hydrocarbon group, the aromatic heterocyclic group, or the fused polycyclic aromatic group represented by $Ar^1$ to $Ar^5$ in the general formula (1).

These groups represented by $Ar^9$ to $Ar^{11}$ may each have a substitution group other than the electron receptor group. Examples of the substitution group include, in addition to a deuterium atom, the following groups.

aromatic hydrocarbon groups or fused polycyclic aromatic groups such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group; and aromatic heterocyclic groups such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, and a carbolinyl group.

These substitution groups may be further substituted with the exemplified substitution groups or electron receptor groups. Further, these substitution groups do not necessarily need to be independently present and form a ring, but may be bonded to each other via a single bond, a substituted or unsubstituted methylene group, an oxygen atom, or a sulfur atom to form a ring.

Favorable Embodiment

Hereinafter, a favorable embodiment of the radialene derivative II will be described. However, in the description, the groups to which substituted/unsubstituted are not designated may have a substitution group or may be unsubstituted.

Regarding $Ar^9$ to $Ar^{11}$, the electron receptor group is favorably a fluorine atom, a chlorine atom, a cyano group, or a trifluoromethyl group.

Regarding $Ar^9$ to $Ar^{11}$, the aromatic hydrocarbon group, the aromatic heterocyclic group, or the fused polycyclic aromatic group is favorably an aromatic hydrocarbon group, a fused polycyclic aromatic group, or a pyridyl group, more favorably a phenyl group, a biphenylyl group, a terphenyl group, a naphthyl group, a phenanthrenyl group, a fluorenyl group, or a pyridyl group.

Regarding $Ar^9$ to $Ar^{11}$, it is favorable that as an embodiment, at least one group, favorably all the groups each have a receptor group as a substitution group.

$Ar^9$ to $Ar^{11}$ may be the same or differ, and is favorably a phenyl group or pyridyl group completely substituted with a fluorine atom, a chlorine atom, a cyano group, or a trifluoromethyl group, more favorably a tetrafluoropyridyl group, a tetrafluoro-(trifluoromethyl) phenyl group, a cyano-tetrafluorophenyl group, a dichloro-difluoro-(trifluoromethyl) phenyl group, or a pentafluorophenyl group.

In the organic EL element of the present invention, each layer can adopt various embodiments as long as the hole injection layer contains the above-mentioned arylamine compound I and electron acceptor. Hereinafter, each layer will be described in detail with reference to FIG. 1.

<Anode 2>

In the organic EL element of the present invention, the anode 2 is provided on the substrate 1 For the anode 2, an electrode material having a large work function, such as ITO and gold is used.

<Hole Injection Layer 3>

Between the anode 2 and the hole transport layer 4, the hole injection layer 3 is provided. In the hole injection layer 3, the arylamine compound 1 is P-doped with an electron acceptor. In addition to the arylamine compound I and the electron acceptor, a well-known hole injection/transport material may be mixed or used at the same time.

As the well-known material, for example, a starburst-type triphenylamine derivative, a material such as various triphenylamine tetramers; a porphyrin compound typified by copper phthalocyanine; an acceptor heterocyclic compound such as hexacyanoazatriphenylene; and a coating-type polymer material can be used.

By forming a thin film using these materials by a well-known method such as a vapor deposition method, a spin coating method, and an inkjet method, the hole injection layer 3 can be obtained. The layers described below can be similarly obtained by forming a thin film by a well-known method such as a vapor deposition method, a spin coating method, and an inkjet method.

<Hole Transport Layer 4>

On the hole injection layer 3, the hole transport layer 4 is provided. The hole transport layer 4 may contain, in addition to the arylamine compound I represented by the general formula (1), the well-known materials exemplified below:

benzidine derivatives such as

N,N'-diphenyl-N,N'-di(m-tolyl) benzidine (TPD),

N,N'-diphenyl-N,N'-di(α-naphthyl) benzidine (NPD), and N,N,N',N'-tetrabiphenylyl benzidine;

arylamine compounds having two triphenylamine structures in the molecules in which the triphenylamine structures are linked by a single bond or a divalent group that contains no hetero atom, such as 1,1-bis[4-(di-4-tolylamino)phenyl]cyclohexane (TAPC);

an arylamine compound having four triphenylamine structures in the molecules in which the triphenylamine structures are linked by a single bond or a divalent group that contains no hetero atom; and various triphenylamine trimers.

Further, a coating-type polymer material such as poly(3,4-ethylenedioxythiophene) (PEDOT)/poly(styrene sulfonate) (PSS) can be used for forming the hole injection layer 3 serving also as the hole transport layer 4.

For the hole transport layer 4, a hole transport arylamine compound is favorably used, the above-mentioned arylamine compound 1 is more favorably used, and the arylamine compound I that is not P-doped with an electron acceptor is particularly favorably used. That is, it is particularly favorable to selectively use an electron acceptor in the hole injection layer.

These materials may be used alone for film formation, but may be mixed with another material for film formation. Also in the case of the following organic layers described below, films can be similarly formed.

The hole transport layer 4 may have a structure in which layers each formed alone are stacked, a structure in which layers formed by being mixed are stacked, or a structure in which a layer formed alone and a layer formed by being mixed are stacked. Also the following organic layers described below can have a structure similar thereto.

<Electron Blocking Layer>

Between the hole transport layer 4 and the light-emitting layer 5, an electron blocking layer (not shown) can be provided. For the electron blocking layer, the above-mentioned arylamine compound I is favorably used. In addition, the well-known compounds having an electron blocking operation exemplified below can be used:

arylamine compounds having four triphenylamine structures in the molecules in which the triphenylamine structures are linked by a single bond or a divalent group that contains no hetero atom;

arylamine compounds having two triphenylamine structures in the molecules in which the triphenylamine structures are linked by a single bond or a divalent group that contains no hetero atom;

carbazole derivatives such as 4,4',4"-tri(N-carbazolyl) triphenylamine (TCTA), 9,9-bis[4-(carbazol-9-yl)phenyl]fluorene, 1,3-bis(carbazol-9-yl) benzene (mCP), and 2,2-bis(4-carbazol-9-ylphenyl) adamantane (Ad-Cz), and triarylamine compounds having a triphenylsilyl group such as 9-[4-(carbazol-9-yl)phenyl]-9-[4-(triphenylsilyl)phenyl]-9H-fluorene.

It is favorable that the layers (e.g., the hole transport layer 4 and the electron blocking layer) adjacent to the light-emitting layer 5 is not P-doped with an electron acceptor.

For these layers, an arylamine compound having a high electron blocking property is favorably used, and the above-mentioned arylamine compound I is more favorably used.

Further, the film thickness of these layers is not particularly limited as long as it is within a general range. For example, the film thickness of the hole transport layer 4 is 20 to 100 nm, and the film thickness of the electron blocking layer is 5 to 30 nm.

<Light-Emitting Layer 5>

For the light-emitting layer 5, the amine derivative III represented by the following general formula (3), a well-known pyrene derivative, or the like is used. Alternatively, a well-known light-emitting material may be used Examples of the well-known light-emitting material include: various metal complexes such as a metal complex of a quinolinol derivative including $Alq_3$; an anthracene derivative; a bis-styrylbenzene derivative; an oxazole derivative, and a polyparaphenylene vinylene derivative.

The light-emitting layer 5 favorably includes a host material and a dopant material.

As the host material, although depending on the combination with the dopant material, not only the above-mentioned light-emitting material, but also a thiazole derivative, a benzimidazole derivative, a polydialkylfluorene derivative, and the like can be used, and an anthracene derivative is favorably used.

As the dopant material, for example, the amine derivative III, a pyrene derivative; quinacridone, coumarin, rubrene, perylene, and derivatives thereof; a benzopyran derivative; an indenophenanthrene derivative; a rhodamine derivative; and an aminostyryl derivative can be used.

In the light-emitting layer, a blue light-emitting dopant is favorably used. The blue light-emitting dopant is favorably the amine derivative III or a pyrene derivative, more favorably the amine derivative III.

Amine derivative III

[Chem. 9]

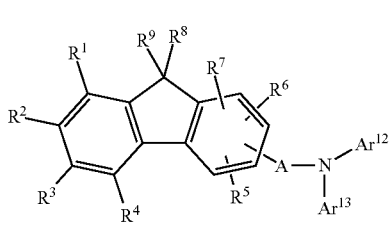

(3)

(A¹)

A¹ represents a divalent aromatic hydrocarbon group, a divalent aromatic heterocyclic ring group, a divalent fused polycyclic aromatic group, or a single bond.

In the present specification, the divalent aromatic hydrocarbon group, the divalent aromatic heterocyclic ring group, and the divalent fused polycyclic aromatic group respectively represent divalent groups obtained by removing two hydrogen atoms from the aromatic hydrocarbon, the aromatic heterocyclic ring, and the fused polycyclic aromatic.

Regarding A¹, examples of the aromatic hydrocarbon, the aromatic heterocyclic ring, or the fused polycyclic aromatic include benzene, biphenyl, terphenyl, tetrakisphenyl, styrene, naphthalene, anthracene, acenaphthalene, fluorene, phenanthrene, indane, pyrene, triphenylene, pyridine, pyrimidine, triazine, pyrrole, franc, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, and acridine.

These divalent groups represented by A¹ may be unsubstituted, but may have a substitution group. Examples of the substitution group include substitution groups exemplified in the description of the aromatic hydrocarbon group, the aromatic heterocyclic group, or the fused polycyclic aromatic group represented by Ar¹ to Ar⁵ in the general formula (1). Embodiments that can be adopted are also the same.

(Ar¹², Ar¹³)

Ar¹² and Ar¹³ may be the same or differ, and each represent an aromatic hydrocarbon group, an aromatic heterocyclic group, or a fused polycyclic aromatic group.

Ar¹² and Ar¹³ do not necessarily need to be independently present and form a ring, but may be bonded to each other via a single bond, a substituted or unsubstituted methylene group, an oxygen atom, or a sulfur atom to form a ring. In the case where Ar¹² or Ar¹³ has a substitution group, Ar¹² and Ar¹³ may be bonded to each other via the substitution group and a single bond, a substituted or unsubstituted methylene group, an oxygen atom, or a sulfur atom, but may be bonded to each other not via a substitution group.

Examples of the aromatic hydrocarbon group, the aromatic heterocyclic group, or the fused polycyclic aromatic group represented by Ar¹² and Ar¹³ include groups exemplified as the aromatic hydrocarbon group, the aromatic heterocyclic group, or the fused polycyclic aromatic group represented by Ar¹ to Ar⁵ in the general formula (1).

These groups represented by Ar¹² and Ar¹³ may be unsubstituted, or may have a substitution group. Examples of the substitution group include the substitution groups exemplified in the description of the aromatic hydrocarbon group, the aromatic heterocyclic group, or the fused polycyclic aromatic group represented by Ar¹ to Ar⁵ in the general formula (1). Embodiments that can be adopted are also the same.

(R¹ to R⁴)

R¹ to R⁴ may be the same or differ, and each represent a hydrogen atom; a deuterium atom; a fluorine atom; a chlorine atom; a cyano group; a nitro group; an alkyl group having 1 to 6 carbon atoms; a cycloalkyl group having 5 to 10 carbon atoms, an alkenyl group having 2 to 6 carbon atoms; an alkyloxy group having 1 to 6 carbon atoms; a cycloalkyloxy group having 5 to 10 carbon atoms; an aromatic hydrocarbon group; an aromatic heterocyclic group; a fused polycyclic aromatic group; an aryloxy group; or a di-substituted amino group substituted by a group selected from an aromatic hydrocarbon group, an aromatic heterocyclic group, or a fused polycyclic aromatic group. The alkyl group having 1 to 6 carbon atoms, the alkenyl group having 2 to 6 carbon atoms, and the alkyloxy group having 1 to 6 carbon atoms may be linear or branched.

R¹ to R⁴ do not necessarily need to be independently present and form a ring, but may be bonded to each other via a single bond, a substituted or unsubstituted methylene group, an oxygen atom, or a sulfur atom to form a ring. Note that in the case where R¹ to R⁴ are di-substituted amino groups, the aromatic hydrocarbon group, the aromatic heterocyclic group, or the fused polycyclic aromatic group in the di-substituted amino group contributes to ring formation.

Further, in the benzene ring to which R¹ to R⁴ are bonded, to a vacancy caused by elimination of any one of R¹ to R⁴, another group of R¹ to R⁴ may be bonded via a substituted or unsubstituted methylene group, an oxygen atom, a sulfur atom, or a monosubstituted amino group, thereby forming a ring. Note that in the case where R¹ to R⁴ are di-substituted amino groups, the aromatic hydrocarbon group, the aromatic heterocyclic group, or the fused polycyclic aromatic group in the di-substituted amino group contributes to ring formation with the benzene ring.

A substitution group of the monosubstituted amino group that is one of linking groups is an alkyl group having 1 to 6 carbon atoms, a cycloalkyl group having 5 to 10 carbon atoms, an aromatic hydrocarbon group, an aromatic heterocyclic group, or a fused polycyclic aromatic group. Examples of the alkyl group having 1 to 6 carbon atoms or the cycloalkyl group having 5 to 10 carbon atoms include groups exemplified in the description of the alkyl group having 1 to 6 carbon atoms or the cycloalkyl group having 5 to 10 carbon atoms represented by R¹ to R⁴ to be described later. Examples of the aromatic hydrocarbon group, the aromatic heterocyclic group, or the fused polycyclic aromatic group include groups exemplified in the description of the aromatic hydrocarbon group, the aromatic heterocyclic group, or the fused polycyclic aromatic group represented by R¹ to R⁴ to be described later.

These substitution groups of the monosubstituted amino group may be unsubstituted, but may have a different substitution group. In the case where the monosubstituted amino group has an alkyl group having 1 to 6 carbon atoms or a cycloalkyl group having 5 to 10 carbon atoms, examples of the different substitution group include groups exemplified in the description of the alkyl group having 1 to 6 carbon atoms, the cycloalkyl group having 5 to 10 carbon atoms, or the alkenyl group having 2 to 6 carbon atoms represented by R¹ to R⁴ to be described later. Embodiments that can be adopted are also the same. Further, in the case where the monosubstituted amino group has an aromatic hydrocarbon group, an aromatic heterocyclic group, or a fused polycyclic aromatic group, examples of the different substitution group include substitution groups exemplified in the description of the aromatic hydrocarbon group, the aromatic heterocyclic group, or the fused polycyclic aromatic group represented by $R^1$ to $R^4$ to be described later Embodiments that can be adopted are also the same.

Specific examples of the alkyl group having 1 to 6 carbon atoms, the cycloalkyl group having 5 to 10 carbon atoms, or the alkenyl group having 2 to 6 carbon atoms represented by $R^1$ to $R^4$ include a methyl group, an ethyl group, an n-propyl group, an isopropyl group, an n-butyl group, an isobutyl group, a tert-butyl group, an n-pentyl group, an isopentyl group, a neopentyl group, an n-hexyl group, and the like; a cyclopentyl group, a cyclohexyl group, a 1-adamantyl group, a 2-adamantyl group, and the like, a vinyl group, an allyl group, an isopropenyl group, a 2-butenyl group, and the like.

The alkyl group having 1 to 6 carbon atoms, the cycloalkyl group having 5 to 10 carbon atoms, or the alkenyl group having 2 to 6 carbon atoms represented by $R^1$ to $R^4$ may be unsubstituted, but may have a substitution group. Examples of the substitution group include, in addition to a deuterium atom, a cyano group, and a nitro group, the following groups:

halogen atoms such as a fluorine atom, a chlorine atom, a bromine atom, and an iodine atom;
alkyloxy groups having 1 to 6 carbon atoms, such as a methyloxy group, an ethyloxy group, and a propyloxy group;
alkenyl groups such as a vinyl group and an allyl group;
aryloxy groups such as a phenyloxy group and a tolyloxy group;
arylalkyloxy groups such as a benzyloxy group and a phenethyloxy group;
aromatic hydrocarbon groups or fused polycyclic aromatic groups such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group;
aromatic heterocyclic groups such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, and a carbolinyl group;
a di-substituted amino group substituted with an aromatic hydrocarbon group or a fused polycyclic aromatic group, such as a diphenylamino group and a di naphthylamino group;
a di-substituted amino group substituted with an aromatic heterocyclic group, such as a dipyridylamino group and a dithienylamino group; and
a di-substituted amino group substituted with an aromatic hydrocarbon group, a fused polycyclic aromatic group, or an aromatic heterocyclic group.

These substitution groups may be unsubstituted, but may be further substituted with the exemplified substitution groups. Further, these substitution groups do not necessarily need to be independently present and form a ring, but may be bonded to each other via a single bond, a substituted or unsubstituted methylene group, an oxygen atom, or a sulfur atom to form a ring. The alkyloxy group having 1 to 6 carbon atoms and the alkenyl group may be linear or branched.

Specific examples of the alkyloxy group having 1 to 6 carbon atoms or the cycloalkyloxy group having 5 to 10 carbon atoms represented by $R^1$ to $R^4$ include a methyloxy group, an ethyloxy group, an n-propyloxy group, an isopropyloxy group, an n-butyloxy group, a tert-butyloxy group, an n-pentyloxy group, an n-hexyloxy group, and the like; and a cyclopentyloxy group, a cyclohexyloxy group, a cycloheptyloxy group, a cyclooctyloxy group, a 1-adamantyloxy group, 2-adamantyloxy group, and the like.

These groups represented by $R^1$ to $R^4$ may be unsubstituted, or may have a substitution group. Examples of the substitution group include groups exemplified in the description of the alkyl group having 1 to 6 carbon atoms, the cycloalkyl group having 5 to 10 carbon atoms, or the alkenyl group having 2 to 6 carbon atoms represented by $R^1$ to $R^4$. Embodiments that can be adopted are also the same.

Examples of the aromatic hydrocarbon group, the aromatic heterocyclic group, or the fused polycyclic aromatic group represented by $R^1$ to $R^4$ include groups exemplified as the aromatic hydrocarbon group, the aromatic heterocyclic group, or the fused polycyclic aromatic group represented by $Ar^1$ to $Ar^5$ in the general formula (1).

The aromatic hydrocarbon group, the aromatic heterocyclic group, or the fused polycyclic aromatic group represented by $R^1$ to $R^4$ may be unsubstituted, but may have a substitution group. Examples of the substitution group include, in addition to a deuterium atom, a cyano group, a nitro group, and a trimethylsilyl group, the following groups:

halogen atoms such as a fluorine atom, a chlorine atom, a bromine atom, and an iodine atom;
alkyl groups having 1 to 6 carbon atoms, such as a methyl group, an ethyl group, an n-propyl group, an isopropyl group, an n-butyl group, an isobutyl group, a tert-butyl group, an n-pentyl group, an isopentyl group, a neopentyl group, and an n-hexyl group;
alkyloxy groups having 1 to 6 carbon atoms, such as a methyloxy group, an ethyloxy group, and a propyloxy group;
alkenyl groups such as a vinyl group and an allyl group;
aryloxy groups such as a phenyloxy group and a tolyloxy group;
arylalkyloxy groups such as a benzyloxy group and a phenethyloxy group;
aromatic hydrocarbon groups or fused polycyclic aromatic groups such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group;
aromatic heterocyclic groups such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, and a carbolinyl group,
aryl vinyl groups such as a styryl group and naphthyl vinyl group;

acyl groups such as an acetyl group and a benzoyl group;
silyl groups such as a trimethylsilyl group and a triphenylsilyl group;
di-substituted amino groups substituted with an aromatic hydrocarbon group or a fused polycyclic aromatic group, such as a diphenylamino group and a dinaphthylamino group;
di-substituted amino groups substituted with an aromatic heterocyclic group, such as a dipyridylamino group and a dithienylamino group; and
di-substituted amino groups substituted with a substation group selected from an aromatic hydrocarbon group, a fused polycyclic aromatic group, or an aromatic heterocyclic group.

These substitution groups may be unsubstituted, but may be further substituted with the exemplified substitution groups. Further, these substitution groups do not necessarily need to be independently present and form a ring, but may be bonded to each other via a single bond, a substituted or unsubstituted methylene group, an oxygen atom, or a sulfur atom to form a ring. The alkyl group having 1 to 6 carbon atoms, the alkyloxy group having 1 to 6 carbon atoms, and the alkenyl group may be linear or branched.

Specific examples of the aryloxy group represented by $R^1$ to $R^4$ include a phenyloxy group, a biphenylyloxy group, a terphenylyloxy group, a naphthyloxy group, an anthracenyloxy group, a phenanthrenyloxy group, a fluorenyloxy group, an indenyloxy group, a pyrenyloxy group, and a perylenyloxy group.

These groups represented by $R^1$ to $R^4$ may be unsubstituted, but may have a substitution group. Examples of the substitution group include the substitution groups exemplified in the description of the aromatic hydrocarbon group, the aromatic heterocyclic group, or the fused polycyclic aromatic group represented by $R^1$ to $R^4$. Embodiments that can be adopted by the substitution group are also the same.

Examples of the aromatic hydrocarbon group, the aromatic heterocyclic group, or the fused polycyclic aromatic group as the substitution group of the di-substituted amino group represented by $R^1$ to $R^4$ include the groups exemplified as the aromatic hydrocarbon group, the aromatic heterocyclic group, or the fused polycyclic aromatic group represented by $Ar^1$ to $Ar^5$ in the general formula (1).

These substitution groups of the di-substituted amino group may be unsubstituted, but may have a different substitution group. In this case, example of the different substitution group include the substitution groups exemplified in the description of the aromatic hydrocarbon group, the aromatic heterocyclic group, or the fused polycyclic aromatic group represented by $R^1$ to $R^4$. Embodiments that can be adopted by the substitution group are also the same.

($R^5$ to $R^7$)

$R^5$ to $R^7$ may be the same or differ, and each represent a hydrogen atom, a deuterium atom, a fluorine atom, a chlorine atom, a cyano group, a nitro group, an alkyl group having 1 to 6 carbon atoms, a cycloalkyl group having 5 to 10 carbon atoms, an alkenyl group having 2 to 6 carbon atoms, an alkyloxy group having 1 to 6 carbon atoms, a cycloalkyloxy group having 5 to 10 carbon atoms, an aromatic hydrocarbon group, an aromatic heterocyclic group, a fused polycyclic aromatic group, or an aryloxy group. The alkyl group having 1 to 6 carbon atoms, the alkenyl group having 2 to 6 carbon atoms, and the alkyloxy group having 1 to 6 carbon atoms may be linear or branched.

$R^5$ to $R^7$ do not necessarily need to be independently present and form a ring, but may be bonded to each other via a single bond, a substituted or unsubstituted methylene group, an oxygen atom, or a sulfur atom to form a ring.

Figure 8:
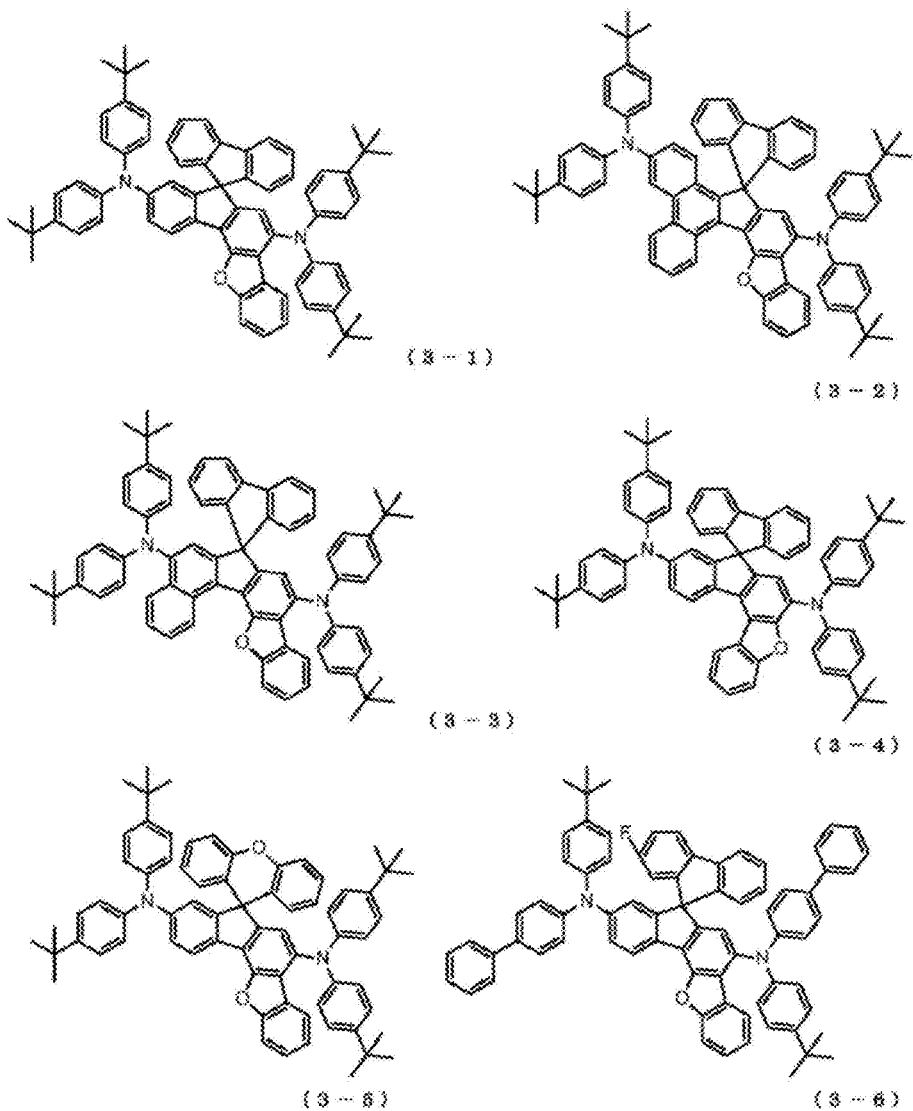
FIG. 8 is a diagram showing structural formulae of compounds 3-1 to 3-6 each corresponding to the amine derivative III.
Figure 9:
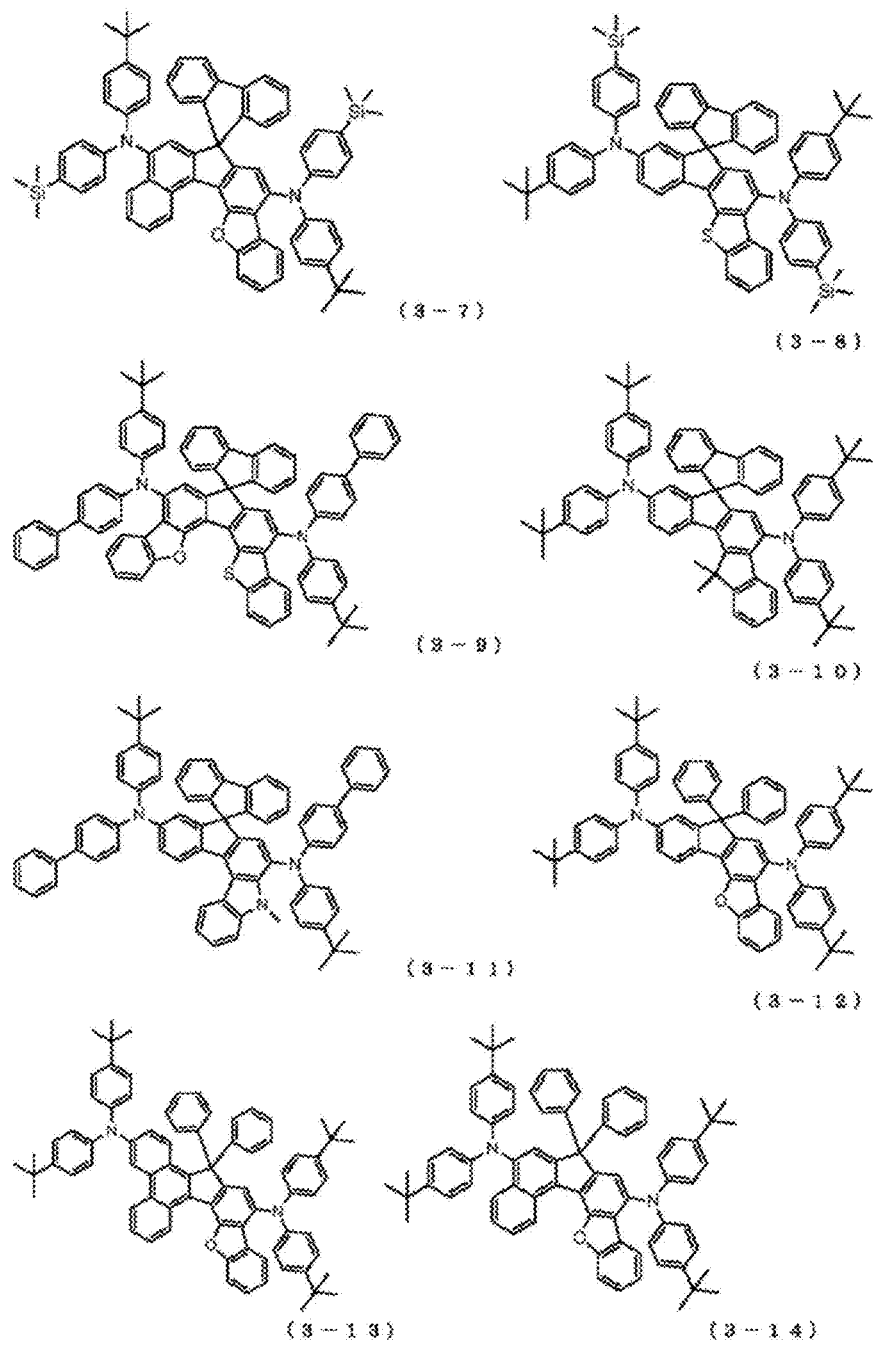
FIG. 9 is a diagram showing structural formulae of compounds 3-7 to 3-14 each corresponding to the amine derivative III.
Figure 10:
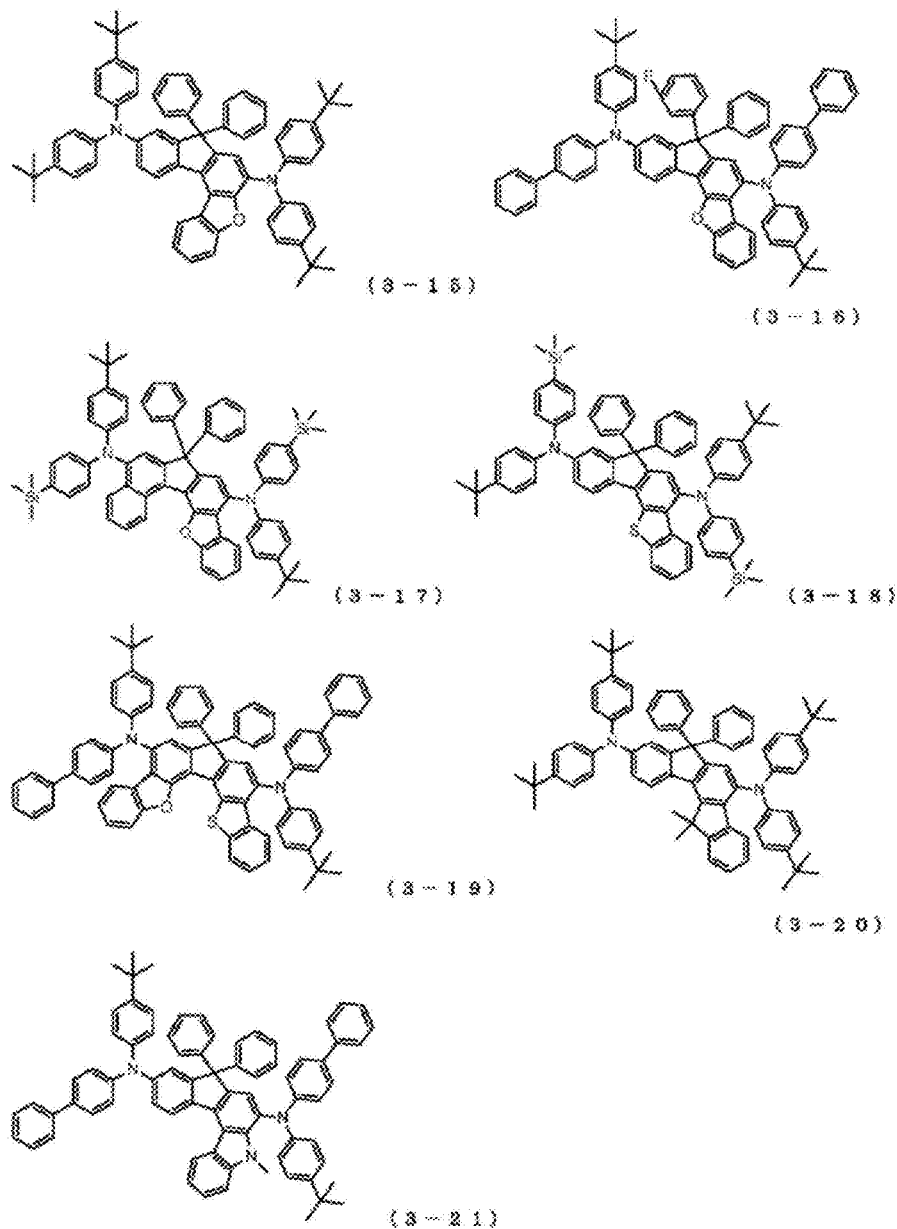
FIG. 10 is a diagram showing structural formulae of compounds 3-15 to 3-21 each corresponding to the amine derivative III.
Figure 11:
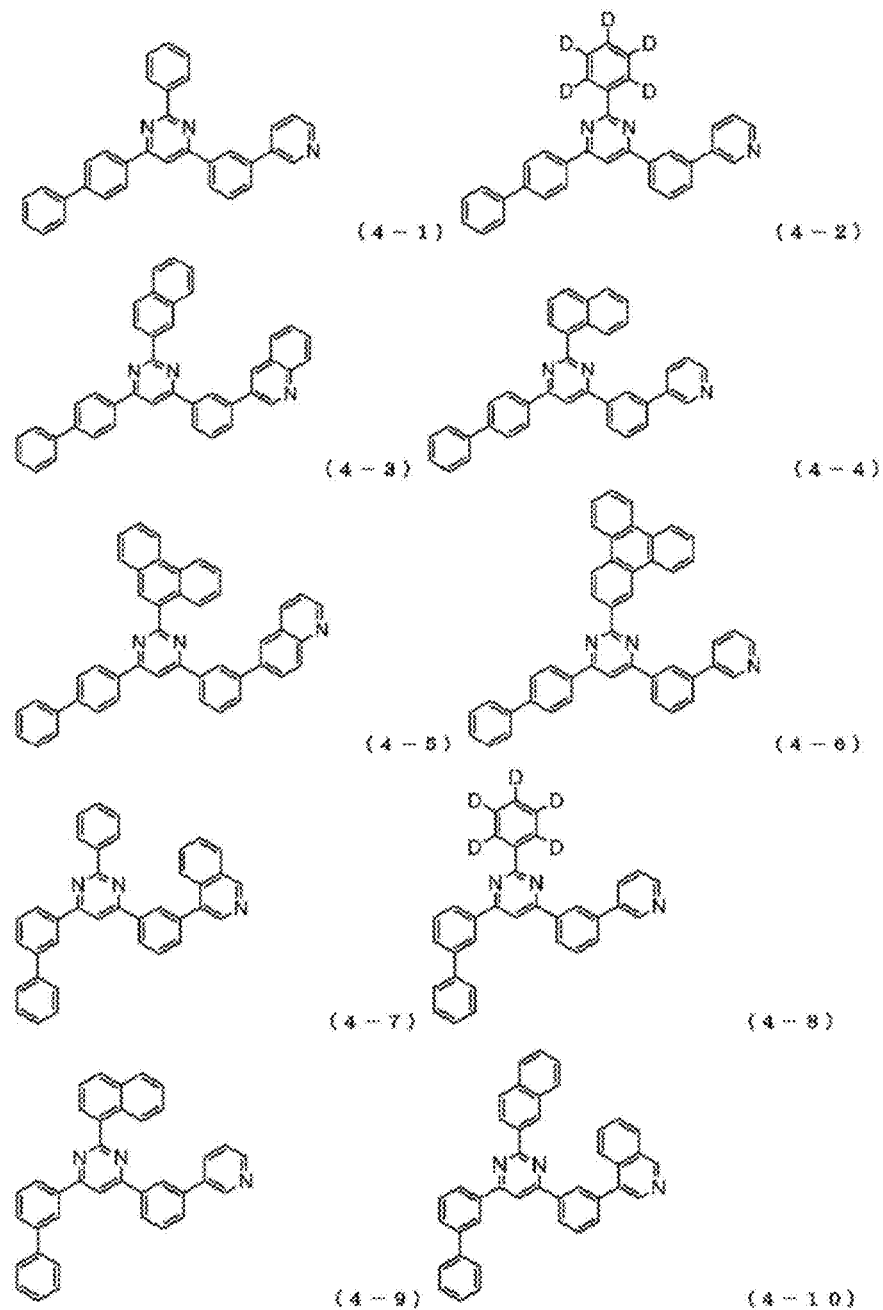
FIG. 11 is a diagram showing structural formulae of compounds 4-1 to 4-10 each corresponding to the pyrimidine derivative IV.
Figure 12:
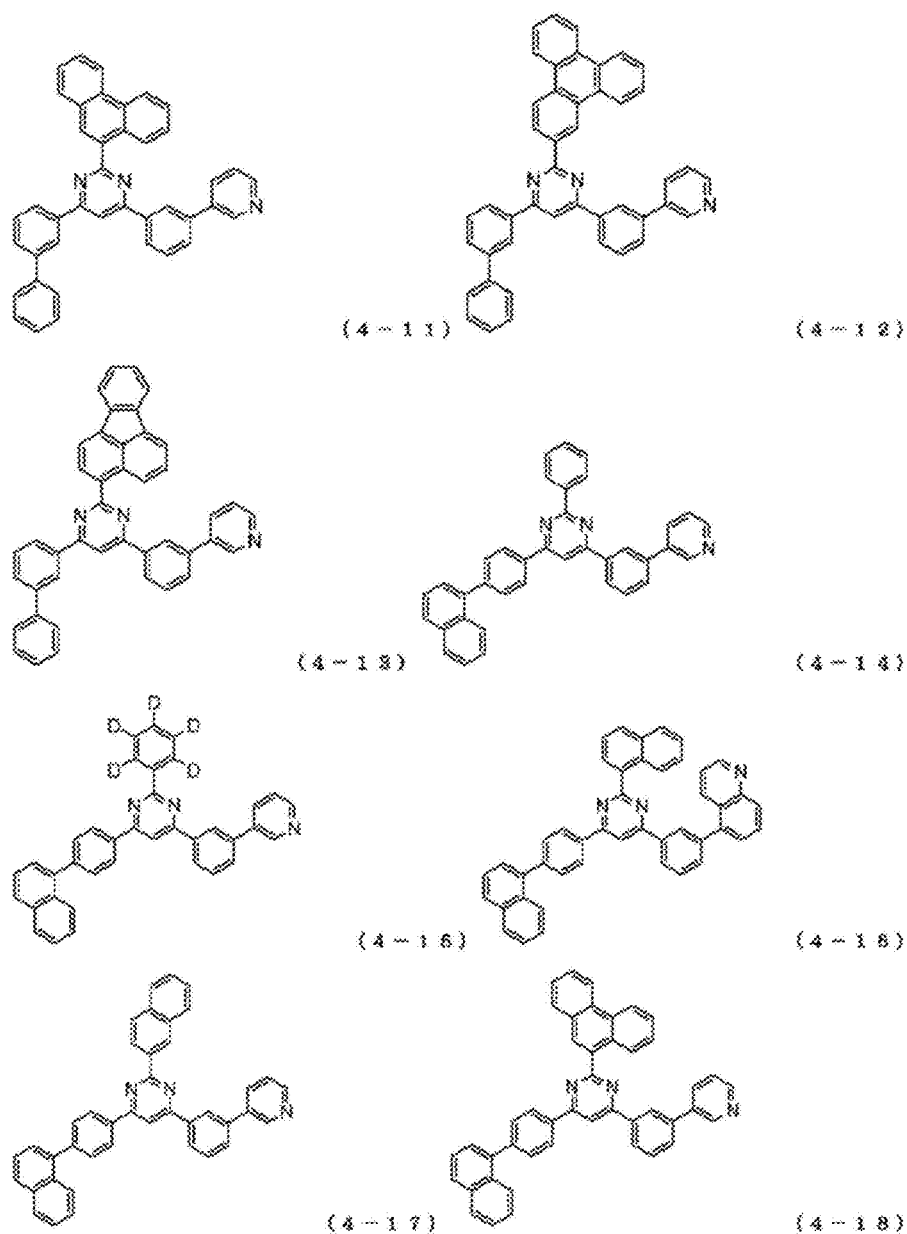
FIG. 12 is a diagram showing structural formulae of compounds 4-11 to 4-18 each corresponding to the pyrimidine derivative IV.
Figure 13:
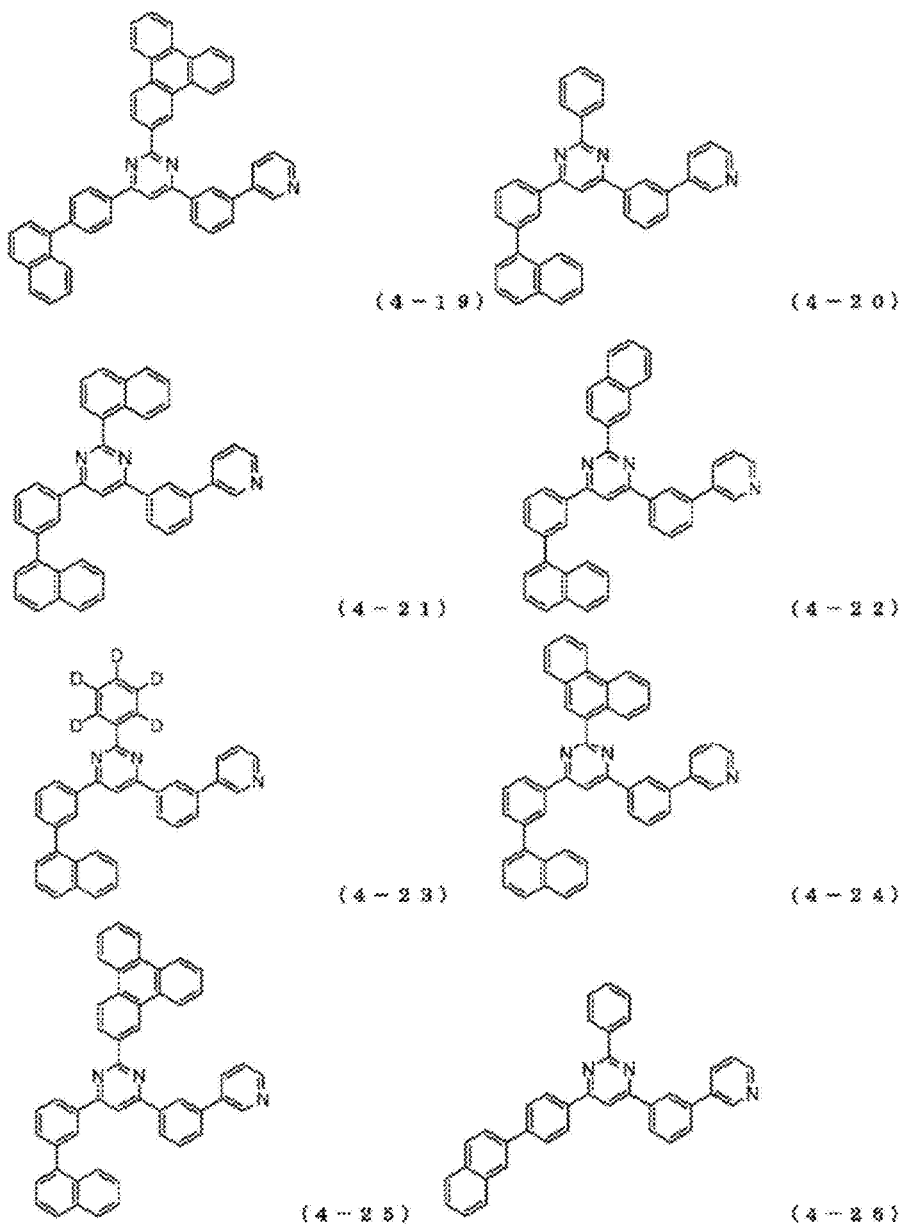
FIG. 13 is a diagram showing structural formulae of compounds 4-19 to 4-26 each corresponding to the pyrimidine derivative IV.
Figure 14:
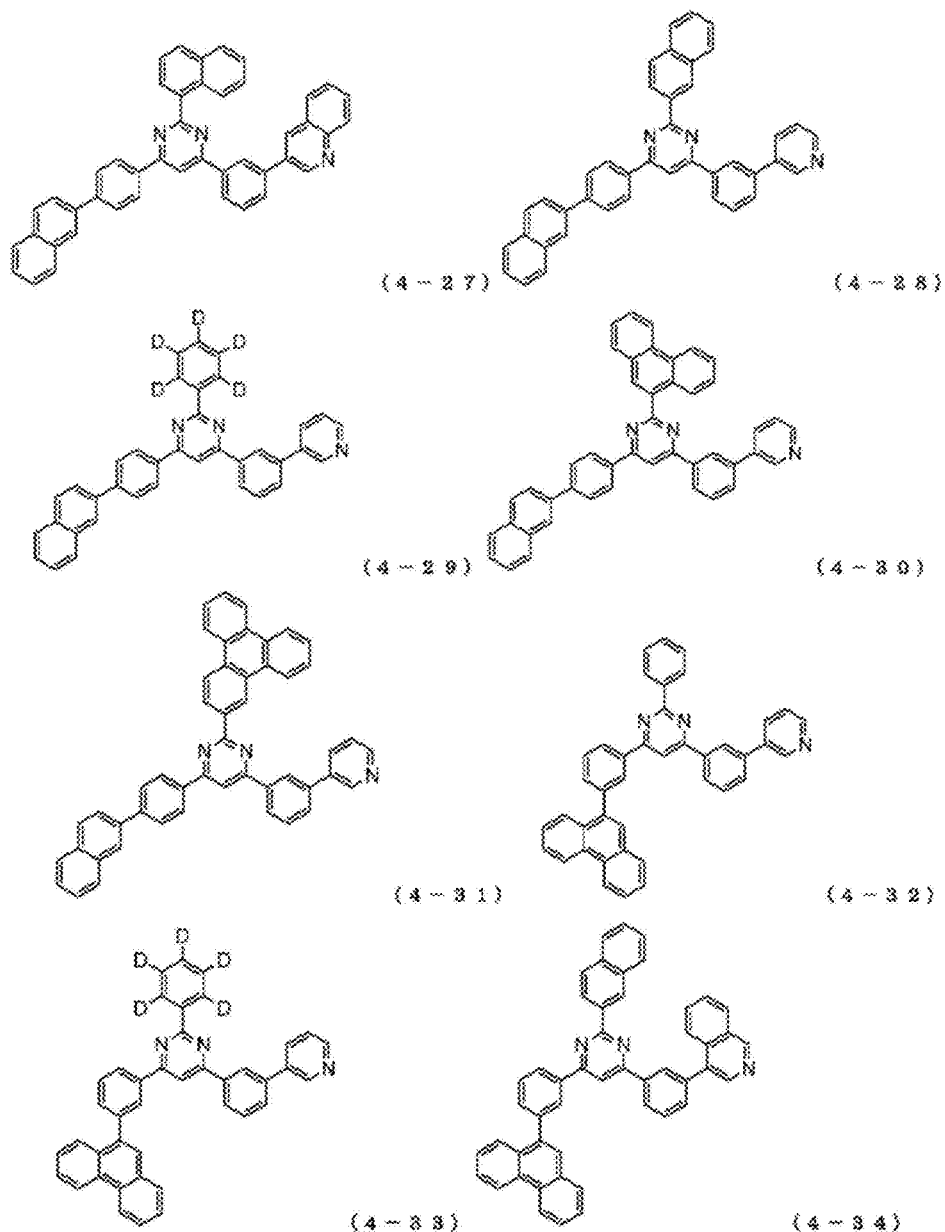
FIG. 14 is a diagram showing structural formulae of compounds 4-27 to 4-34 each corresponding to the pyrimidine derivative IV.
Figure 15:
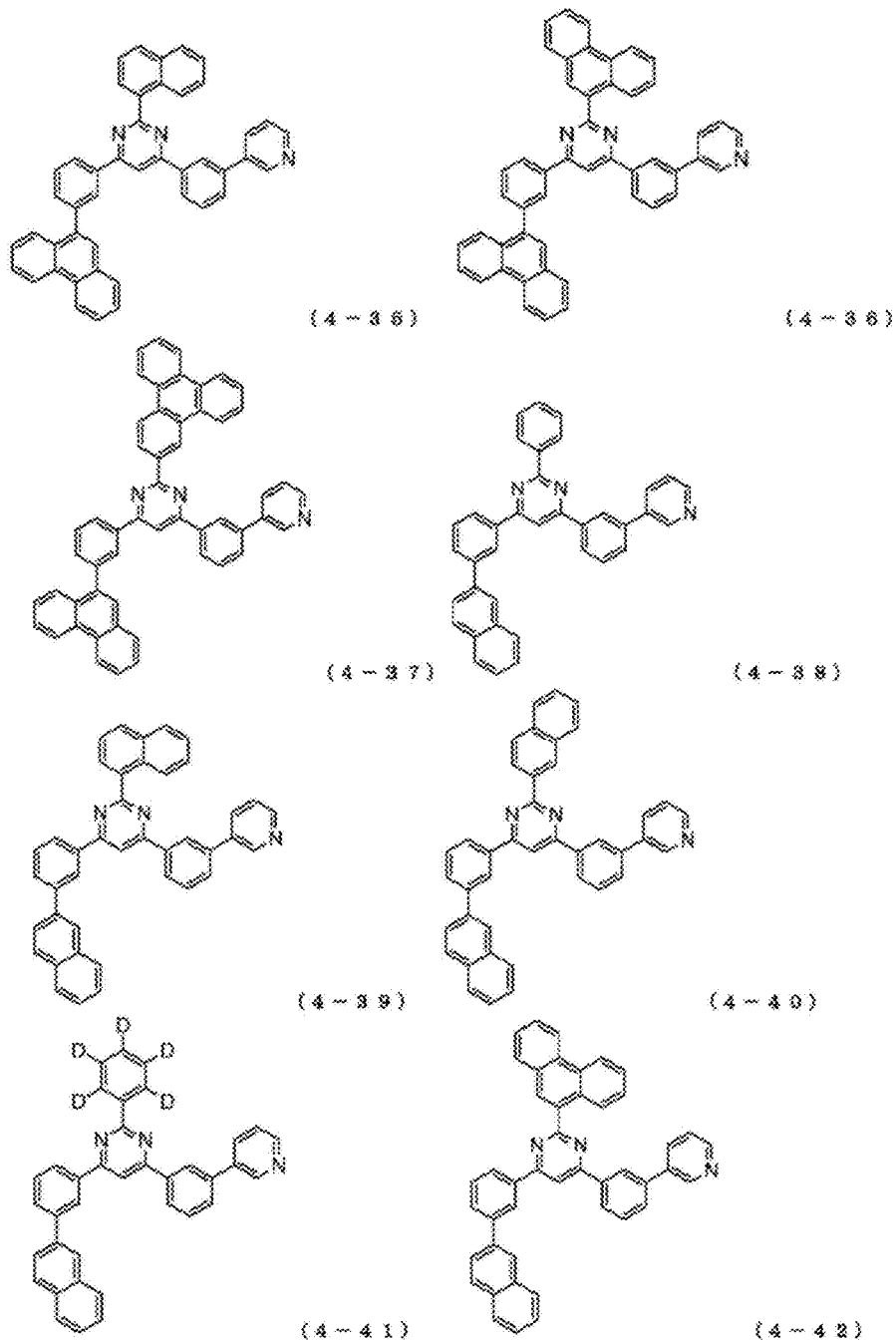
FIG. 15 is a diagram showing structural formulae of compounds 4-35 to 4-42 each corresponding to the pyrimidine derivative IV.
Figure 16:
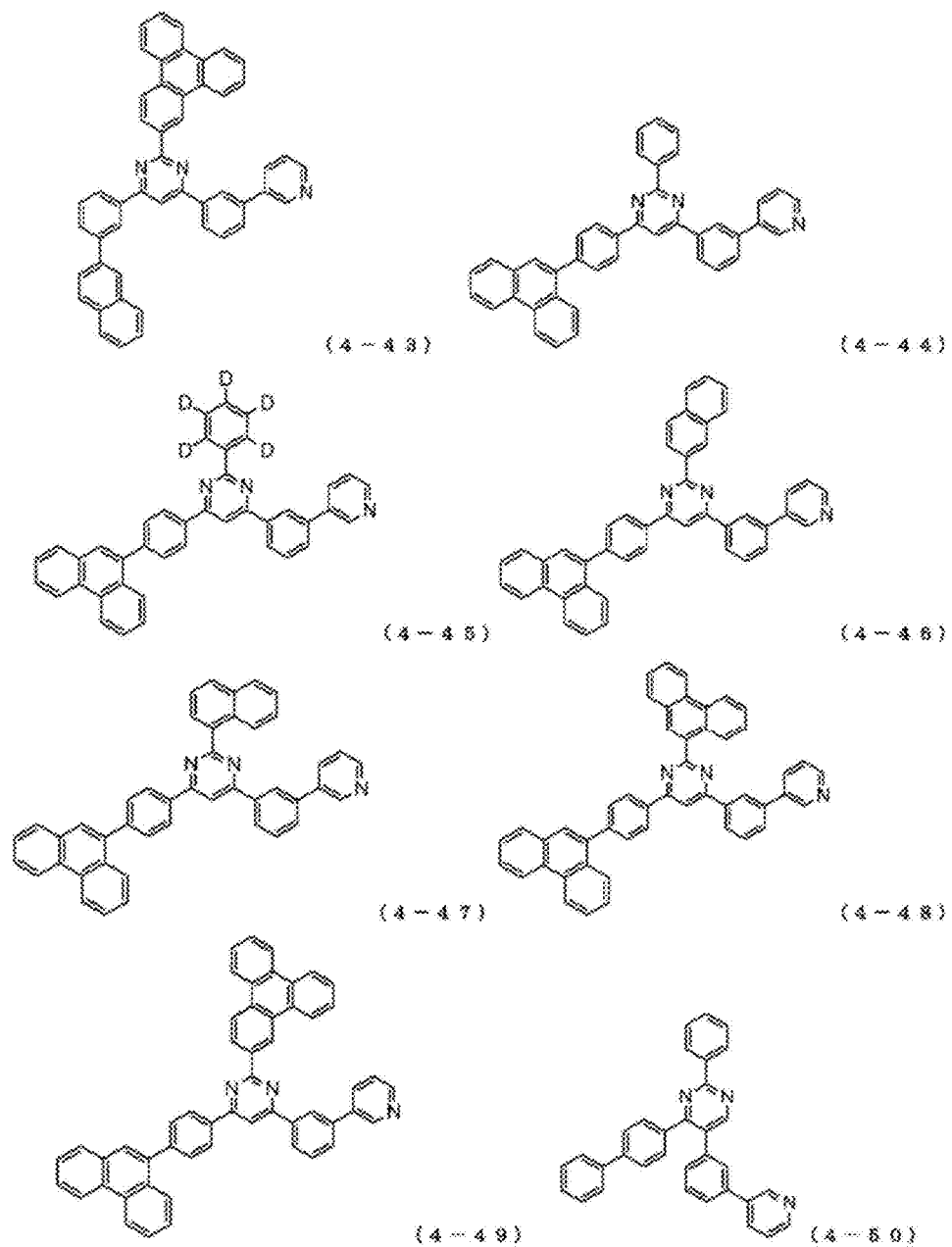
FIG. 16 is a diagram showing structural formulae of compounds 4-43 to 4-50 each corresponding to the pyrimidine derivative IV.
Figure 17:
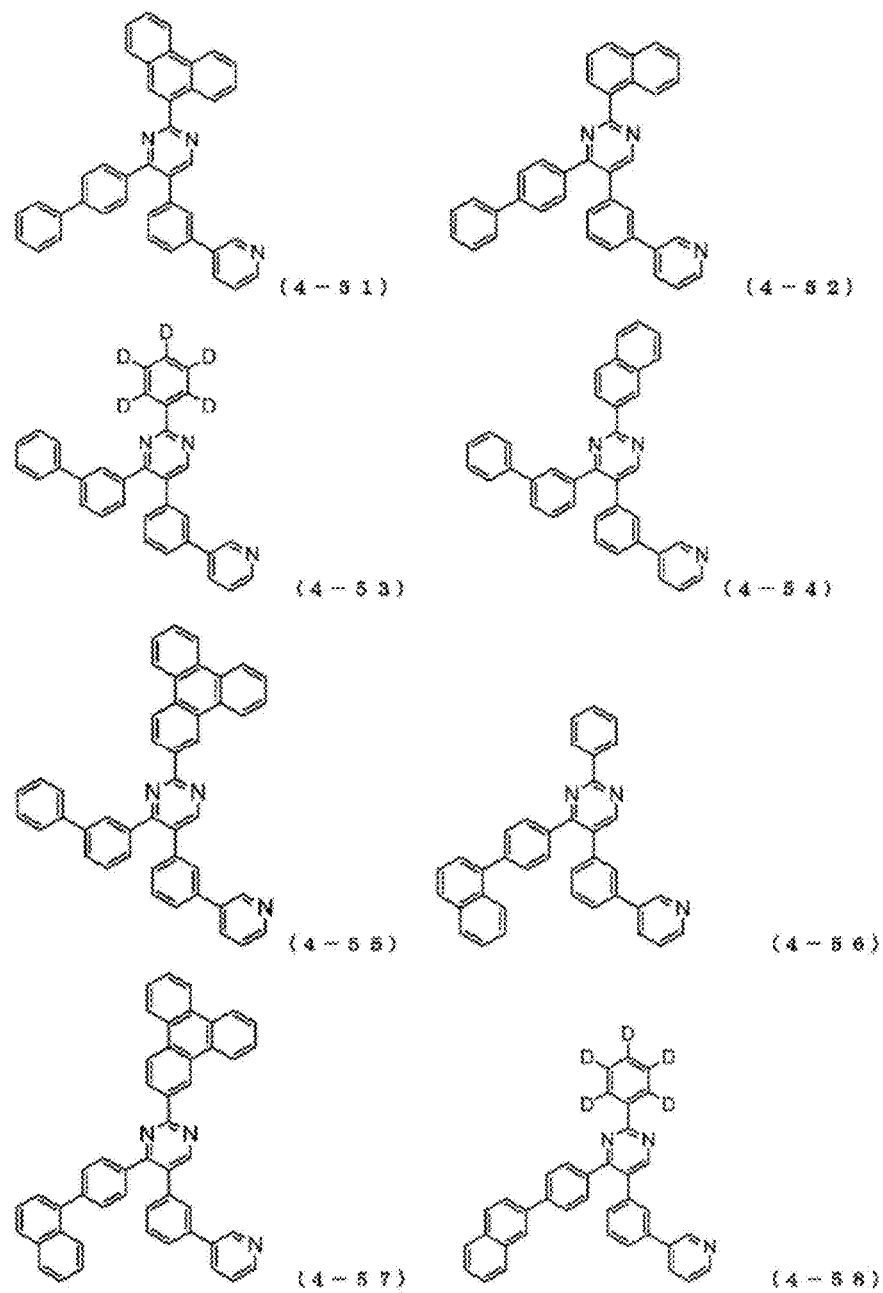
FIG. 17 is a diagram showing structural formulae of compounds 4-51 to 4-58 each corresponding to the pyrimidine derivative IV.
Figure 18:
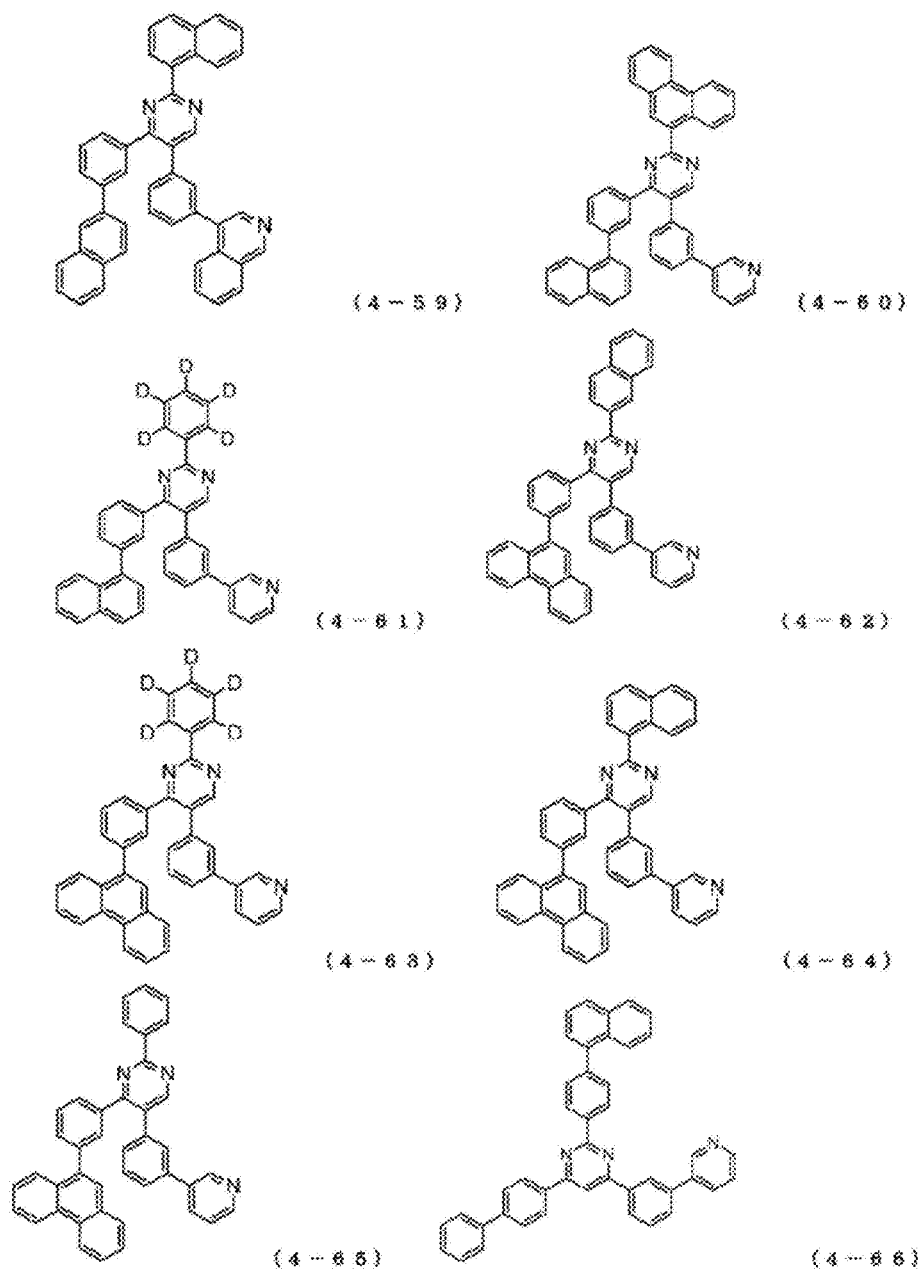
FIG. 18 is a diagram showing structural formulae of compounds 4-59 to 4-66 each corresponding to the pyrimidine derivative IV.
Figure 19:
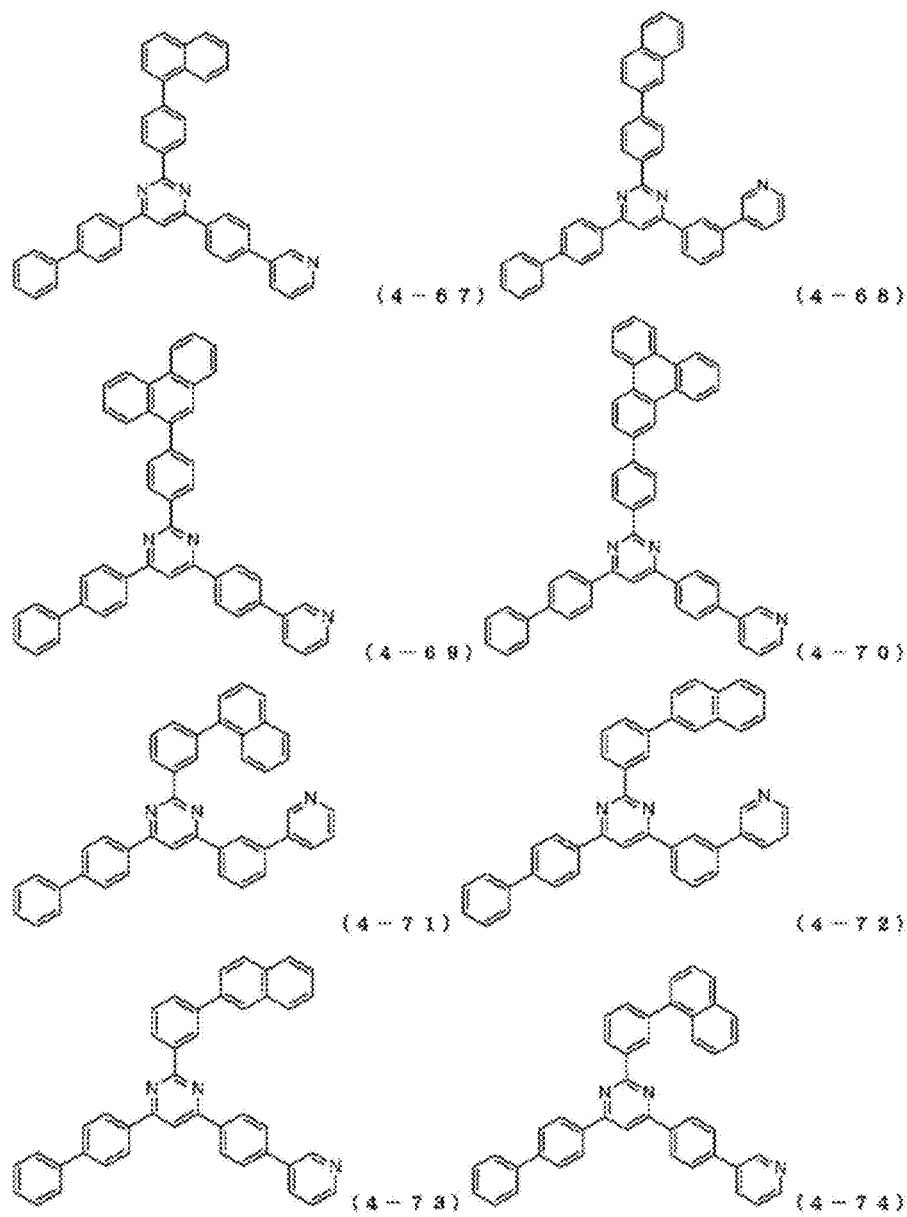
FIG. 19 is a diagram showing structural formulae of compounds 4-67 to 4-74 each corresponding to the pyrimidine derivative IV.
Figure 20:
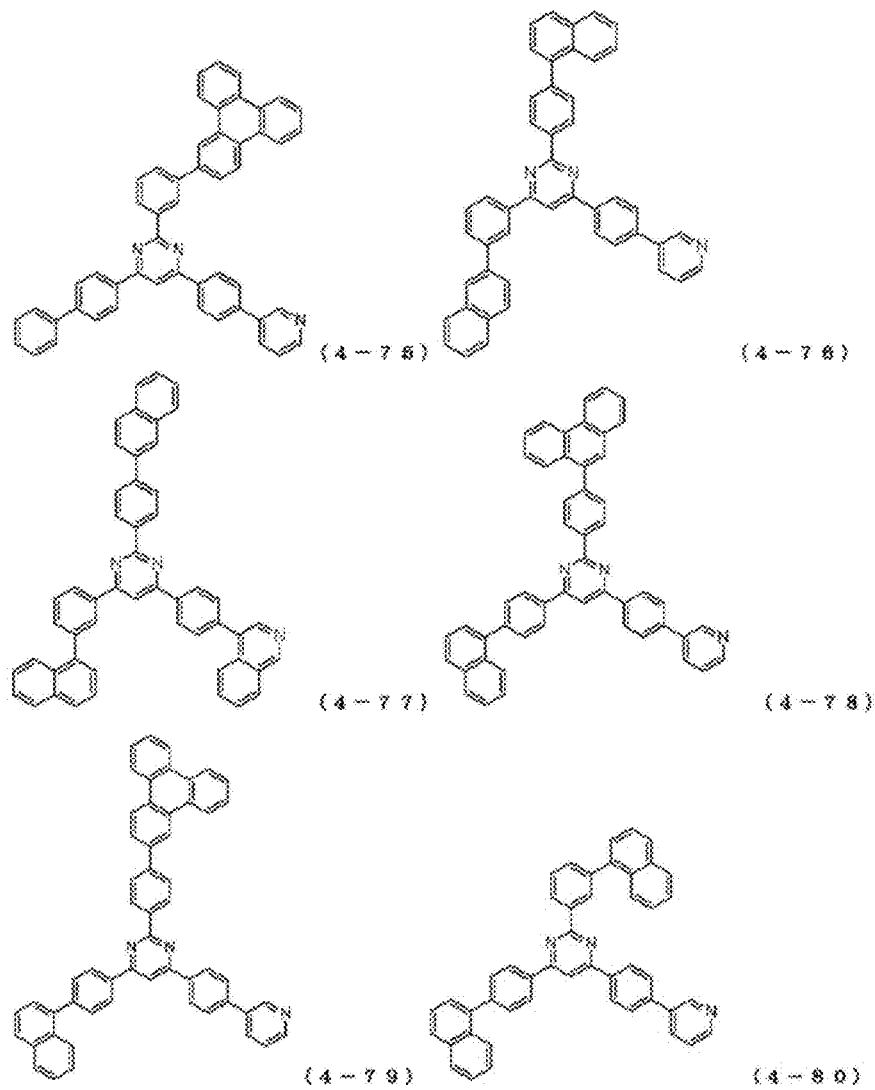
FIG. 20 is a diagram showing structural formulae of compounds 4-75 to 4-80 each corresponding to the pyrimidine derivative IV.
Figure 21:
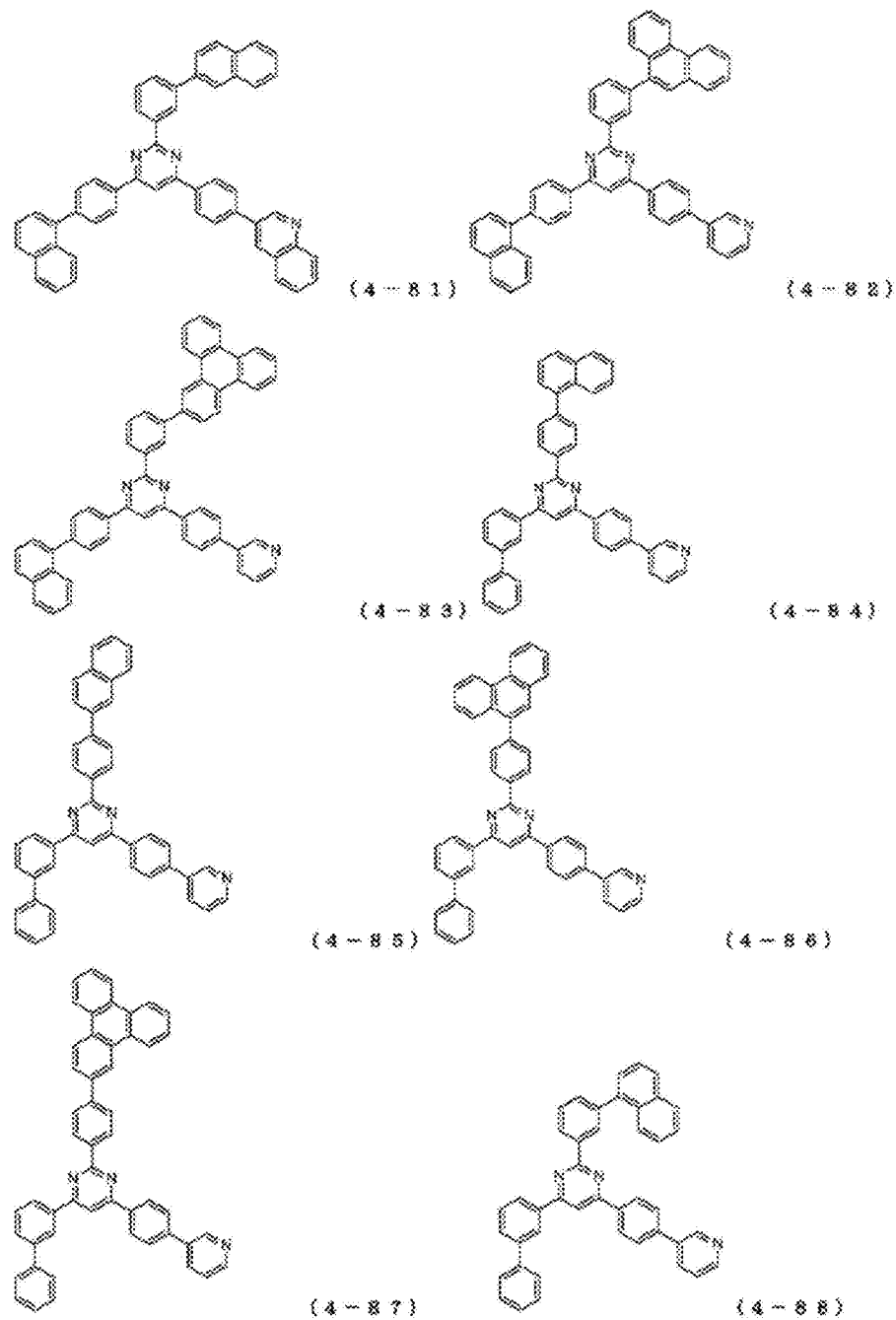
FIG. 21 is a diagram showing structural formulae of compounds 4-81 to 4-88 each corresponding to the pyrimidine derivative IV.
Figure 22:
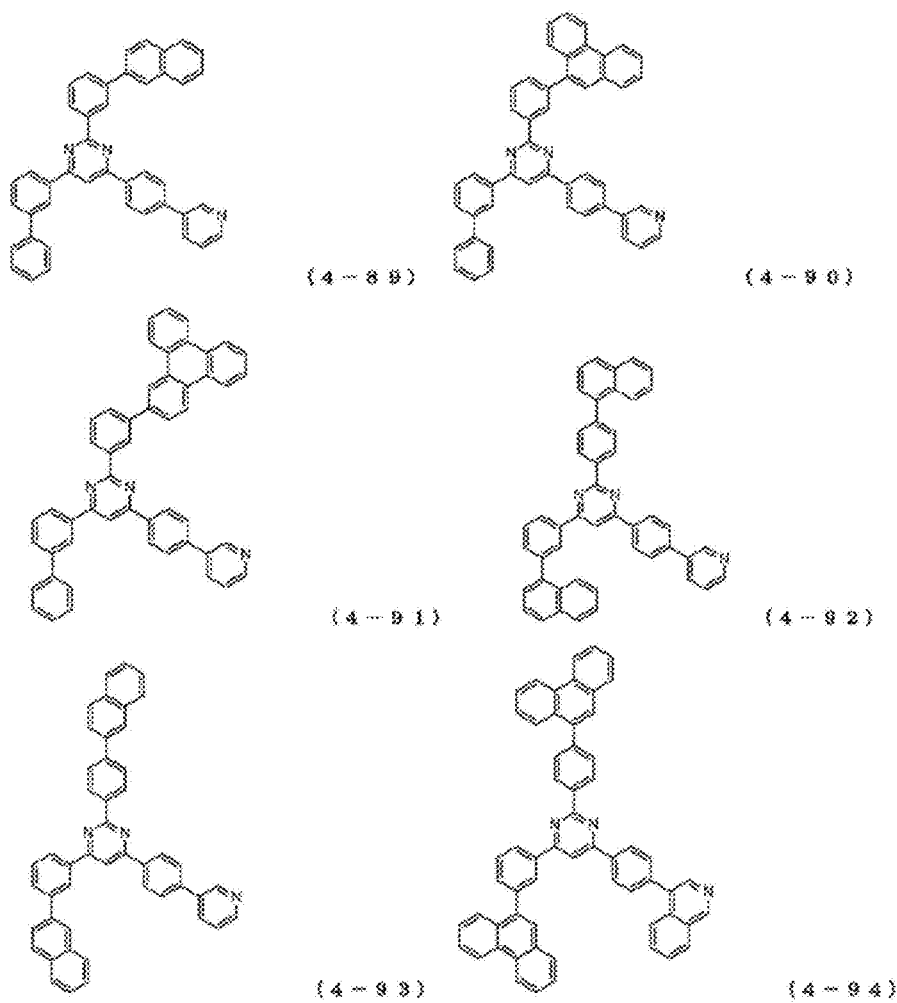
FIG. 22 is a diagram showing structural formulae of compounds 4-89 to 4-94 each corresponding to the pyrimidine derivative IV.
Figure 23:
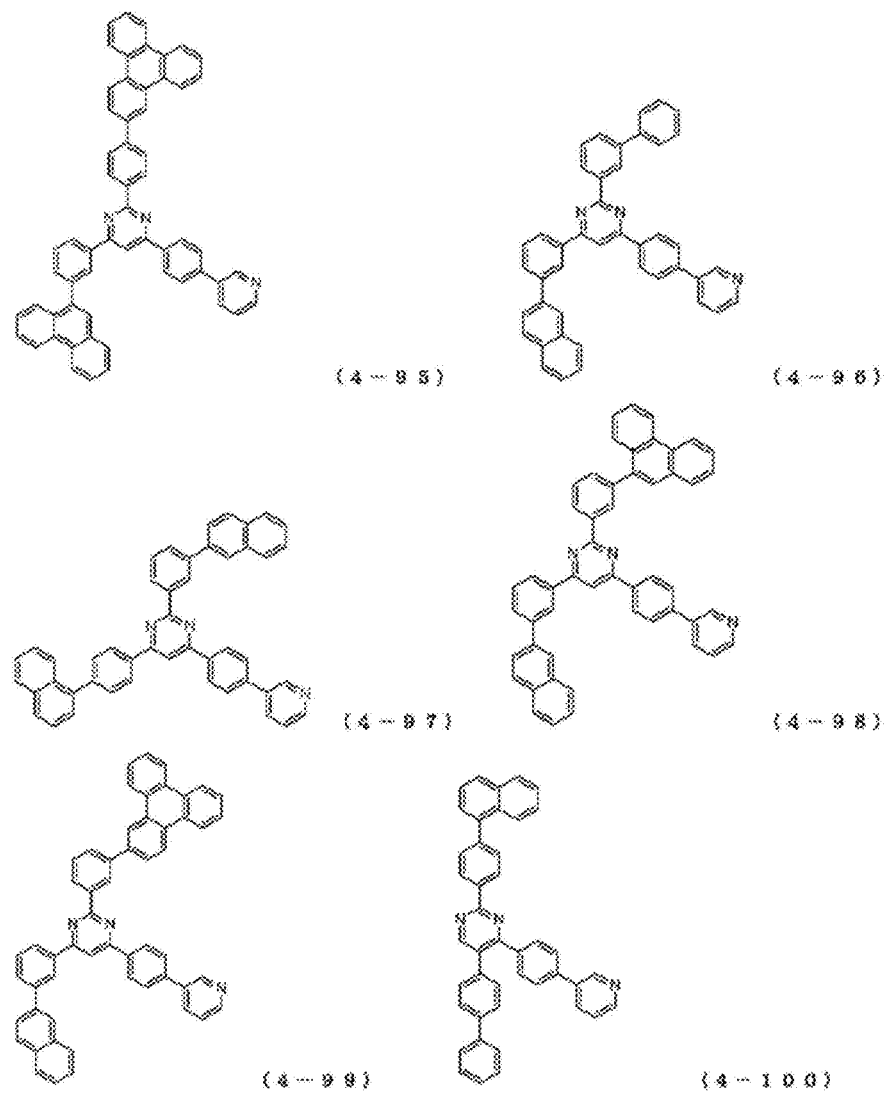
FIG. 23 is a diagram showing structural formulae of compounds 4-95 to 4-100 each corresponding to the pyrimidine derivative IV.
Figure 24:
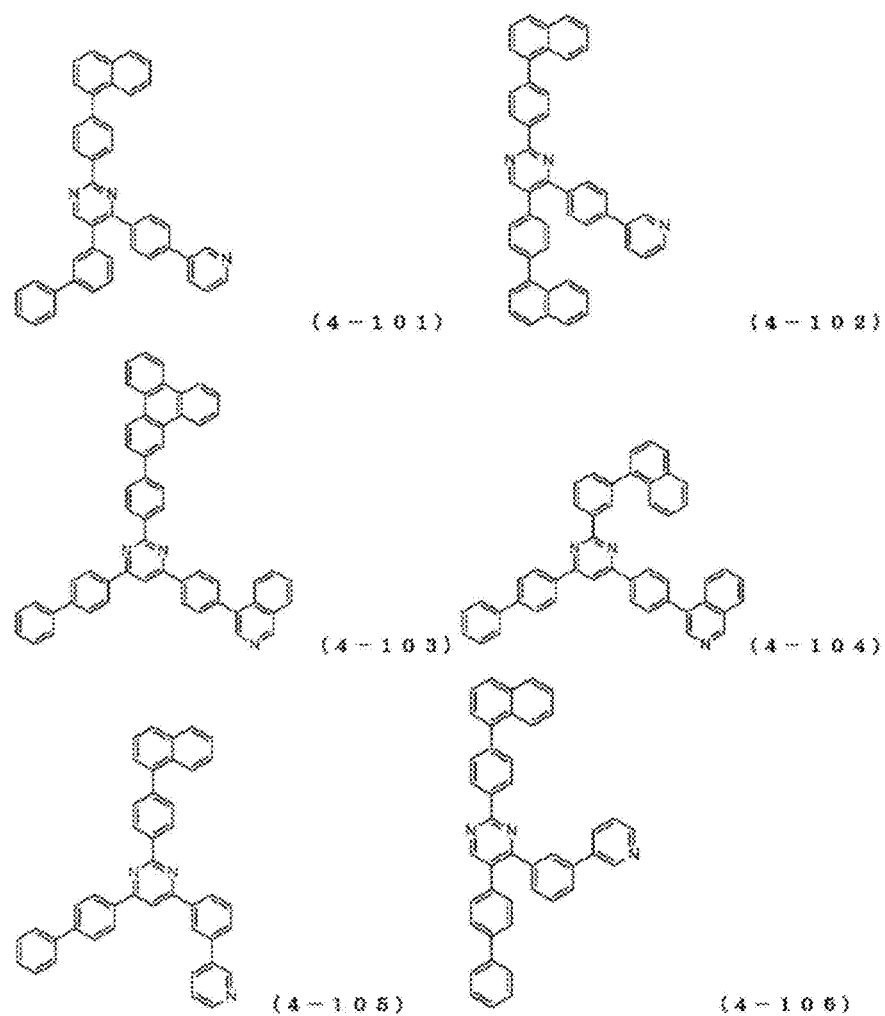
FIG. 24 is a diagram showing structural formulae of compounds 4-101 to 4-106 each corresponding to the pyrimidine derivative IV.
Figure 25:
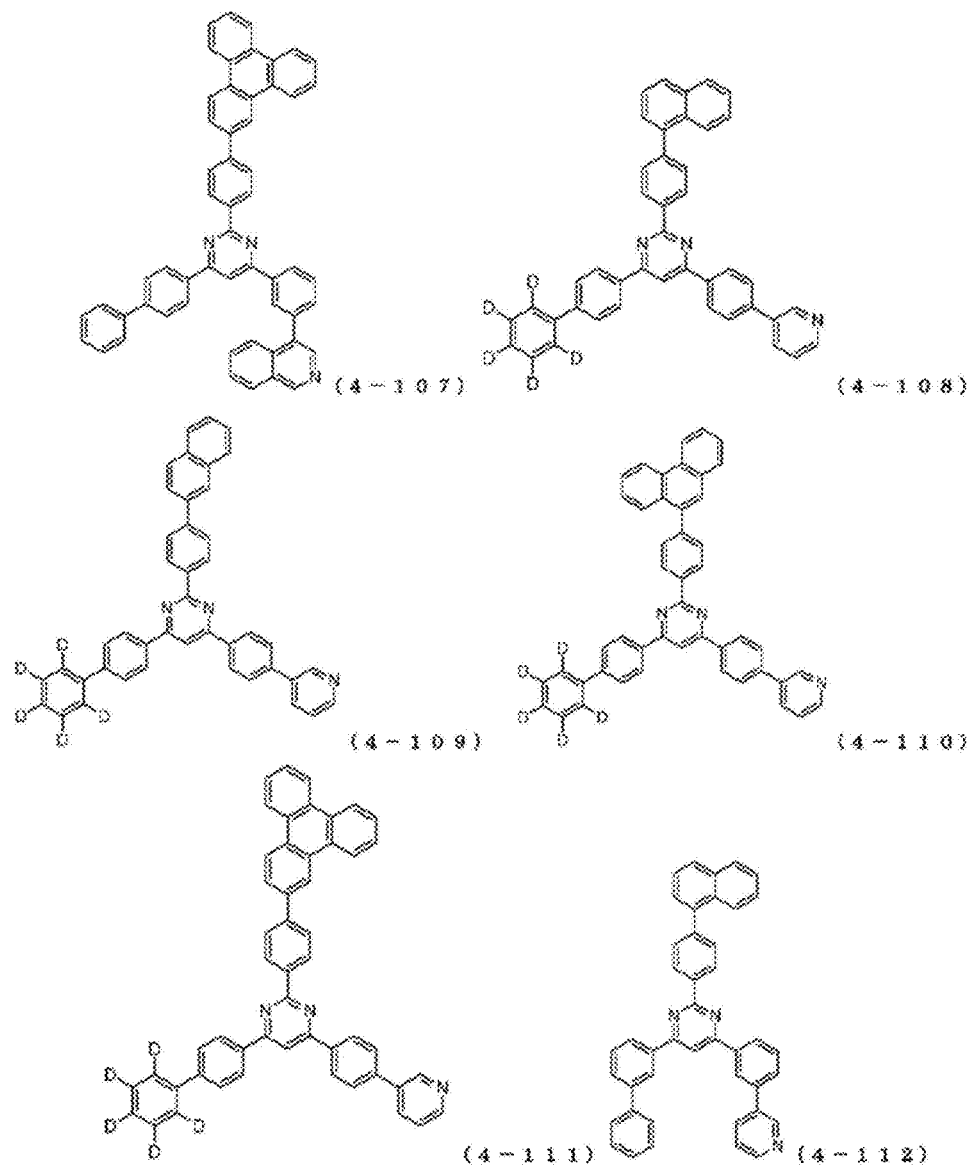
FIG. 25 is a diagram showing structural formulae of compounds 4-107 to 4-112 each corresponding to the pyrimidine derivative IV.
Figure 26:
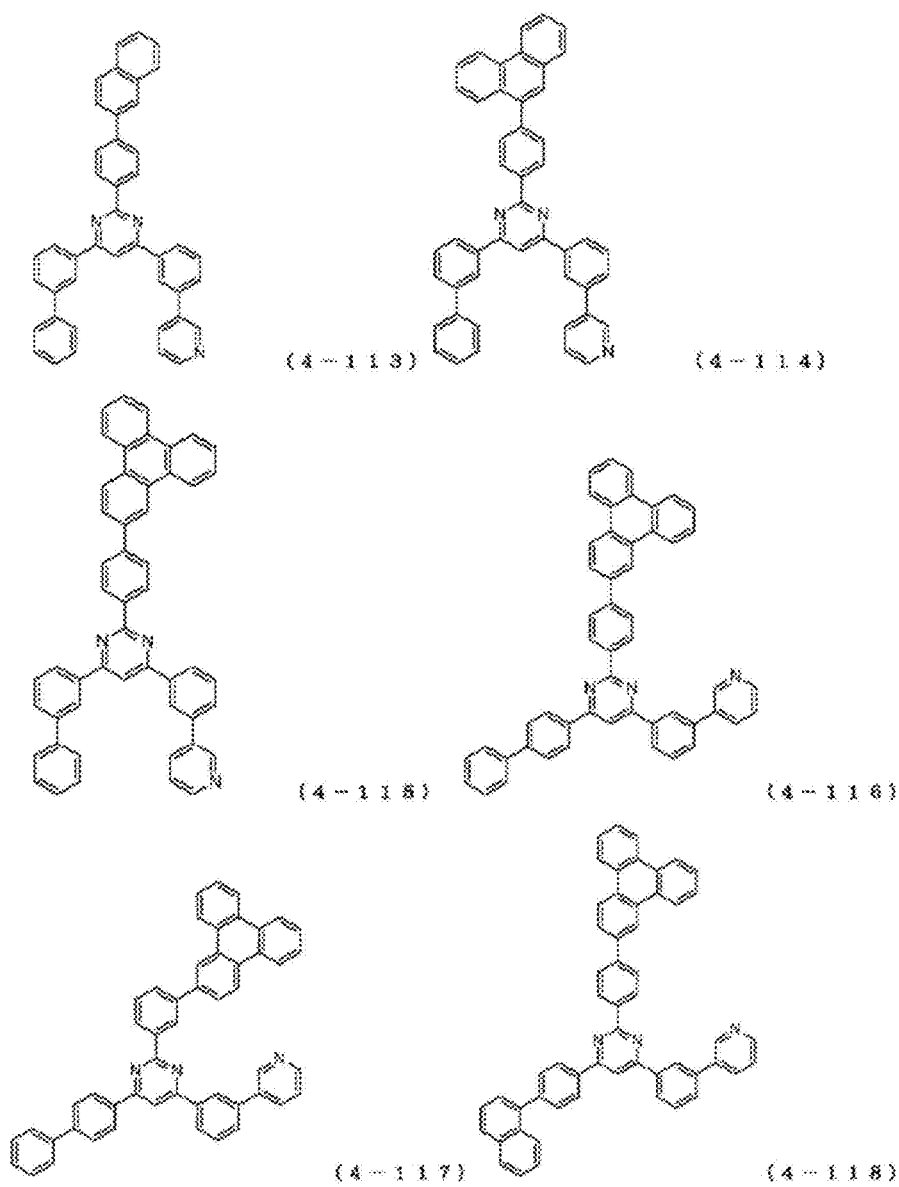
FIG. 26 is a diagram showing structural formulae of compounds 4-113 to 4-118 each corresponding to the pyrimidine derivative IV.
Figure 27:
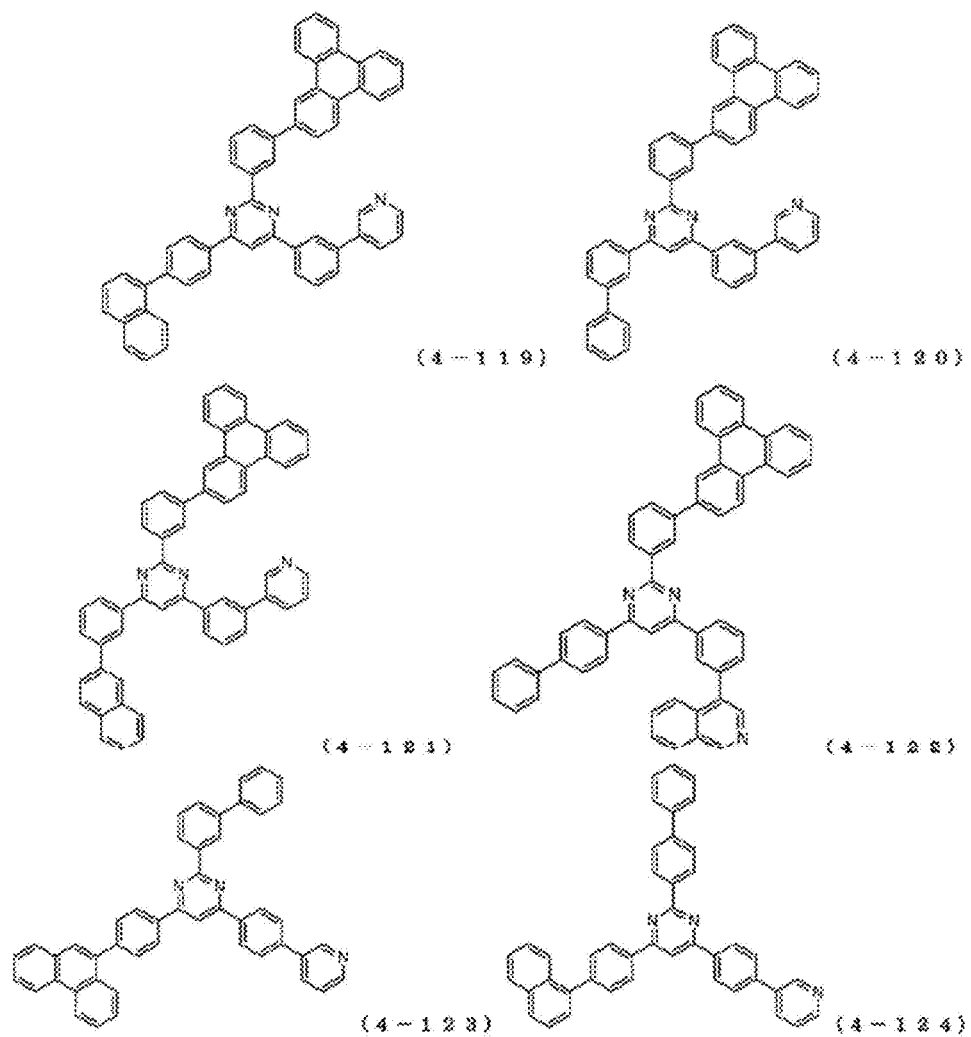
FIG. 27 is a diagram showing structural formulae of compounds 4-119 to 4-124 each corresponding to the pyrimidine derivative IV.
Figure 28:
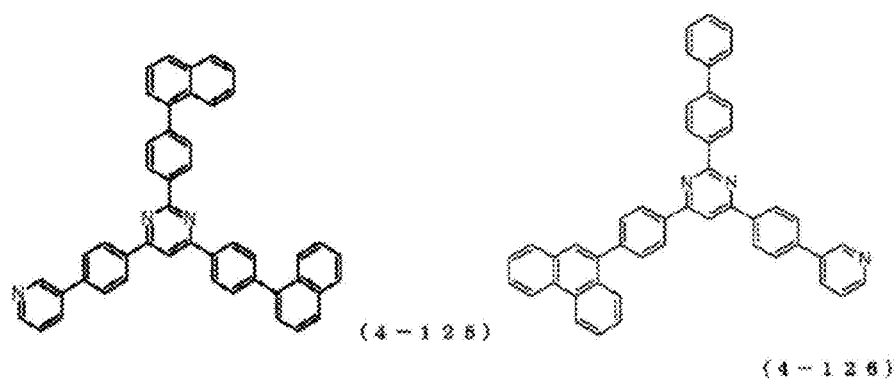
FIG. 28 is a diagram showing structural formulae of compounds 4-125 to 4-126 each corresponding to the pyrimidine derivative IV.

Further, for example, as in compounds 3-1 to 3-21 shown in FIG. 8 to FIG. 10, in a benzene ring to which $R^5$ to $R^7$ are bonded, to a vacancy caused by elimination of any one group of $R^5$ to $R^7$, another group of $R^5$ to $R^7$ may be bonded via a substituted or unsubstituted methylene group, an oxygen atom, a sulfur atom, or a monosubstituted amino group, thereby forming a ring.

The substitution group of the monosubstituted amino group that is one of linking groups is an alkyl group having 1 to 6 carbon atoms, a cycloalkyl group having 5 to 10 carbon atoms, an aromatic hydrocarbon group, an aromatic heterocyclic group, or a fused polycyclic aromatic group. Examples of these groups include the groups exemplified in the description of the monosubstituted amino group in $R^1$ to $R^4$. These groups of the monosubstituted amino group may be unsubstituted, but may have a different substitution group. Examples of the different substitution group include the groups exemplified as the different substitution group of the monosubstituted amino group in $R^1$ to $R^4$. Embodiments that can be adopted are also the same.

Examples of the alkyl group having 1 to 6 carbon atoms, the cycloalkyl group having 5 to 10 carbon atoms, the alkenyl group having 2 to 6 carbon atoms, the alkyloxy group having 1 to 6 carbon atoms, or the cycloalkyloxy group having 5 to 10 carbon atoms represented by $R^5$ to $R^7$ include the groups exemplified as the alkyl group having 1 to 6 carbon atoms, the cycloalkyl group having 5 to 10 carbon atoms, the alkenyl group having 2 to 6 carbon atoms, the alkyloxy group having 1 to 6 carbon atoms, and the cycloalkyloxy group having 5 to 10 carbon atoms represented by $R^1$ to $R^4$.

These groups represented by $R^5$ to $R^7$ may be unsubstituted, but may have a substitution group. Examples of the substitution group include the substitution groups exemplified in the description of the alkyl group having 1 to 6 carbon atoms, the cycloalkyl group having 5 to 10 carbon atoms, or the alkenyl group having 2 to 6 carbon atoms represented by $R^1$ to $R^4$. Embodiments that can be adopted by the substitution group are also the same.

Examples of the aromatic hydrocarbon group, the aromatic heterocyclic group, the fused polycyclic aromatic group, or the aryloxy group represented by $R^5$ to $R^7$ include the groups exemplified as the aromatic hydrocarbon group, the aromatic heterocyclic group, the fused polycyclic aromatic group, of the aryloxy group represented by $R^1$ to $R^4$.

These groups represented by $R^5$ to $R^7$ may be unsubstituted, but may have a substitution group. Examples of the substitution group include the substitution groups exemplified in the description of the aromatic hydrocarbon group, the aromatic heterocyclic group, or the fused polycyclic aromatic group represented by $R^1$ to $R^4$. Embodiments that can be adopted by the substitution group are also the same.

($R^8$, $R^9$)

$R^8$ and $R^9$ may be the same or differ, and each represent an alkyl group having 1 to 6 carbon atoms, a cycloalkyl group having 5 to 10 carbon atoms, an alkenyl group having 2 to 6 carbon atoms, an aromatic hydrocarbon group, an aromatic heterocyclic group, a fused polycyclic aromatic group, or an aryloxy group. The alkyl group having 1 to 6 carbon atoms and the alkenyl group having 2 to 6 carbon atoms may be linear or branched.

$R^8$ and $R^9$ do not necessarily need to be independently present and form a ring, but may be bonded to each other via a single bond, a substituted or unsubstituted methylene group, an oxygen atom, a sulfur atom, or a monosubstituted amino group to form a ring.

The substitution group of the monosubstituted amino group that is one of linking groups is an alkyl group having 1 to 6 carbon atoms, a cycloalkyl group having 5 to 10 carbon atoms, an aromatic hydrocarbon group, an aromatic heterocyclic group, or a fused polycyclic aromatic group Examples of these groups include the groups exemplified in the description of the monosubstituted amino group in $R^1$ to $R^4$. These groups of the monosubstituted amino group may be unsubstituted, but may have a different substitution group. Examples of the different substitution group include the groups exemplified as the different substitution group of the monosubstituted amino group in $R^1$ to $R^4$. Embodiments that can be adopted are also the same.

Examples of the alkyl group having 1 to 6 carbon atoms, the cycloalkyl group having 5 to 10 carbon atoms, or the alkenyl group having 2 to 6 carbon atoms represented by $R^8$ and $R^9$ include the groups exemplified as the alkyl group having 1 to 6 carbon atoms, the cycloalkyl group having 5 to 10 carbon atoms, or the alkenyl group having 2 to 6 carbon atoms represented by $R^1$ to $R^4$.

These groups represented by $R^8$ and $R^9$ may be unsubstituted, but may have a substitution group. Examples of the substitution group include the substitution groups exemplified in the description of the alkyl group having 1 to 6 carbon atoms, the cycloalkyl group having 5 to 10 carbon atoms, or the alkenyl group having 2 to 6 carbon atoms represented by $R^1$ to $R^4$. Embodiments that can be adopted by the substitution group are also the same.

Examples of the aromatic hydrocarbon group, the aromatic heterocyclic group, or the fused polycyclic aromatic group represented by $R^8$ and $R^9$ include the groups exemplified as the aromatic hydrocarbon group, the aromatic heterocyclic group, or the fused polycyclic aromatic group represented by $R^1$ to $R^4$.

These groups represented by $R^8$ and $R^9$ may be unsubstituted, but may have a substitution group. Examples of the substitution group include the substitution groups exemplified in the description of the aromatic hydrocarbon group, the aromatic heterocyclic group, or the fused polycyclic aromatic group represented by $Ar^1$ to $Ar^5$ in the general formula (1). Embodiments that can be adopted by the substitution group are also the same.

Examples of the aryloxy group represented by $R^8$ and $R^9$ include the groups exemplified as the aryloxy group represented by $R^1$ to $R^4$.

The aryloxy group represented by $R^8$ and $R^9$ may be unsubstituted, but may have a substitution group. Examples of the substitution group include the substitution groups exemplified in the description of the aromatic hydrocarbon group, the aromatic heterocyclic group, or the fused polycyclic aromatic group represented by $R^1$ to $R^4$. Embodiments that can be adopted by the substitution group are also the same.

Favorable Embodiment

Hereinafter, a favorable embodiment of the amine derivative III will be described. However, in the description of the favorable embodiment, the groups to which substituted/unsubstituted are not designated may have a substitution group or may be unsubstituted.

$A^1$ is favorably a divalent aromatic hydrocarbon group or a single bond, more favorably a divalent group obtained by removing two hydrogen atoms from benzene, biphenyl, or naphthalene, or a single bond, and more favorably a single bond.

$Ar^{12}$ and $Ar^{13}$ may be the same or differ, and are each favorably a phenyl group, a biphenylyl group, a naphthyl group, a fluorenyl group, an indenyl group, a pyridyl group, a dibenzofuranyl group, a pyri dobenzofuranyl group.

It is favorable that at least one of $R^1$ to $R^4$ is a di-substituted amino group. In this case, the substitution group of the di-substituted amino group is favorably a phenyl group, a biphenylyl group, a naphthyl group, a fluorenyl group, an indenyl group, a pyridyl group, a dibenzofuranyl group, or a pyridobenzofuranyl group.

Regarding $R^1$ to $R^4$, for example, as in the following general formulae (3c-a) and (3c-b), an embodiment in which adjacent two or all groups are vinyl groups and the adjacent two vinyl groups are bonded to each other via a single bond to form a fused ring, i.e., an embodiment in which $R^1$ to $R^4$ form a naphthalene ring or a phenanthrene ring with a benzene ring to which $R^1$ to $R^4$ are bonded is also favorable.

For example, as in the following general formulae (3b-a), (3b-b), (3b-c), and (3b-d), an embodiment in which any one of $R^1$ to $R^4$ is an aromatic hydrocarbon group and such an aromatic hydrocarbon group is bonded, via a substituted or unsubstituted methylene group, an oxygen atom, or a sulfur atom, to a vacancy caused by elimination of a group ($R^1$ to $R^4$) adjacent to the aromatic hydrocarbon group from a benzene ring to form a ring is also favorable. In this case, the aromatic hydrocarbon group is favorably a phenyl group. The ring formed with the benzene ring is favorably a dibenzofuran ring or a dibenzothiophene ring.

For example, as in the following general formulae (3a-a), (3a-b), (3b-a), (3b-b), (3b-c), (3b-d), (3c-a), and (3c-b), an embodiment in which any one of $R^5$ to $R^7$ is an aromatic hydrocarbon group and such an aromatic hydrocarbon group is bonded, via a substituted or unsubstituted methylene group, an oxygen atom, or a sulfur atom, to a vacancy caused by elimination of a group ($R^5$ to $R^7$) adjacent to the aromatic hydrocarbon group from a benzene ring to form a ring is also favorable. In this case, the aromatic hydrocarbon group is favorably a phenyl group. The ring formed with the benzene ring is favorably a dibenzofuran ring or a dibenzothiophene ring.

As the embodiment in which $R^1$ to $R^7$ are bonded to each other to form a ring or the embodiment in which any one of $R^1$ to $R^7$ is eliminated from the benzene ring to cause a vacancy and the adjacent group (another group of $R^1$ to $R^7$) is bonded to such a vacancy to form a ring in the amine derivative III as described above, the embodiment represented by the following general formula (3a-a) or (3a-b) is favorable Examples of such a favorable embodiment include the following general formulae (3b-a), (3b-b), (3b-c), (3b-d), (3c-a), and (3c-b).

[Chem. 10]

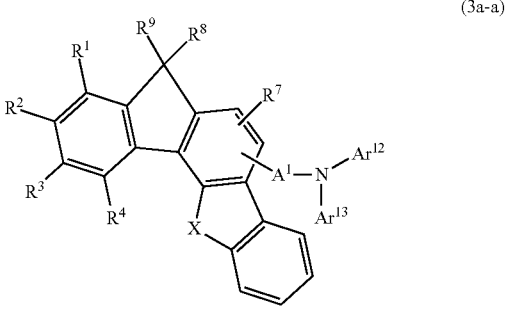

(3a-a)

(3a-b)
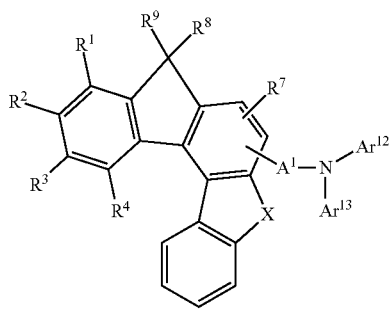

(3b-a)
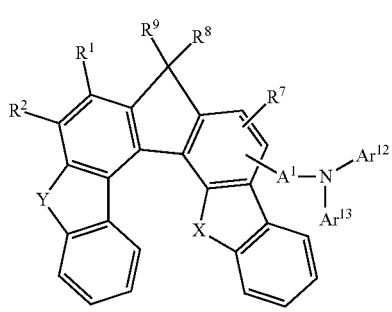

(3b-b)
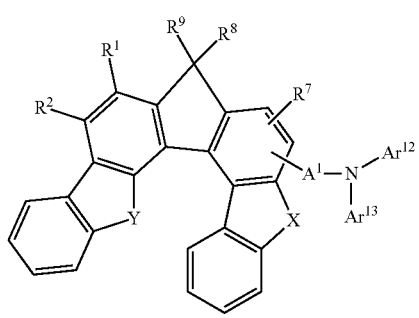

(3b-c)
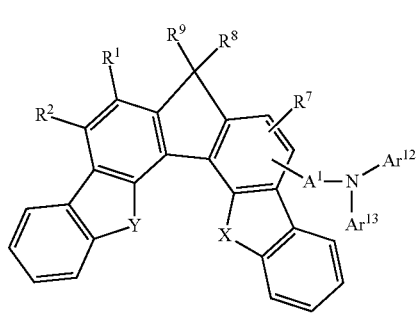

(3b-d)
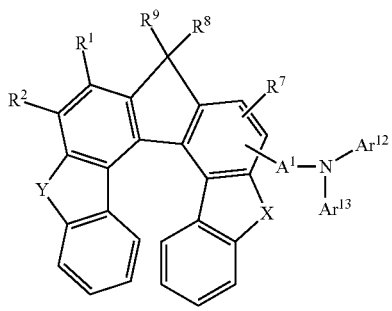

(3c-a)
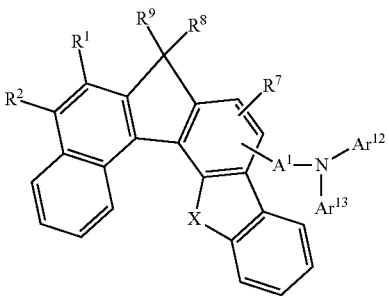

(3c-b)
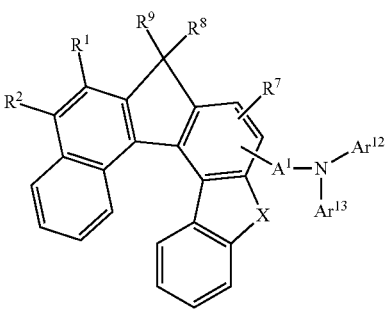

In the formula, X and Y may be the same or differ, and each represent an oxygen atom or a sulfur atom. $A^1$, $Ar^{12}$, $Ar^{13}$, $R^1$ to $R^4$, and $R^7$ to $R^9$ each have the meaning as described in the general formula (3).

In the general formulae (3a-a) and (3a-b), to a vacancy caused by elimination of $R^5$ or $R^6$ in the general formula (3), the adjacent $R^6$ or $R^5$ (phenyl group) is bonded via a linking group X, thereby forming a fused ring.

In addition, in the general formulae (3b-a) to (3b-d), to a vacancy caused by elimination of $R^3$ or $R^4$, the adjacent $R^4$ or $R^3$ (phenyl group) is bonded via a linking group Y, thereby forming a fused ring.

In addition, in the general formulae (3c-a) and (3c-b), $R^3$ and $R^4$ are each a vinyl group and bonded to each other via a single bond to form a fused ring.

Regarding $R^1$ to $R^7$, the most favorable embodiment is an embodiment in which $R^1$ to $R^4$ are not independently present and do not form a ring and $R^5$ to $R^7$ are bonded to each other to form a ring, or any one of $R^5$ to $R^7$ is eliminated from a benzene ring to cause a vacancy and the adjacent group (another group of $R^5$ to $R^7$) is bonded to such a vacancy to form a ring.

$R^8$ and $R^9$ may be the same or differ, and are each favorably an aromatic hydrocarbon group, an aromatic heterocyclic group, or a fused polycyclic aromatic group, more favorably a phenyl group, a naphthyl group, a phenanthrenyl group, a pyridyl group, a quinolyl group, an isoquinolyl group, or a dibenzofuranyl group, and particularly favorably a phenyl group.

Further, an embodiment in which $R^8$ and $R^9$ are bonded to each other via a single bond, a substituted or unsubstituted methylene group, an oxygen atom, a sulfur atom, or a monosubstituted amino group to form a ring is favorable, and an embodiment in which $R^8$ and $R^9$ are bonded to each other via a single bond to form a ring is more favorable.

As the embodiment in which $R^8$ and $R^9$ are bonded to each other to form a ring, the embodiment represented by the following general formula (3a-a1) or (3a-b1) is favorable. Examples of such an embodiment includes the embodiment represented by the following general formulae (3b-a1), (3b-b1), (3b-c1), (3b-d1), (3c-a1), and (3c-b1).
[Chem. 11]
(3a-a1)
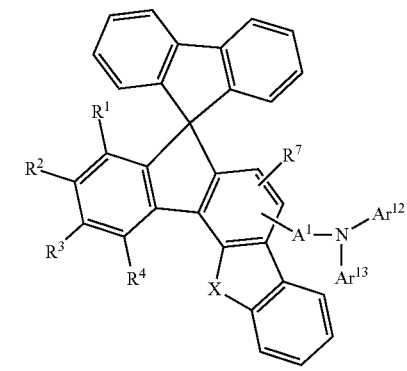
(3a-b1)
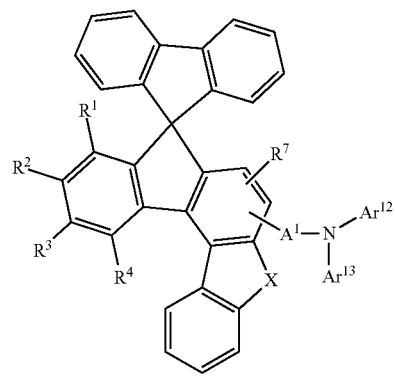
(3b-a1)
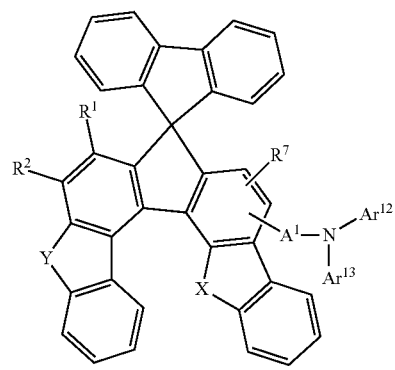
(3b-b1)
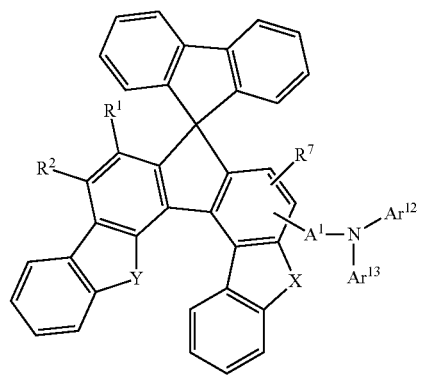
(3b-c1)
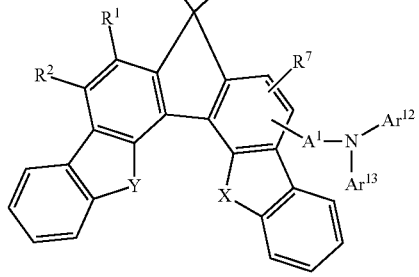
(3b-d1)
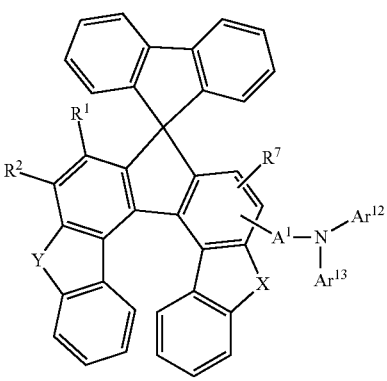
(3c-a1)
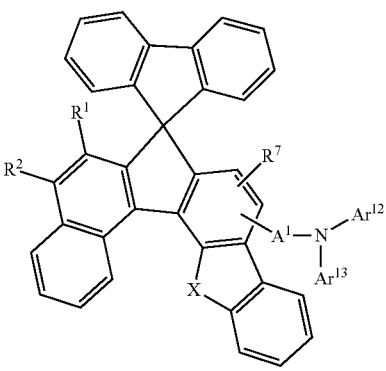
(3c-b1)
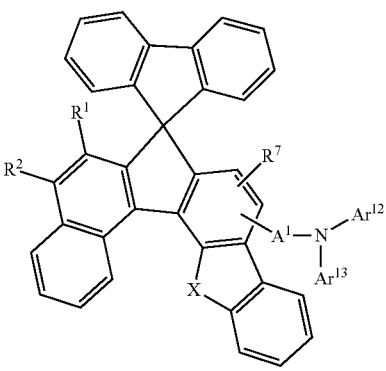
In the formula, X and Y may be the same or differ, and each represent an oxygen atom or a sulfur atom $A^1$, $Ar^{12}$, $Ar''$, $R^1$ to $R^4$ and R each have the meaning as described in the general formula (3).

The general formulae (3a-a1), (3a-b1), (3b-a1), (3b-b1), (3b-c1), (3b-d1), (3c-a1), and (3c-b1) respectively have structures in which $R^8$ and $R^9$ (any of which is a phenyl group) are bonded to each other via a single bond to form a fused ring in the general formulae (3a-a), (3a-b), (3b-a), (3b-b), (3b-c), (3b-d), (3c-a), and (3c-b).

Although favorable specific examples of the amine derivative III are shown in FIG. 8 to FIG. 10, the amine derivative III is not limited to these specific examples. Among the compounds shown as specific examples, compounds corresponding to the general formulae (3a-a) and (3a-b) are as follows.

3a-a:3-1 to 3-3, 3-5 to 3-9, 3-12 to 3-14, and 3-16 to 3-19
3a-b:3-4 and 3-15

Among them, those corresponding to the general formulae (3b-a), (3b-b), (3b-c), (3b-d), (3c-a) and (3c-b) are as follows.

3b-c:3-9, 3-19
3c-a:3-2, 3-3, 3-7, 3-13, 3-14, and 3-17

Further, compounds corresponding to the general formulae (3a-a1) and (3a-b1) are as follows.

3a-a1:3-1 to 3-3, and 3-7 to 3-9
3a-b1:3-4

Among them, compounds corresponding to the general formulae (3b-a1), (3b-b1), (3b-c1), (3b-d1), (3c-a1), and (3c-b1) are as follows.

3b-c1:3-9
3c-a1:3-2, 3-3, and 3-7

The amine derivative III itself can be synthesized according to a well-known method (see, for example, Patent Document 7).

Further, in the light-emitting layer, a phosphorescent emitter can be used as a light-emitting material. As the phosphorescent emitter, a phosphorescent emitter of a metal complex of iridium, platinum, or the like can be used. Specifically, a green phosphorescent emitter such as Ir(ppy)$_3$; a blue phosphorescent emitter such as FIrpic and FIr6; a red phosphorescent emitter such as Btp$_2$Ir (acac), and the like can be used.

In this case, as a host material, for example, the following hole injection/transport host material can be used.

Carbazole derivatives such as 4,4'-di(N-carbazolyl) biphenyl (CBP), TCTA, and mCP.

Further, for example, the following electron transport host material can be used.

P-bis(triphenylsilyl) benzene (UGH2), and
2,2',2''-(1,3,5-phenylene)-tris(1-phenyl-1H-benzimidazole) (TPBI).

By using such a host material, it is possible to prepare an organic EL element with high performance.

In order to avoid concentration quenching, it is favorable to dope a host material with a phosphorescent emitter by co-vapor deposition in the range of 1 to 30 percent by weight with respect to the entire light-emitting layer.

As the light-emitting material, a material that emits delayed fluorescence, such as CDCB derivatives including PIC-TRZ, CC2TA, PXZ-TRZ, and 4CzIPN, can also be used.

<Hole Blocking Layer>

On the light-emitting layer 5, a hole blocking layer (not shown) can be provided. For the hole blocking layer, a well-known compound having a hole blocking operation can be used. For example, phenanthroline derivatives such as bathocuproine (BCP); metal complexes of a quinolinol derivative such as aluminum fill) bis(2-methyl-8-quinolinato)-4-phenylphenolate (BAlq); various rare earth complexes; triazole derivatives; triazine derivative; and oxadiazole derivatives; can be used. These materials may serve also as a material of the electron transport layer.

<Electron Transport Layer 6>

For the electron transport layer 6, it is favorable to use the pyrimidine derivative IV represented by the following general formula (4).

Pyrimidine Derivative IV;

[Chem. 12]

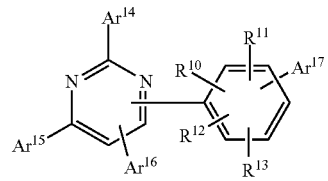

(4)

The pyrimidine derivative IV has, for example, the following two embodiments.

[Chem. 13]

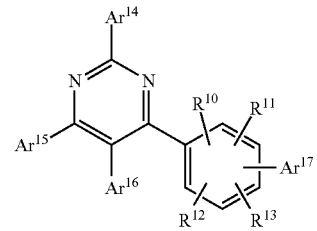

(4a)

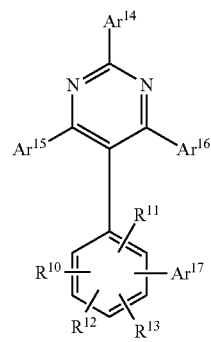

(4b)

In the general formula (4a), $Ar^{16}$ is located adjacent to $Ar^{15}$. In the general formula (4b), a benzene ring to which $R^{10}$ to $R^{13}$ and $Ar^{17}$ are bonded is located adjacent to $Ar^{15}$.

($Ar^{14}$)

$Ar^{14}$ represents an aromatic hydrocarbon group or a fused polycyclic aromatic group.

Specific examples of the aromatic hydrocarbon group or the fused polycyclic aromatic group represented by $Ar^{14}$ include a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, an indenyl group, a pyrenyl group, a perylenyl group, a fluoranthenyl group, and a triphenylenyl group.

These groups represented by $Ar^{14}$ may be unsubstituted, but may have a substitution group Examples of the substitution group include the substitution groups exemplified in the description of the aromatic hydrocarbon group, the aromatic heterocyclic group, or the fused polycyclic aromatic group represented by $Ar^1$ to $Ar^5$ in the general formula (1). Embodiments that can be adopted by the substitution group are also the same.

($Ar^{15}$, $Ar^{16}$)

$Ar^{15}$ and $Ar^{16}$ may be the same or differ, and each represent a hydrogen atom, an aromatic hydrocarbon group, or a fused polycyclic aromatic group. Note that $Ar^{15}$ and $Ar^{16}$ are not simultaneously hydrogen atoms.

Examples of the aromatic hydrocarbon group or the fused polycyclic aromatic group represented by $Ar^{15}$ and $Ar^{16}$ include the groups exemplified as $Ar^{14}$.

These groups represented by $Ar^{15}$ and $Ar^{16}$ may be unsubstituted, but may have a substitution group. Examples of the substitution group include the substitution groups exemplified in the description of the aromatic hydrocarbon group, the aromatic heterocyclic group, or the fused polycyclic aromatic group represented by $Ar^1$ to $Ar^5$ in the general formula (1). Embodiments that can be adopted by the substitution group are also the same.

($Ar^{17}$)

$Ar^{17}$ represents an aromatic heterocyclic group. Specific examples of the aromatic heterocyclic group represented by $Ar^{17}$ include a triazinyl group, a pyridyl group, a pyrimidinyl group, a furyl group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, and a carbolinyl group.

These groups represented by $Ar^{17}$ may be unsubstituted, but may have a substitution group. Examples of the substitution group include the substitution groups exemplified in the description of the aromatic hydrocarbon group, the aromatic heterocyclic group, or the fused polycyclic aromatic group represented by $Ar^1$ to $Ar^5$ in the general formula (1). Embodiments that can be adopted by the substitution group are also the same.

($R^{10}$ to $R^{13}$)

$R^{10}$ to $R^{13}$ may be the same or differ, and each represent a hydrogen atom, a deuterium atom, a fluorine atom, a chlorine atom, a cyano group, a trifluoromethyl group, an alkyl group having 1 to 6 carbon atoms, an aromatic hydrocarbon group, an aromatic heterocyclic group, or a fused polycyclic aromatic group. The alkyl group having 1 to 6 carbon atoms may be linear or branched.

Specific examples of the alkyl group having 1 to 6 carbon atoms represented by $R^{10}$ to $R^{13}$ include a methyl group, an ethyl group, an n-propyl group, an i-propyl group, an n-butyl group, a 2-methyl propyl group, a t-butyl group, an n-pentyl group, a 3-methylbutyl group, a tert-pentyl group, an n-hexyl group, an iso-hexyl group, and a tert-hexyl group.

Specific examples of the aromatic hydrocarbon group, the aromatic heterocyclic group, or the fused polycyclic aromatic group represented by $R^{10}$ to $R^{13}$ include a phenyl group, a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, an indenyl group, a pyrenyl group, a perylenyl group, a fluoranthenyl group, a triphenylenyl group, a triazinyl group, a pyridyl group, a pyrimidinyl group, a furyl group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, and a carbolinyl group.

These groups represented by $R^{10}$ to $R^{13}$ may be unsubstituted, but may have a substitution group. Examples of the substitution group include the substitution groups exemplified in the description of the aromatic hydrocarbon group, the aromatic heterocyclic group, or the fused polycyclic aromatic group represented by $Ar^1$ to $Ar^5$ in the general formula (1). Embodiments that can be adopted by the substitution group are also the same.

Favorable Embodiment

Hereinafter, a favorable embodiment of the pyrimidine derivative IV will be described. However, in the description, the groups to which substituted/unsubstituted are not designated may have a substitution group or may be unsubstituted.

The pyrimidine derivative IV favorably has a structure represented by the general formula (4a).

$Ar^{14}$ is favorably a phenyl group, a biphenylyl group, a naphthyl group, an anthracenyl group, an acenaphthenyl group, a phenanthrenyl group, a fluorenyl group, an indenyl group, a pyrenyl group, a perylenyl group, a fluoranthenyl group, or a triphenylenyl group, more favorably a phenyl group, a biphenylyl group, a naphthyl group, an anthracenyl group, a phenanthrenyl group, a pyrenyl group, a fluoranthenyl group, or a triphenylenyl group. Here, the phenyl group favorably has a fused polycyclic aromatic group as a substitution group. In this case, the fused polycyclic aromatic group is favorably a naphthyl group, an anthracenyl group, a phenanthrenyl group, a pyrenyl group, a fluoranthenyl group, or a triphenylenyl group.

$Ar^{15}$ is favorably a phenyl group having a substitution group. In this case, the substitution group is favorably an aromatic hydrocarbon group such as a phenyl group, a biphenylyl group, and a terphenylyl group; or a fused polycyclic aromatic group such as a naphthyl group, an anthracenyl group, an acenaphthenyl group, a phenanthrenyl group, a fluorenyl group, an indenyl group, a pyrenyl group, a perylenyl group, a fluoranthenyl group, and a triphenylenyl group, and more favorably a phenyl group, a naphthyl group, an anthracenyl group, a phenanthrenyl group, a pyrenyl group, a fluoranthenyl group, or a triphenylenyl group.

$Ar^{16}$ is favorably a phenyl group having a substitution group. In this case, the substitution group is favorably an aromatic hydrocarbon group such as a phenyl group, a biphenylyl group, and a terphenylyl group; or a fused polycyclic aromatic group such as a naphthyl group, an anthracenyl group, an acenaphthenyl group, a phenanthrenyl group, a fluorenyl group, an indenyl group, a pyrenyl group, a perylenyl group, a fluoranthenyl group, and a triphenylenyl group, and more favorably a phenyl group, a naphthyl group, an anthracenyl group, a phenanthrenyl group, a pyrenyl group, a fluoranthenyl group, or a triphenylenyl group.

It is favorable that $Ar^{14}$ and $Ar^{15}$ are not the same from the viewpoint of stability of the thin film. Here, "the same" represents that not only the skeleton but also the type, number, and position of substitution groups are the same. Therefore, the case where $Ar^{14}$ and $Ar^{15}$ are not the same represents not only a case where the skeleton differs but also a case where the skeleton is the same but the type, number, or position of substitution groups differs.

It is favorable that $Ar^{15}$ and $Ar^{16}$ are different groups from the viewpoint of the stability of the thin film. This is because in the case where $Ar^{15}$ and $Ar^{16}$ are the same, there is a possibility that crystallization tends to be facilitated by improvement of the symmetry of the entire molecules One of $Ar^{15}$ and $Ar^{16}$ is favorably a hydrogen atom.

$Ar^{17}$ is favorably a nitrogen-containing aromatic heterocyclic group. The nitrogen-containing aromatic heterocyclic group is favorably a triazinyl group, a pyridyl group, a pyrimidinyl group, a pyrrolyl group, a quinolyl group, an isoquinolyl group, an indolyl group, a carbazolyl group, a benzoxazolyl group, a benzothiazolyl group, a quinoxalinyl group, a benzimidazolyl group, a pyrazolyl group, a naphthyridinyl group, a phenanthrolinyl group, an cridinyl group, or a carbolinyl group, more favorably a triazinyl group, a pyridyl group, a pyrimidinyl group, a quinolyl group, an isoquinolyl group, an indolyl group, a quinoxalinyl group, a benzimidazolyl group, a naphthyridinyl group, a phenanthrolinyl group, or a acridinyl group, and particularly favorably a pyridyl group, a pyrimidinyl group, a quinolyl group, an isoquinolyl group, an indolyl group, a quinoxalinyl group, a benzimidazolyl group, a phenanthrolinyl group, or an acridinyl group.

The bonding position of $Ar^{17}$ in the benzene ring is favorably at the meta position with respect to the bonding position with the pyrimidine ring from the viewpoint of the stability of the thin film.

$R^{10}$ to $R^{13}$ are each favorably a hydrogen atom.

Although favorable specific examples of the pyrimidine derivative IV are shown in FIG. 11 to FIG. 28, the pyrimidine derivative IV is not limited to these specific examples. D represents a deuterium atom. In the specific examples, compounds 4-1 to 4-49 and 4-66 to 4-126 correspond to the general formula (4a). Compounds 4-50 to 4-65 correspond to the general formula (4b).

The pyrimidine derivative IV itself can be synthesized according to a well-known method (see, for example, Patent document 8).

In the electron transport layer 6, a well-known electron transport material may be mixed with or used simultaneously with the pyrimidine derivative IV as long as the effect of the present invention is not impaired. As the well-known electron transport material, metal complexes of quinolinol derivatives including $Alq_3$ and BAlq; various metal complexes; triazole derivatives; triazine derivatives, oxadiazole derivatives; pyridine derivatives, pyrimidine derivatives, benzimidazole derivatives; thiadiazole derivatives; anthracene derivatives; carbodiimide derivatives, quinoxaline derivatives; pyridoindole derivatives; phenanthroline derivative; silole derivatives; and the like can be used.

<Electron Injection Layer 7>

Although alkali metal salts such as a lithium fluoride and a cesium fluoride, alkaline earth metal salts such as magnesium fluoride; metal oxides such as an aluminum oxide; and the like can be used as the electron injection layer 7, this can be omitted in the favorable selection of the electron transport layer and the cathode.

<Cathode 8>

For the cathode 8, a metal having a low work function, such as aluminum, or an alloy having a lower work function, such as a magnesium silver alloy, a magnesium indium alloy, and an aluminum magnesium alloy, is used as the electrode material.

Hereinafter, embodiments of the present invention will be specifically described with reference to examples, but the present invention is not limited to the following examples.

Synthesis Example 1: Compound 1-1

Synthesis of 4-bis(biphenyl-4-yl) amino-4'-{(biphenyl-4-yl)-phenylamino}-2-phenyl-biphenyl

| | |
|---|---|
| bis(biphenyl-4-yl)-(6-bromobipbenyl-3-yl) amine | 10.0 g |
| 4-{(biphenyl-4-yl)-phenylamino} phenylboronic acid | 7.9 g |
| tetrakistriphenylphosphine palladium (0) | 0.60 g |
| potassium carbonate | 5.0 g |
| toluene | 80 ml |
| ethanol | 40 ml |
| water | 30 ml | were added to a reaction vessel that had been purged with nitrogen, heated, and stirred overnight at 100° C. to obtain a reaction solution. The reaction solution was cooled, and an organic layer was collected by a liquid separation operation. The collected organic layer was concentrated to obtain a crude product. The crude product was purified by column chromatography (carrier, silica gel, eluent: dichloromethane/heptane). As a result, 5.30 g (yield of 37%) of white powder of a compound 1-1 was obtained.

The structure of the obtained white powder was identified using NMR. The following 44 hydrogen signals were detected by $^1$H-NMR ($CDCl_3$).

δ(ppm)=7.65-7.60 (5H)
7.59-7.53 (5H)
7.52-7.40 (9H)
7.39-7.21 (15H)
7.20-7.10 (5H)
7.09-6.91 (5H)

[Chem. 14]

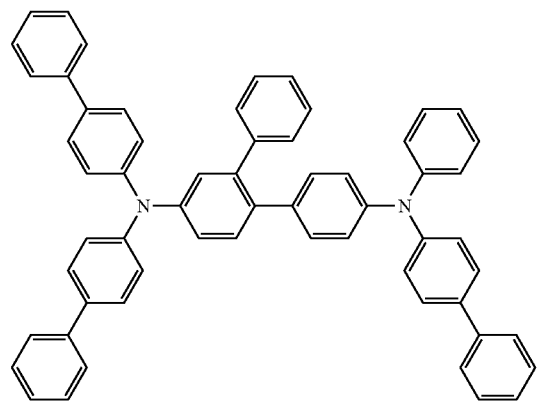

(1-1)

Synthesis Example 2: Compound 1-3

Synthesis of 4-{(biphenyl-4-yl)-(4-naphthalene-1-yl-phenyl) amino}-4'-{(biphenyl-4-yl)-phenylamino}-2-phenyl-biphenyl Instead of bis(biphenyl-4-yl)-(6-bromobiphenyl-3-yl) amine in Synthesis Example 1,
(biphenyl-4-yl)-(6-bromobiphenyl-3-yl)-(4-naphthalene-1-yl-phenyl) amine
was used and the reaction was carried out under the same conditions. As a result, 9.70 g (yield of 69%) of kind-of-white powder of a compound 1-3 was obtained.

The structure of the obtained kind-of-white powder was identified using NMR. The following 46 hydrogen signals were detected by ¹H-NMR (CDCl₃).

δ(ppm)=8.07 (1H)

7.93 (1H)

7.87 (1H)

7.67-7.54 (7H)

7.54-7.11 (31H)

7.69-6.92 (5H)

[Chem. 15]

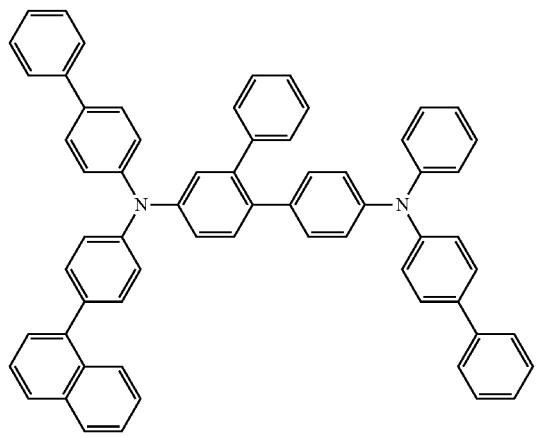

(1-3)

Synthesis Example 3: Compound 1-5>

Synthesis of 4-{(biphenyl-4-yl)-(p-terphenyl-4-yl) amino}-4'-{(biphenyl-4-yl)-phenylamino}-2-phenyl-biphenyl Instead of bis(biphenyl-4-yl)-(6-bromobiphenyl-3-yl) amine in Synthesis Example 1, (biphenyl-4-yl)-(6-bromophenyl-3-yl)-(p-terphenyl-4-yl) amine was used and the reaction was carried out under the same conditions. As a result, 6.76 g (yield of 57%) of white powder of a compound 1-5 was obtained.

The structure of the obtained white powder was identified using NMR. The following 48 hydrogen signals were detected by ¹H-NMR (CDCl₃).

δ(ppm)=7.71-7.10 (43H)

7.08-6.93 (5H)

[Chem. 16]

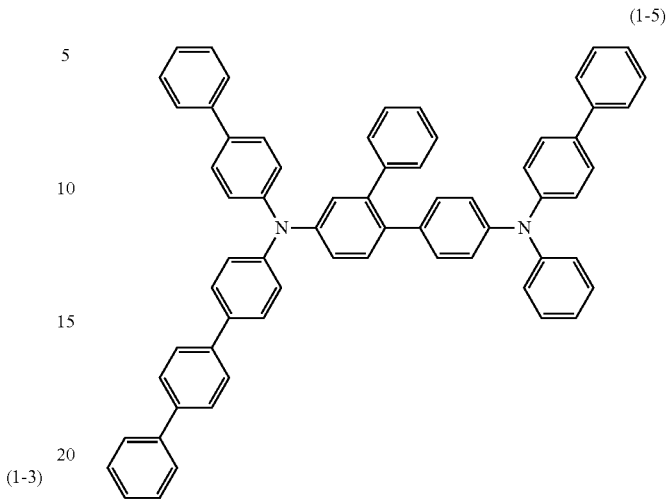

(1-5)

Synthesis Example 4: Compound 1-6>

Synthesis of 4-{(biphenyl-4-yl)-phenylamino}-4'-{bis(4-naphthalene-1-yl-phenyl) amino}-2'-phenyl-biphenyl Instead of bis(biphenyl-4-yl)-(6-bromobiphenyl-3-yl) amine in Synthesis Example 1, bis(4-naphthalene-1-yl-phenyl)-(6-bromo-biphenyl-3-yl) amine was used and the reaction was carried out under the same conditions. As a result, 10.0 g (yield of 73%) of yellow white powder of a compound 1-6 was obtained.

The structure of the obtained yellow white powder was identified using NMR. The following 48 hydrogen signals were detected by ¹H-NMR (CDCl₃).

δ(ppm)=8.08 (1H)
7.94 (1H)
7.88 (1H)
7.63-7.20 (40H)
7.19-6.92 (5H)

[Chem. 17]

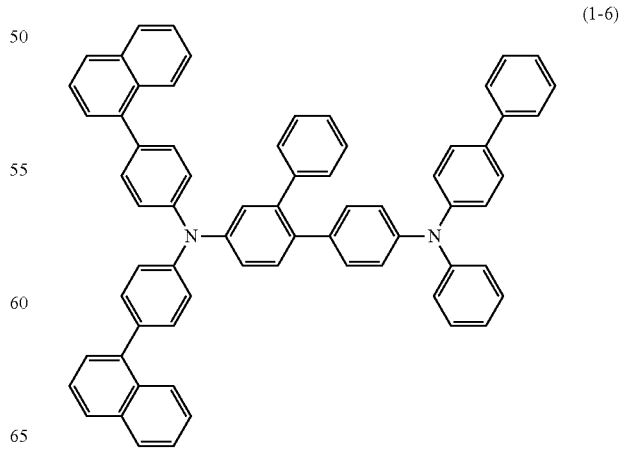

(1-6)

Synthesis Example 5: Compound 1-7

Synthesis of 4-{(9,9-dimethylfluorene-2-yl)-(biphenyl-4-yl) amino}-4'-(biphenyl-4-yl-phenylamino)-2-phenyl-biphenyl Instead of bis(biphenyl-4-yl)-(6-bromobiphenyl-3-yl) amine in Synthesis Example 1,
(9,9-dimethylfluorene-2-yl)-(biphenyl-4-yl)-(6-bromobiphenyl-3-yl) amine
was used and the reaction was carried out under the same conditions. As a result, 8.30 g (yield of 49%) of white powder of a compound 1-7 was obtained.

The structure of the obtained white powder was identified using NMR. The following 48 hydrogen signals were detected by $^1$H-NMR (CDCl$_3$).
δ(ppm)=7.72-7.60 (2H)
7.59-7.52 (2H)
7.51-7.10 (35H)
7.09-6.90 (3H)
1.56 (6H)

[Chem. 18]

(1-7)

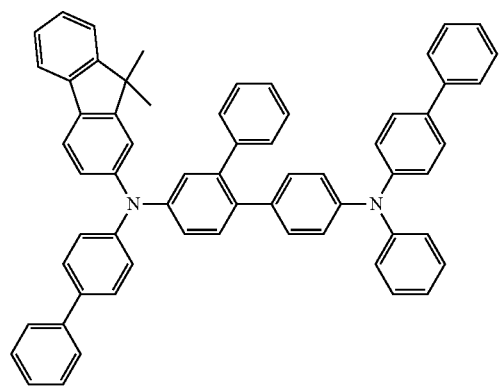

Synthesis Example 6: Compound 1-8

Synthesis of 4-{(9,9-dimethylfluorene-2-yl)-(biphenyl-4-yl)amino}-1-(9-phenyl carbazole-3-yl)-2-phenyl-benzene Instead of
bis(biphenyl-4-yl)-(6-bromobiphenyl-3-yl) amine, and
4-{(biphenyl-4-yl)-phenylamino}phenylboronic acid in Synthesis Example 1, (9,9-dimethylfluorene-2-yl)-(biphenyl-4-yl)-(6-bromobiphenyl-3-yl) amine, and
(9-phenyl carbazole-3-yl) boronic acid
were used respectively, and the reaction was carried out under the same conditions. As a result, 17.4 g (yield of 85%) of white powder of a compound 1-8 was obtained.

The structure of the obtained white powder was identified using NMR. The following 42 hydrogen signals were detected by $^1$H-NMR (CDCl$_3$).
δ(ppm)=8.05 (2H)
7.72-7.10 (34H)
1.52 (6H)

[Chem. 19]

(1-8)

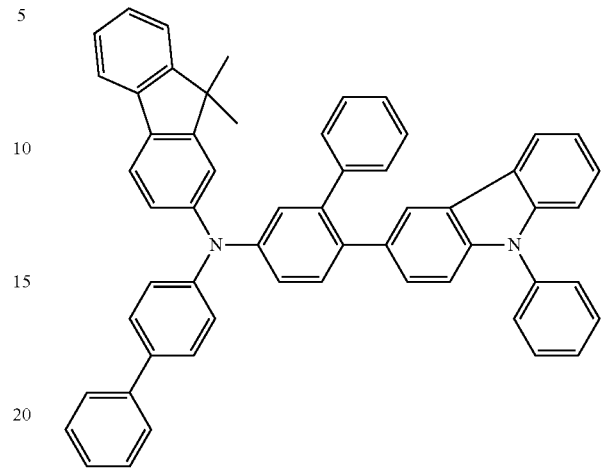

Synthesis Example 7: Compound 1-4

Synthesis of 4-{4-(naphthalene-2-yl)phenyl}(biphenyl-4-yl) amino4'-{(biphenyl-4-yl)-Phenylamino)}-2-phenyl-1,1'-biphenyl Instead of bis(biphenyl-4-yl)-(6-bromobiphenyl-3-yl) amine in Synthesis Example 1,
(6-bromo-1,1'-biphenyl-3-yl)-{4-(naphthalene-2-yl)phenyl}(biphenyl-4-yl) amine
was used, and the reaction was carried out under the same conditions. As a result, 6.1 g (yield of 58%) of white powder of a compound 1-4 was obtained.

The structure of the obtained white powder was identified using NMR. The following 46 hydrogen signals were detected by $^1$H-NMR (CDCl$_3$).
δ(ppm)=8.07 (1H)
7.95-7.76 (4H)
7.68-6.98 (41H)

[Chem. 20]

(1-4)

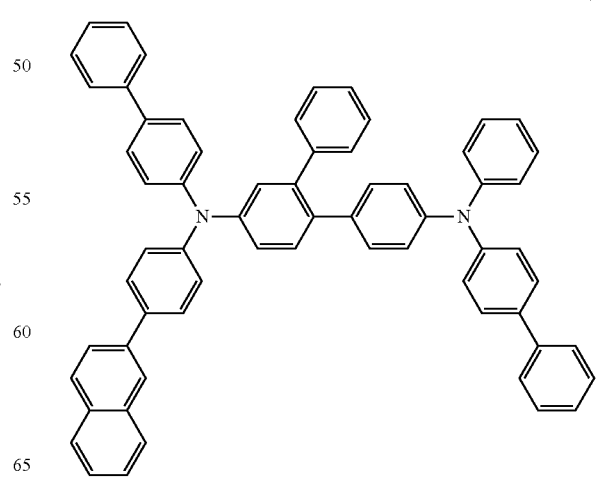

Synthesis Example 8: Compound 1-19

Synthesis of 4,4''-bis{(biphenyl-4-yl)-phenylamino}-2-phenyl-1,1':4',1''-terphenyl Instead of bis(biphenyl-4-yl)-(6-bromobiphenyl-3-yl) amine in Synthesis Example 1, (6-bromo-1,1'-biphenyl-3-yl)-(1,1'-biphenyl-4-yl) phenylamine was used, and the reaction was carried out under the same conditions. As a result, 12.9 g (yield of 43%) of white powder of a compound 1-19 was obtained.

The structure of the obtained white powder was identified using NMR. The following 44 hydrogen signals were detected by ¹H-NMR (CDCl₃).

δ(ppm)=7.65-7.61 (4H)

7.57-7.07 (40H)

[Chem. 21]

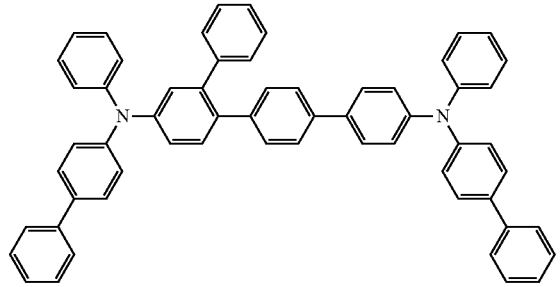

(1-19)

Synthesis Example 9: Compound 1-27

Synthesis of 4,4''-bis{(biphenyl-4-yl)-phenylamino}-2,2''-diphenyl-1,1':4',1''-terphenyl

| | |
|---|---|
| 4,4''-bis{(biphenyl-4-yl)-amino}-2,2''-diphenyl-1,1': 4',1''-terphenyl | 16.3 g, |
| iodobenzene | 18.6 g, |
| copper powder | 0.29 g, |
| potassium carbonate | 9.61 g, |
| 3,5-di-tert-butylsalicylic acid | 1.85 g, |
| sodium bisulfite | 0.47 g, and |
| dodecylbenzene | 20 ml | were added to a reaction vessel that had been purged with nitrogen, heated, and stirred for 17 hours at 200° C. The reaction solution after stirring was cooled, and stirred after adding 1500 ml of toluene, 40 g of silica gel, and 20 g of activated clay thereto. The mixed solution after stirring was concentrated after removing insoluble matters therefrom by filtration. Recrystallization with chlorobenzene was repeated. As a result, 9.65 g (yield of 49%) of white powder of a compound 1-27 was obtained.

The structure of the obtained white powder was identified using NMR. The following 48 hydrogen signals were detected by ¹H-NMR (CDCl₃).

δ(ppm)=7.62 (4H)

7.52 (4H)

7.45 (4H)

7.36-7.04 (32H)

6.99 (4H)

[Chem. 22]

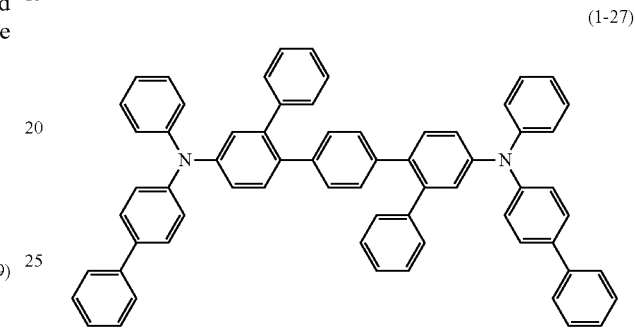

(1-27)

Synthesis Example 10: Compound 1-30

Synthesis of 4,4''-bis{(biphenyl-4-yl)-phenylamino}-2-phenyl-1,1':3',1''-terphenyl 4-{(biphenyl-4-yl)-phenylamino}-4''-{(biphenyl-4-yl)-amino}-2-phenyl-1,1':3',1''-terphenyl 17.0 g,

| | |
|---|---|
| bromobenzene | 4.12 g, |
| palladium acetate | 0.13 g, |
| 50% (w/v) toluene solution of tri-tert-butylphosphine | 0.33 ml, |
| tert-butoxy sodium | 2.73 g, and |
| toluene | 190 ml | were added to a reaction vessel that had been purged with nitrogen, heated, and stirred for 3 hours at 80° C. The reaction solution after stirring was cooled, concentrated after removing insoluble matters by filtration, and purified by column chromatography (carrier: silica gel, eluent: toluene/n-hexane). The precipitated solid was collected by adding acetone. As a result, 13.29 g (yield of 71%) of white powder of a compound 1-30 was obtained.

The structure of the obtained white powder was identified using NMR. The following 44 hydrogen signals were detected by ¹H-NMR (CDCl₃).

δ(ppm)=7.62-7.58 (4H)

7.55-7.49 (4H)

7.48-7.38 (6H)

7.37-7.05 (30H)

(1-30)

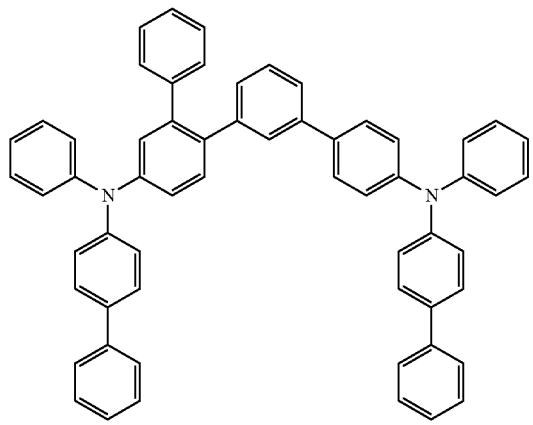

Synthesis Example 11: Compound 1-41

Synthesis of 4-bis-4-yl) amino 4'-{(biphenyl-4-yl)-phenylamino)}-2,6-diphenyl-biphenyl Instead of bis(biphenyl-4-yl)-(6-bromobiphenyl-3-yl) amine in Synthesis Example 1, 4-bis(biphenyl-4-yl) amino-2,6-diphenyl-bromobenzene was used, and the reaction was carried out under the same conditions. As a result, 12.7 g (yield of 57%) of white powder of a compound 1-41 was obtained. The structure of the obtained white powder was identified using NMR. The following 48 hydrogen signals were detected by $^1$H-NMR (CDCl$_3$).

δ(ppm)=7.65-7.53 (8H)

7.48-6.97 (36H)

6.79-6.73 (4H)

[Chem. 24]

(1-41)

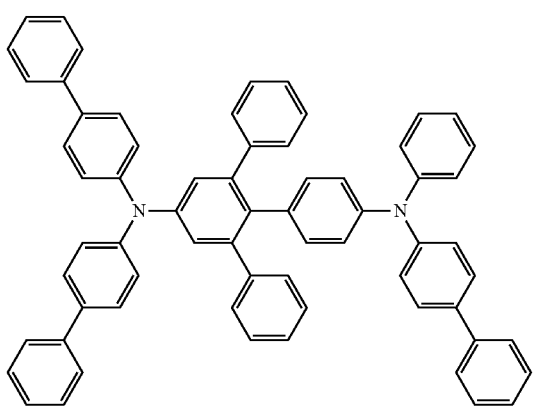

Synthesis Example 12: Compound 1-14

Synthesis of 4-{(9,9-dimethylfluorene-2-yl)-phenylamino}-4'-(biphenyl-4-yl-phenylamino)-2-phenyl-biphenyl Instead of bis(biphenyl-4-yl)-(6-bromobiphenyl-3-yl) amine in Synthesis Example 1, (9,9-dimethylfluorene-2-yl)-phenyl-(6-bromobiphenyl-3-yl) amine was used, and the reaction was carried out under the same conditions. As a result, 10.2 g (yield of 69%) of white powder of a compound 1-14 was obtained.

The structure of the obtained white powder was identified using NMR. The following 44 hydrogen signals were detected by $^1$H-NMR (CDCl$_3$).

δ(ppm)=7.69-7.59 (4H)

7.48-7.42 (4H)

7.37-6.98 (30H)

1.49 (6H)

[Chem. 25]

(1-14)

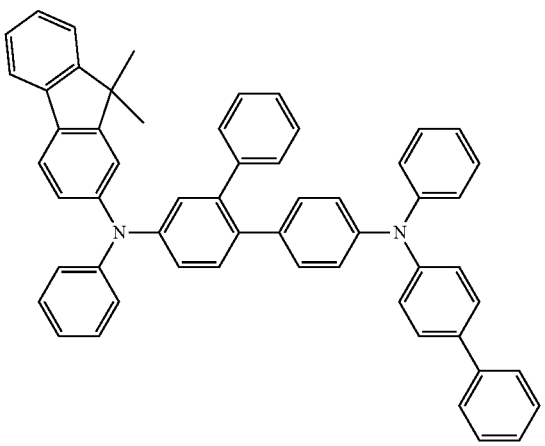

Synthesis Example 13: Compound 1-11>

Synthesis of 4-{(9,9-dimethylfluorene-2-yl)-(biphenyl-4-yl) amino}-4'-(diphenylamino)-2-phenyl-biphenyl Instead of bis(biphenyl-4-yl)-(6-bromobiphenyl-3-yl) amine, and 4-{(biphenyl-4-yl)-phenylamino}phenylboronic acid in Synthesis Example 1, (9,9-dimethylfluorene-2-yl)-(biphenyl-4-yl)-(6-bromobiphenyl-3-yl) amine, and 4-(diphenylamino) phenylboronic acid were used respectively, and the reaction was carried out under the same conditions. As a result, 11.5 g (yield of 75%) of white powder of a compound 1-11 was obtained.

The structure of the obtained white powder was identified using NMR. The following 44 hydrogen signals were detected by $^1$H-NMR (CDCl$_3$).

δ(ppm)=7.71-7.64 (4H)

7.58-7.56 (2H)

7.49-6.94 (32H)

1.51 (6H)

[Chem. 26]

(1-11)

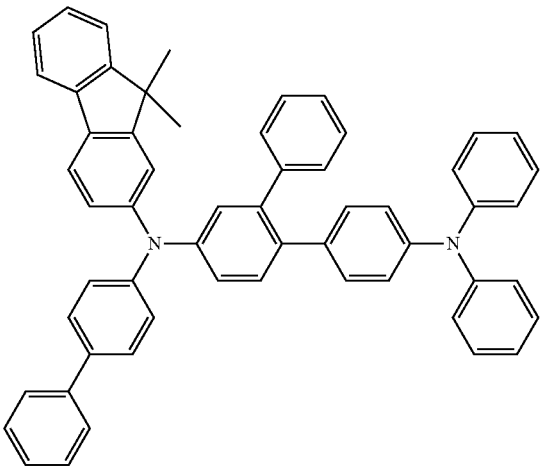

The melting point and glass transition point of each compound obtained in the Synthesis Examples were measured using a high sensitivity scanning calorimeter (DSC3100SA manufactured by Bruker AXS K.K.).

| Compound | Melting point(° C.) | Glass transition point(° C.) |
| --- | --- | --- |
| 1-1 (Synthesis Example 1) | Not observed | 118 |
| 1-3 (Synthesis Example 2) | Not observed | 121 |
| 1-5 (Synthesis Example 3) | Not observed | 125 |
| 1-6 (Synthesis Example 4) | Not observed | 125 |
| 1-7 (Synthesis Example 5) | Not observed | 125 |
| 1-8 (Synthesis Example 6) | Not observed | 139 |
| 1-4 (Synthesis Example 7) | Not observed | 121 |
| 1-19 (Synthesis Example 8) | Not observed | 120 |
| 1-27 (Synthesis Example 9) | 263 | 124 |
| 1-30 (Synthesis Example 10) | Not observed | 117 |
| 1-41 (Synthesis Example 11) | 238 | 126 |
| 1-14 (Synthesis Example 12) | Not observed | 114 |
| 1-11 (Synthesis Example 13) | Not observed | 117 |

The arylamine compound I had a glass transition point of not less than 100° C., and the thin film state was stabilized.

A deposition film having a film thickness of 100 nm was prepared on an ITO substrate by using the compound obtained in each Synthesis Example, and the work function thereof was measured by using an ionization potential measuring apparatus (PYS-202 manufactured by Sumitomo Heavy Industries, Ltd.)

| Compound | Work function (eV) |
| --- | --- |
| 1-1 (Synthesis Example 1) | 5.63 |
| 1-3 (Synthesis Example 2) | 5.62 |
| 1-5 (Synthesis Example 3) | 5.62 |
| 1-6 (Synthesis Example 4) | 5.65 |
| 1-7 (Synthesis Example 5) | 5.57 |
| 1-8 (Synthesis Example 6) | 5.56 |
| 1-4 (Synthesis Example 7) | 5.60 |
| 1-19 (Synthesis Example 8) | 5.70 |
| 1-27 (Synthesis Example 9) | 5.74 |
| 1-30 (Synthesis Example 10) | 5.79 |
| 1-41 (Synthesis Example 11) | 5.67 |
| 1-14 (Synthesis Example 12) | 5.59 |
| 1-11 (Synthesis Example 13) | 5.62 |

The arylamine compound I exhibited a suitable energy level as compared with a work function of a general hole transport material such as NPD and TPD, i.e., 5.4 eV, and had a good hole transport ability.

Element Example 1

An ITO electrode was formed as the transparent anode 2 on the glass substrate 1 in advance. As shown in FIG. 1, the hole injection layer 3, the hole transport layer 4, the light-emitting layer 5, the electron transport layer 6, the electron injection layer 7, and the cathode (aluminum electrode) 8 were formed by vapor deposition in the stated order on the transparent anode 2 to create an organic EL element.

Specifically, the glass substrate 1 on which ITO having a film thickness of 150 nm was formed was ultrasonic-cleaned in isopropyl alcohol for 20 minutes, and then dried for 10 minutes on a hot plate heated to 200° C. After that, UV ozone treatment was performed for 15 minutes. The glass substrate with ITO was mounted in a vacuum vapor deposition machine, and the pressure was reduced to no more than 0.001 Pa.

Subsequently, an electron acceptor (Acceptor-1) having the following structural formula and the compound 1-7 in Synthesis Example 5 were binary vapor-deposited, at a deposition rate at which the deposition rate ratio of Acceptor-1 compound 1-7=3:97 was obtained, so as to cover the transparent anode 2 to form the hole injection layer 3 having a film thickness of 30 nm.

[Chem. 27]

(Acceptor-1)

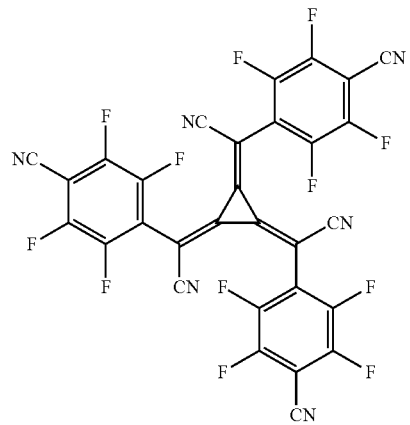

(1-7)

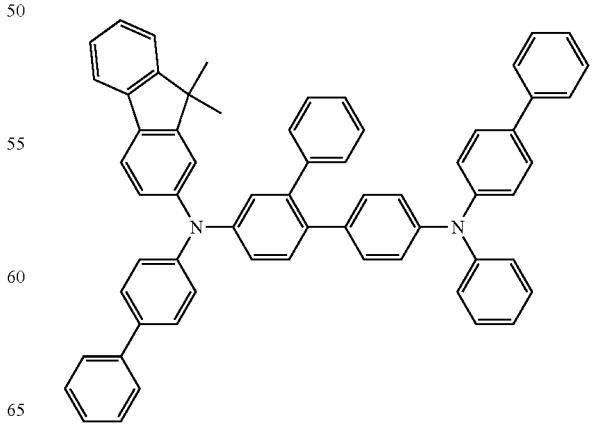

The compound 1-7 of Synthesis Example 5 was vapor-deposited on the hole injection layer 3 to form the hole transport layer 4 having a film thickness of 40 nm.

A compound EMD-1 having the following structural formula and a compound EMH-1 having the following structural formula were binary vapor-deposited on the hole transport layer 4, at a deposition rate at which the deposition rate ratio of EMD-1:EMH-1=5:95 was obtained, to form the light-emitting layer 5 having a film thickness of 20 nm.

[Chem. 28]

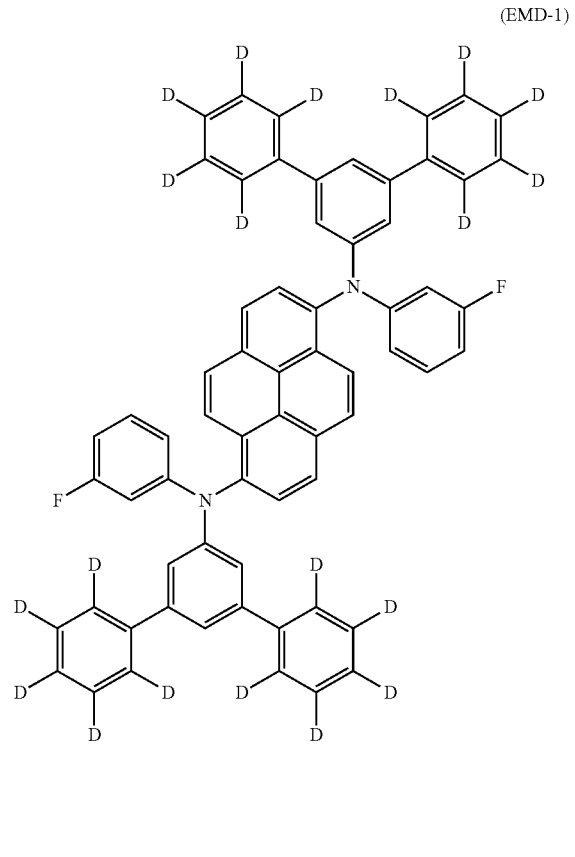

(EMD-1)

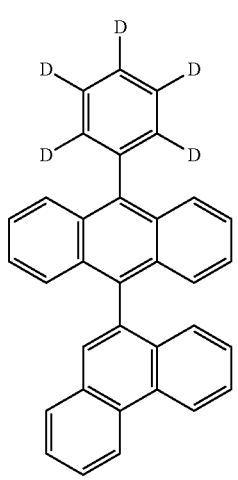

(EMH-1)

A compound 4-125 having the following structural formula and a compound ETM-1 having the following structural formula are binary vapor-deposited on the light-emitting layer 5, at a deposition rate at which the deposition rate ratio of 4-125:ETM-1=50:50 was obtained, to form the electron transport layer 6 having a film thickness of 30 nm

[Chem. 29]

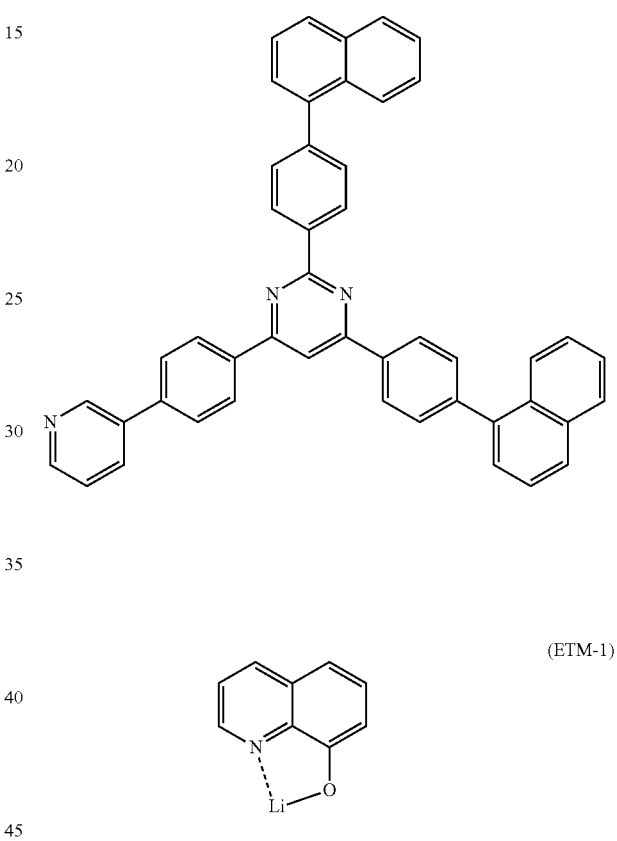

(4-125)

(ETM-1)

Lithium fluoride was vapor-deposited on the electron transport layer 6 to form the electron injection layer 7 having a film thickness of 1 nm.

Finally, aluminum was vapor-deposited to have a thickness of 100 nm to form the cathode 8.

Element Example 2

An organic EL element was prepared under the same conditions except that an amine derivative 3-1 was used instead of the compound EMD-1 as the material of the light-emitting layer 5 in Element Example 1, and the amine derivative 3-1 and the compound EMH-1 were binary vapor-deposited at a deposition rate at which the deposition rate ratio of the amine derivative 3-1:EMH-1=5:95 was obtained.

[Chem. 30]

(3-1)

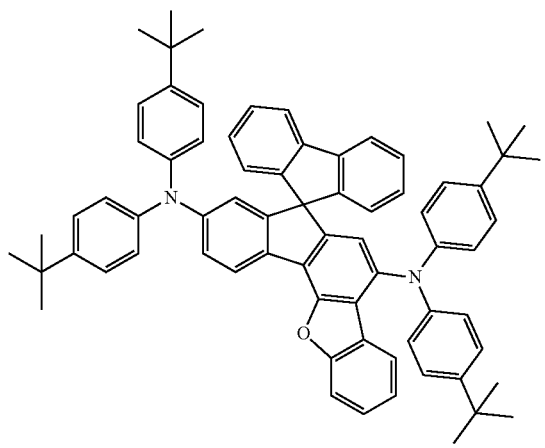

Element Example 3

An organic EL element was prepared under the same conditions except that the compound 1-14 of Synthesis Example 12 was used instead of the compound 1-7 of Synthesis Example 5 as the materials of the hole injection layer 3 and the hole transport layer 4 in Element Example 1.

[Chem. 31]

(1-14)

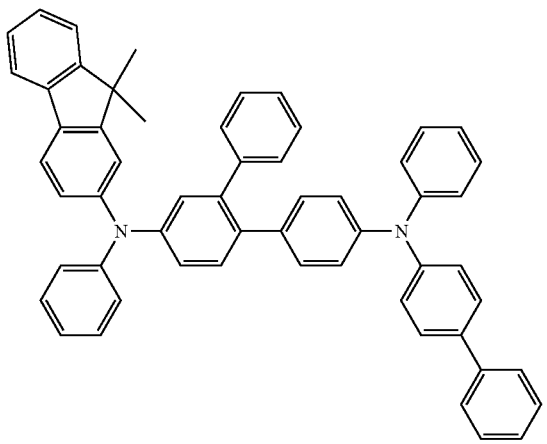

Element Example 4

An organic EL element was prepared under the same conditions except that the compound 1-14 of Synthesis Example 12 was used instead of the compound 1-7 of Synthesis Example 5 as the materials of the hole injection layer 3 and the hole transport layer 4 in Element Example 2.

Element Example 5

An organic EL element was prepared under the same conditions except that the compound 1-11 of Synthesis Example 13 was used instead of the compound 1-7 of Synthesis Example 5 as the materials of the hole injection layer 3 and the hole transport layer 4 in Element Example 1.

[Chem. 32]

(1-11)

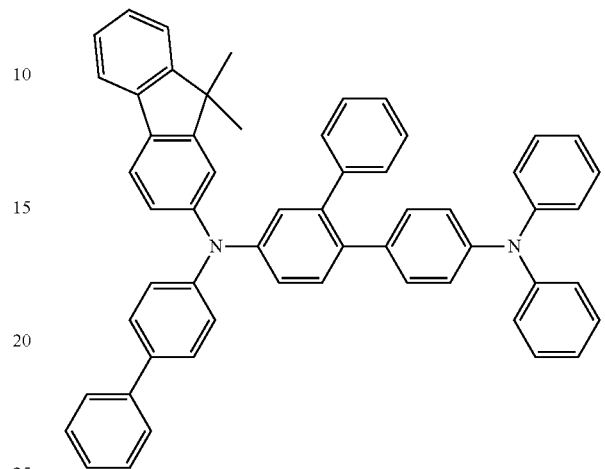

Element Example 5

An organic EL element was prepared under the same conditions except that the compound 1-11 of Synthesis Example 13 was used instead of the compound 1-7 of Synthesis Example 5 as the materials of the hole injection layer 3 and the hole transport layer 4 in Element Example 2.

Element Comparative Example 1

An organic EL element was prepared under the same conditions except that HTM-1 having the following structural formula was used instead of the compound 1-7 of Synthesis Example 5 as the materials of the hole injection layer 3 and the hole transport layer 4 in Element Example 1.

[Chem. 33]

(HTM-1)

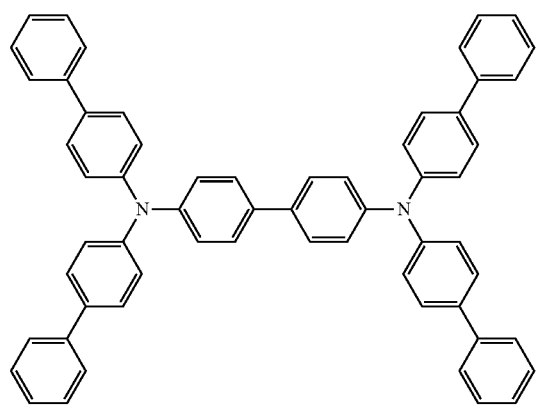

Element Comparative Example 2

An organic EL element was prepared under the same conditions except that HTM-1 having the above-mentioned structural formula was used instead of the compound 1-7 of Synthesis Example 5 as the materials of the hole injection layer 3 and the hole transport layer 4 in Element Example 1.

Properties of the organic EL elements prepared in Element Examples 1 to 6 and Element Comparative Example 1 and 2 were measured at room temperature in the atmosphere. The light-emitting properties of the prepared organic EL element to which DC voltage was applied were measured. The results were shown in Table 1.

The element lifetime were measured using the organic EL elements prepared in Element Examples 1 to 6 and Element Comparative Example 1 and 2. Specifically, the time until the light emission luminance was attenuated to 1900 cd/m (corresponding to 95% when the light emission luminance at the start of light emission (initial luminance) is 100%: 95% attenuated) when constant current driving was performed with initial luminance of 2000 cd/m was measured. The results were shown in Table 1.

electron acceptor as the material of the hole injection layer, holes can be efficiently injected/transported from the electrode to the hole transport layer. By selecting the arylamine compound I without P-doping as the material of the hole transport layer, carrier balance in the element was improved. Therefore, the organic EL element of the present invention can achieve a high light emission efficiency and a long lifetime as compared with the existing organic EL element.

INDUSTRIAL APPLICABILITY

As described above, the organic EL element of the present invention exhibits a high light emission efficiency and a high power efficiency, has a low practical drive voltage, and is excellent in durability. Therefore, for example, it is possible to develop it to applications of domestic appliances and lighting.

TABLE 1

| | Hole injection layer | Hole transport layer | Light-emitting layer | Voltage [V] (@10 mA/cm$^2$) | Luminance [cd/m$^2$] (@10 mA/cm$^2$) | Light emission efficiency [cd/A] (@10 mA/cm$^2$) | Power efficiency [lm/W] (@10 mA/cm$^2$) | Element lifetime [h] 95% attenuated |
|---|---|---|---|---|---|---|---|---|
| Element example 1 | 1-7/ Acceptor-1 | 1-7 | EMD-1/ EMH-1 | 3.84 | 836 | 8.36 | 6.84 | 119 |
| Element example 2 | | | 3-1/ EMH-1 | 3.87 | 900 | 9.00 | 7.31 | 140 |
| Element example 3 | 1-14/ Acceptor-1 | 1-14 | EMD-1/ EMH-1 | 3.80 | 858 | 8.58 | 7.09 | 131 |
| Element example 4 | | | 3-1/ EMH-1 | 3.82 | 924 | 9.24 | 7.60 | 155 |
| Element example 5 | 1-11/ Acceptor-1 | 1-11 | EMD-1/ EMH-1 | 3.75 | 886 | 8.86 | 7.44 | 108 |
| Eloment example 6 | | | 3-1/ EMH-1 | 3.78 | 943 | 9.43 | 7.84 | 128 |
| Element comparative example 1 | HTM-1/ Acceptor-1 | HTM-1 | EMD-1/ EMH-1 | 3.82 | 774 | 7.74 | 6.37 | 54 |
| Element comparative example 2 | | | 3-1/ EMH-1 | 3.87 | 827 | 8.27 | 6.71 | 78 |

Comparing Element Examples 1, 3, and 5 and Element Comparative Example 1 in which the combination of materials of the light-emitting layer is the same, the light emission efficiency when current having a current density of 10 mA/cm was applied was 7.74 cd/A in Element Comparative Example 1 while the light emission efficiency in Element Examples 1, 3, and 5 was high, i.e., 8.36 to 8.86 cd/A.

The power efficiency in Element Comparative Example 1 was 6.37 lm/W while the power efficiency in Element Examples 1, 3, and 5 was high, i.e., 6.84 to 7.441 m/W The element lifetime in Element Comparative Example 1 was 54 hours while the element lifetime in Element Examples 1, 3, and 5 was long, i.e., 108 to 131 hours.

Similarly, comparing Element Examples 2, 4, and 6 and Element Comparative Example 2 in which the combination of materials of the light-emitting layer is the same, the light emission efficiency in Element Comparative Example 2 was 8.27 cd/A while the light emission efficiency in Element Examples 2, 4, and 6 was high, i.e., 9.00 to 9.43 cd/A.

The power efficiency in Element Comparative Example 2 was 6.71 lm/W while the power efficiency in Element Examples 2, 4, and 6 was high, i.e., 7.31 to 7.84 lm/W.

The element lifetime in Element Comparative Example 2 was 78 hours while the element lifetime in Element Examples 2, 4, and 6 was long, i.e., 128 to 155 hours.

As is apparent from the above results, in the organic EL element using the arylamine compound I P-doped with an 1 glass substrate
2 transparent anode
3 hole injection layer
4 hole transport layer
5 light-emitting layer
6 electron transport layer
7 electron injection layer
8 cathode

The invention claimed is:
1. An organic electroluminescence element including at least an anode, a hole injection layer, a hole transport layer, a light-emitting layer, an electron transport layer, and a cathode in the stated order,
   wherein the hole injection layer contains an electron acceptor and an arylamine compound represented by the following general formula (1),

(1)

$$Ar^1\underset{Ar^2}{\overset{Ar^5}{N}}\!\!-\!\!\!\left(\!\!\underset{Ar^6}{\overset{}{\bigcirc}}\!\!-\!\!\left(\!\!\bigcirc\!\!\right)_{\!\!n1}\!\!-\!\!\underset{Ar^8}{\overset{Ar^7}{\bigcirc}}\!\!\right)\!\!-\!\!\underset{Ar^3}{\overset{}{N}}\!\!-\!\!Ar^4$$

where, in general formula (1),

Ar$^1$ to Ar$^5$ may be the same or differ, and each represents an aromatic hydrocarbon group, an aromatic heterocyclic group, or a fused polycyclic aromatic group, and each of Ar$^1$ to Ar$^5$ excludes a carbazolyl group having a naphthyl group, Ar$^6$ represents a hydrogen atom, an aromatic hydrocarbon group, an aromatic heterocyclic group, or a fused polycyclic aromatic group, Ar$^7$ and Ar$^8$ each represents a hydrogen atom, Ar$^3$ and Ar$^4$ may be bonded to each other via a single bond, a substituted or unsubstituted methylene group, an oxygen atom, or a sulfur atom to form a ring, and Ar$^3$ or Ar$^4$ may be bonded, via a single bond, a substituted or unsubstituted methylene group, an oxygen atom, or a sulfur atom, to a benzene ring to which a —NAr$^3$Ar$^4$ group is bonded, thereby forming a ring, wherein the electron acceptor of the hole injection layer comprises at least one selected from the group consisting of tris(bromophenylamine) hexachloroantimony, tetracyanoquinone dimethane, 2,3,5,6-tetrafluoro-tetracyano-1,4-benzoquinone dimethane, and radialene derivatives, wherein n1 represents 1 or 2, and wherein each of Ar$^1$ to Ar$^4$ is other than a phenyl group substituted with a methyl.

\* \* \* \* \*